United States Patent [19]
Watanabe et al.

[11] Patent Number: 6,005,390
[45] Date of Patent: Dec. 21, 1999

[54] MAGNETIC RESONANCE DIAGNOSTIC APPARATUS

[75] Inventors: Hidehiro Watanabe, Kawasaki; Kazuya Okamoto, Yono; Koichi Oshio, Tokyo, all of Japan

[73] Assignee: Kabushiki Kaisha Toshiba, Kawasaki, Japan

[21] Appl. No.: 09/289,633

[22] Filed: Apr. 12, 1999

Related U.S. Application Data

[62] Division of application No. 08/909,948, Aug. 12, 1997, Pat. No. 5,894,221, which is a division of application No. 08/617,654, Mar. 15, 1996, Pat. No. 5,677,628.

[30] Foreign Application Priority Data

Mar. 15, 1995 [JP] Japan ................................ 7-055641
Mar. 15, 1995 [JP] Japan ................................ 7-082099

[51] Int. Cl.$^6$ ......................................................... G01V 3/00
[52] U.S. Cl. ............................................. 324/307; 324/309
[58] Field of Search .................................... 324/307, 309, 324/311, 312, 314, 300

[56] References Cited

U.S. PATENT DOCUMENTS

| | | | |
|---|---|---|---|
| 4,987,369 | 1/1991 | Van Stapele et al. | 324/307 |
| 5,166,616 | 11/1992 | Doddrell et al. | 324/307 |
| 5,345,174 | 9/1994 | Kimmich et al. | 324/309 |
| 5,475,308 | 12/1995 | Piotto et al. | 324/307 |
| 5,677,628 | 10/1997 | Watanabe et al. | 324/309 |
| 5,894,221 | 4/1999 | Watanabe et al. | 324/307 |

FOREIGN PATENT DOCUMENTS

3914301 C2    5/1993    Germany .

OTHER PUBLICATIONS

Won Reinhard Benn et al, "Moderne Pulsfolgen . . . NMR–Spektroskopie" Angew. Chemie, 95, pp. 381–411 (1983).

K. E. Kover et al, "Easy Implementation . . . Filters", Journal of Magnetic Resonance, Series B 101, 1–7 (1993).

Luciano Müller, "Sensitivity Enhanced Detection of Weak Nuclei Using Heteronuclear Multiple Quantum Coherence", Journal of American Chemical Society, vol. 101, (pp. 4481–4484), 1979.

Ad Bax, et al., Journal of American Chemical Society, vol. 105, (pp. 7188–7190), 1983.

Ralph E. Hurd, et al., "Gradient–Enhanced Proton–Detected Heteronuclear Multiple–Quantum Coherence Spectroscopy", Journal of Magnetic Resonance, vol. 91, (pp. 648–653), 1991.

Peter C.M. van Zijl, et al., "In Vivo Proton Spectroscopy and Spectroscopic Imaging of (1–$^{13}$C)–Glucose and Its Metabolic Products", Magnetic Resonance in Medicine, vol. 30, (pp. 544–551), 1993.

Gareth A. Morris, et al., "Enhancement of Nuclear Magnetic Resonance Signals by Polarization Transfer", Journal of the American Chemical Society, vol. 101, (pp. 760–762), 1979.

D.M. Doddrell, et al., "Distortionless Enhancement of NMR Signals by Polarization Transfer", Journal of Magnetic Resonance, vol. 48, (pp. 323–327), 1982.

(List continued on next page.)

*Primary Examiner*—Louis Arana
*Attorney, Agent, or Firm*—Oblon, Spivak, McClelland, Maier & Neustadt, P.C.

[57] ABSTRACT

In an improved INEPT pulse sequence, an excitation pulse, a refocus pulse and an excitation pulse are sequentially applied for $^1$H spins. A refocus pulse and an excitation pulse are sequentially applied for $^{13}$C spins that are spin-spin coupled with the $^1$H spins. A magnetic resonance signal is acquired from $^1$H spins or $^{13}$C spins. The second refocus pulse for $^1$H is applied as a slice selective pulse at a time different from the time the first refocus pulse for $^{13}$C is applied. This allows localization to be achieved without adversely affecting the flip angle of the first refocus pulse for $^{13}$C.

10 Claims, 67 Drawing Sheets

OTHER PUBLICATIONS

W.P. Aue, et al., "Localized $^{13}$C NMR Spectra with Enhanced Sensitivity Obtained by Volume–Selective Excitation", Journal of Magnetic Resonance, vol. 61, (pp. 392–395), 1985.

D.G. Morris, et al., "Inept–Enhanced $^{13}$C Spectroscopy Using Double–Tuned Surface Coils", Journal of Magnetic Resonance, vol. 78, (pp. 362–366), 1988.

M. Saner, et al., "Volume–Selective Carbon–13 Spectroscopy by Localized Polarization Transfer", Book of Abstracts of the Society for Magnetic Resonance in Medicine, (p. 1068), 1990.

Hong N. Yeung, et al., "Imaging and Localized Spectroscopy of $^{13}$C by Polarization Transfer", Journal of Magnetic Resonance, vol. 83, (pp. 183–189), 1989.

R.J. Ordidge, et al., "Image–Selected in Vivo Spectroscopy (ISIS). A New Technique for Spatially Selective NMR Spectroscopy", Journal of Magnetic Resonance, vol. 66, (pp. 283–294), 1986.

Geoffrey Bodenhausen, et al., "Natural Abundance Nitrogen–15 NMR by Enhanced Heteronuclear Spectroscopy", Chemical Physics Letters, vol. 69, (pp. 185–189), 1980.

Jesús Ruiz–Cabello, et al., "Gradient–Enhanced Heteronuclear Correlation Spectroscopy. Theory and Experimental Aspects", Journal of Magnetic Resonance, vol. 100, (pp. 282–302), 1992.

Daniel Brühwiler, et al., "Selective Excitation of $^1$H Resonances Coupled to $^{13}$C. Hetero COSY and RELAY Experiments with $^1$H Detection for a Protein", Jouranal of Magnetic Resonance, vol. 69, (pp. 546–551), 1986.

Arthur G. Palmer III, et al., "Sensitivity Improvement in Proton–Detected Two–Dimensional Heteronuclear Correlation NMR Spectroscopy", Journal of Magnetic Resonance, vol. 93, (pp. 151–170), 1991.

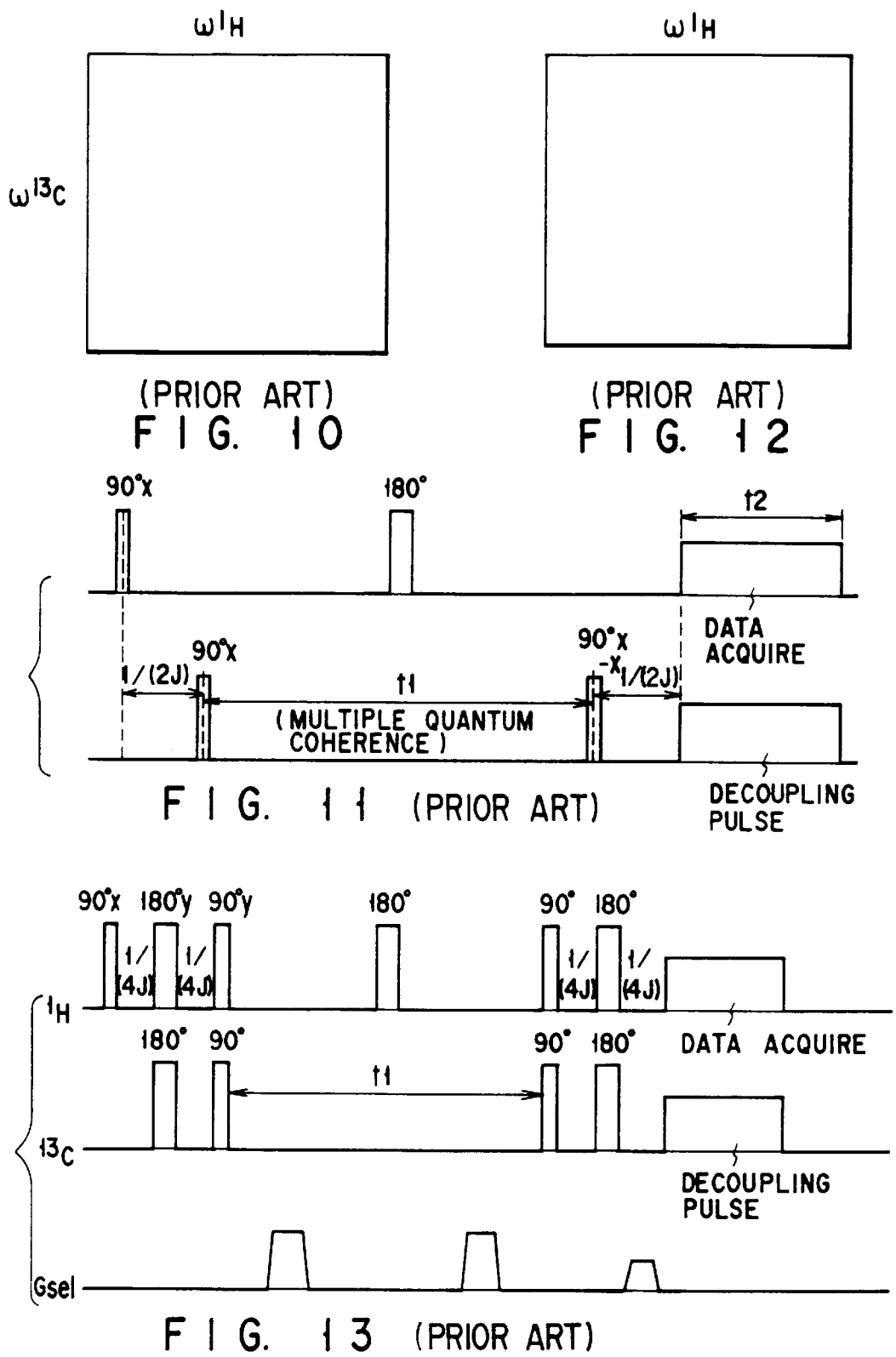

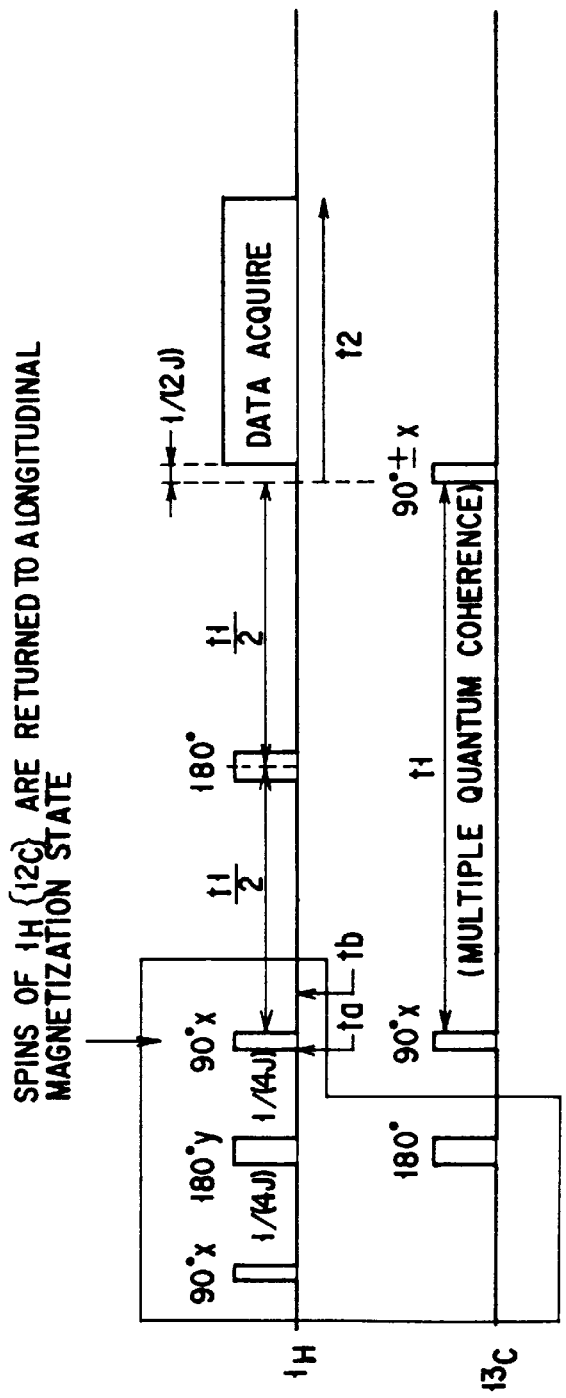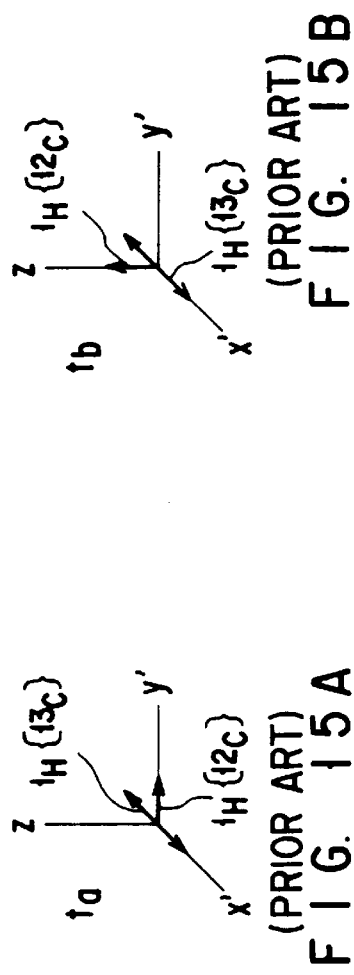
FIG. 14 (PRIOR ART)
FIG. 15A (PRIOR ART)
FIG. 15B (PRIOR ART)

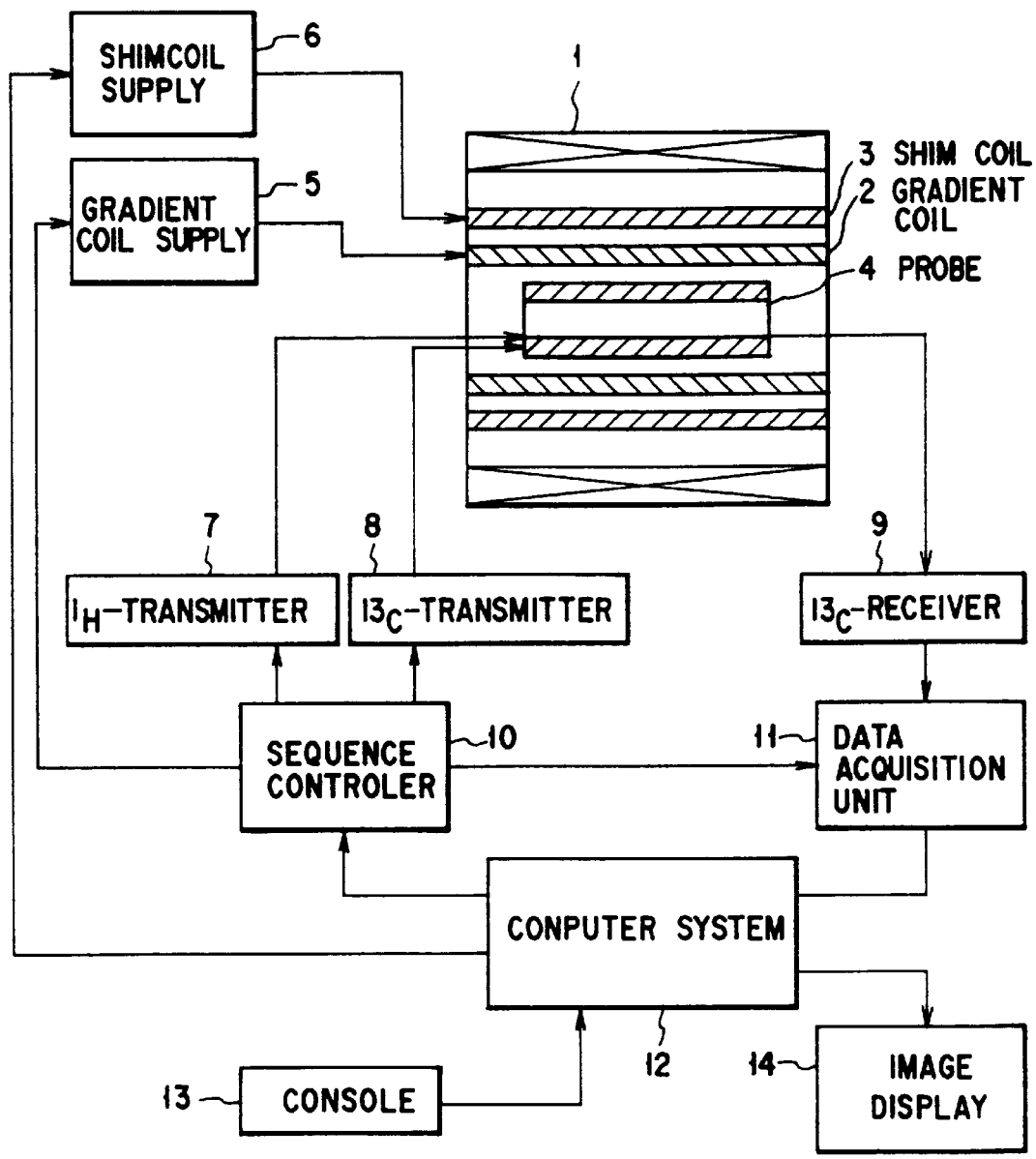
F I G. 25

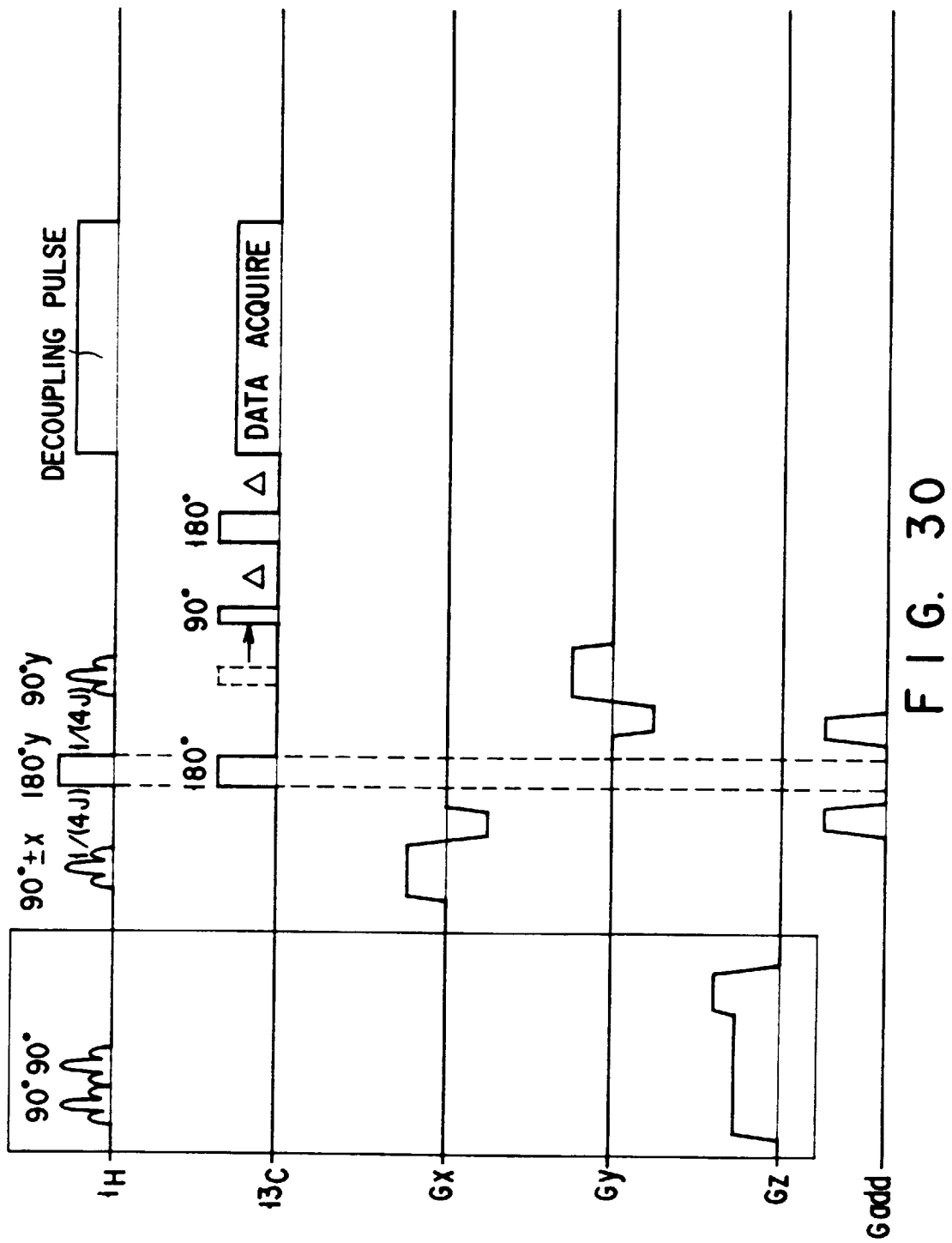
F I G. 30

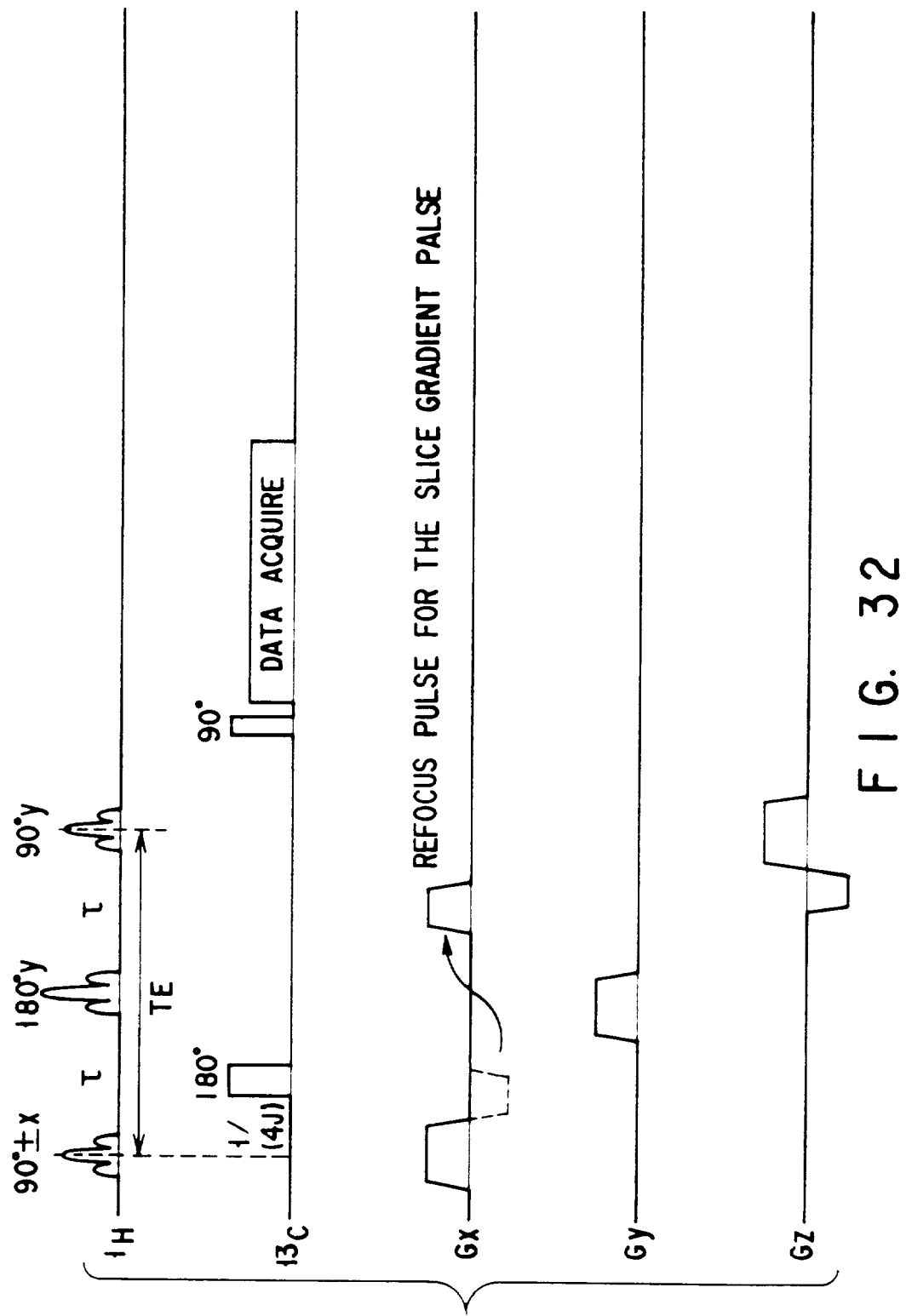

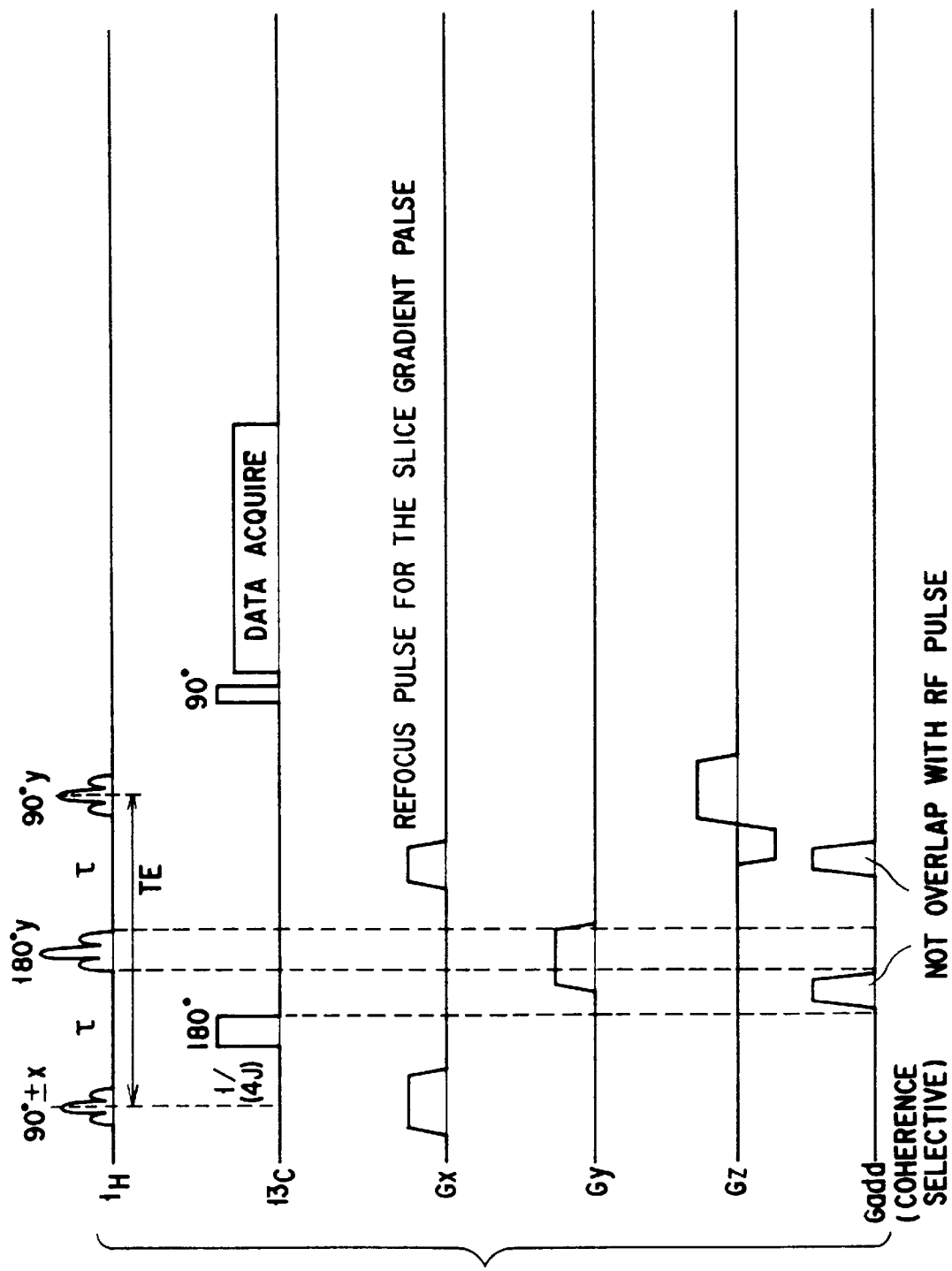
F I G. 33

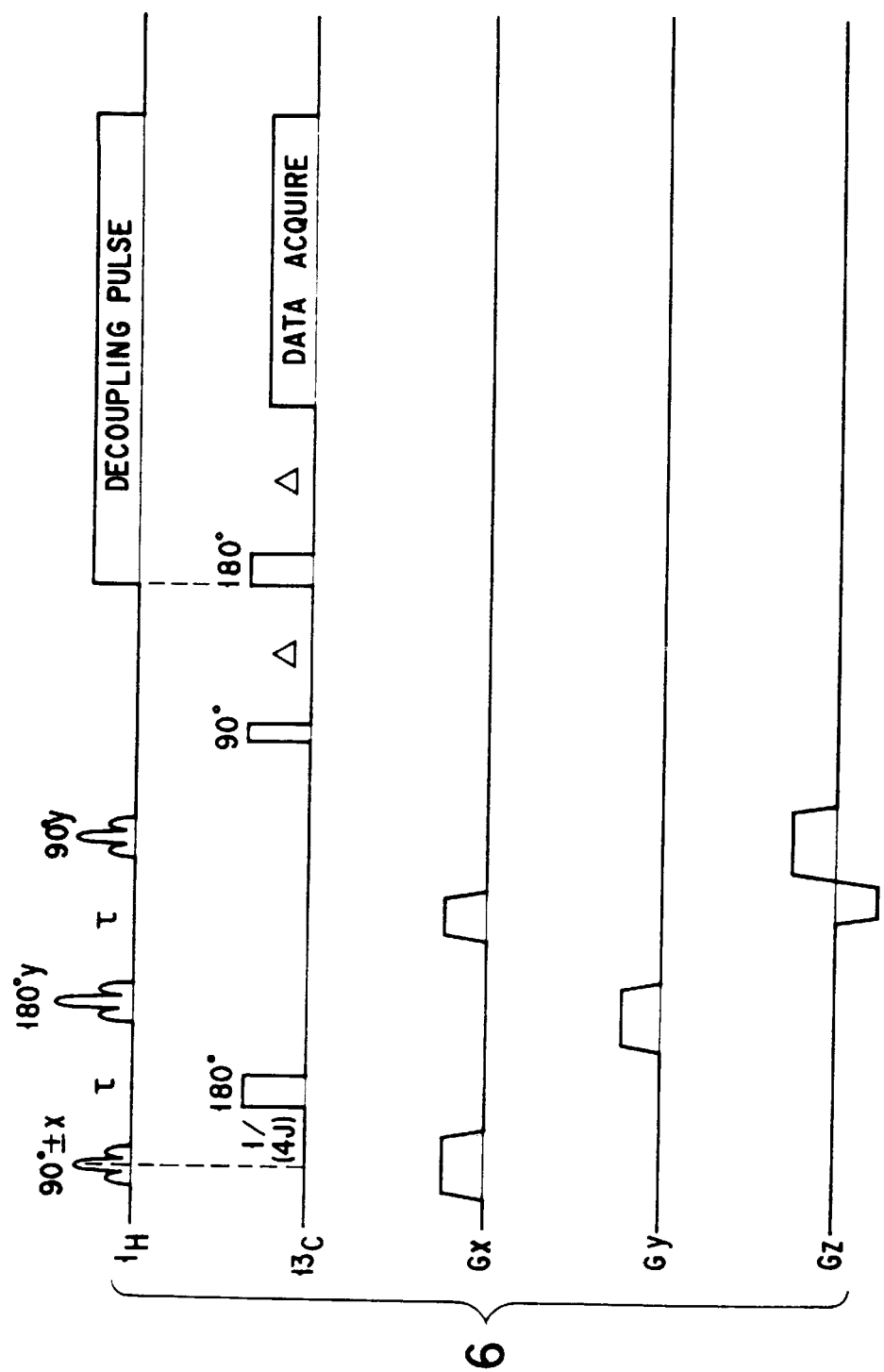
F I G. 36

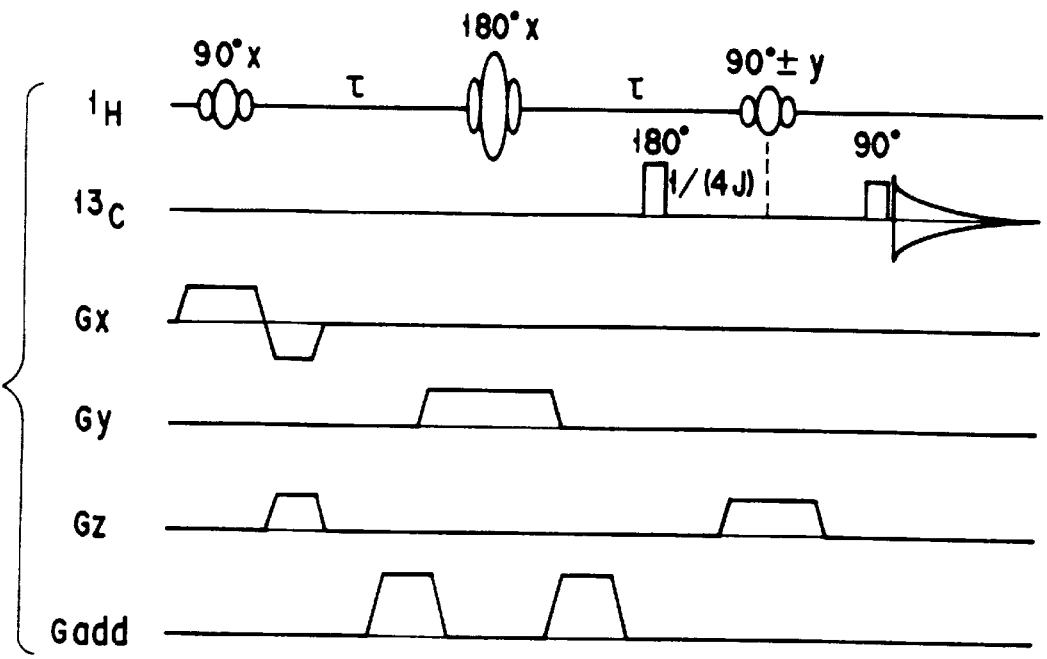
F I G. 37
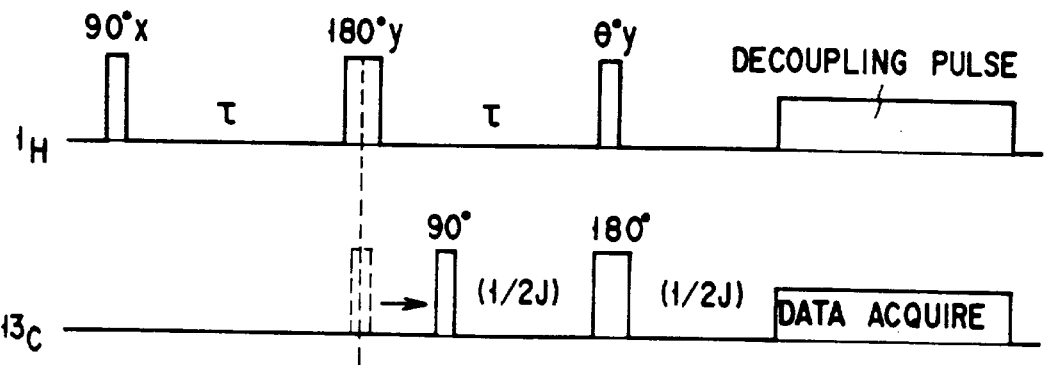
F I G. 40
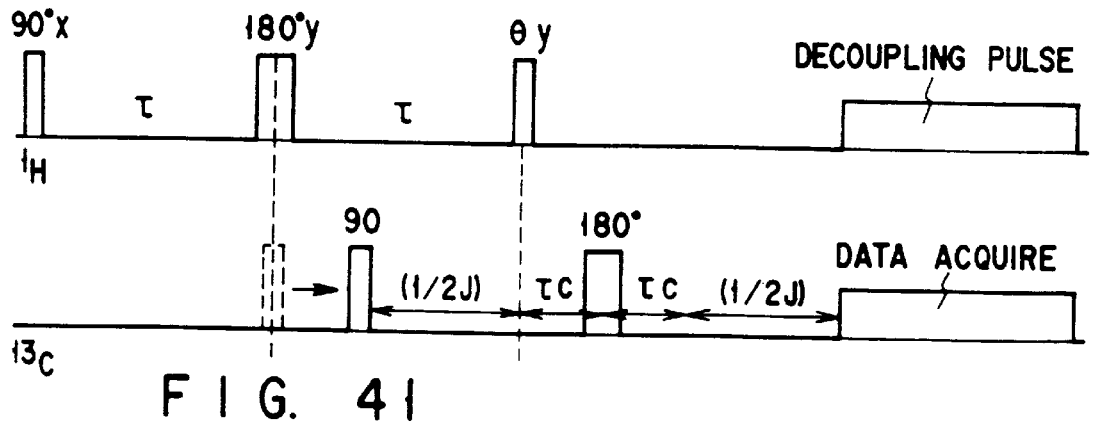
F I G. 41

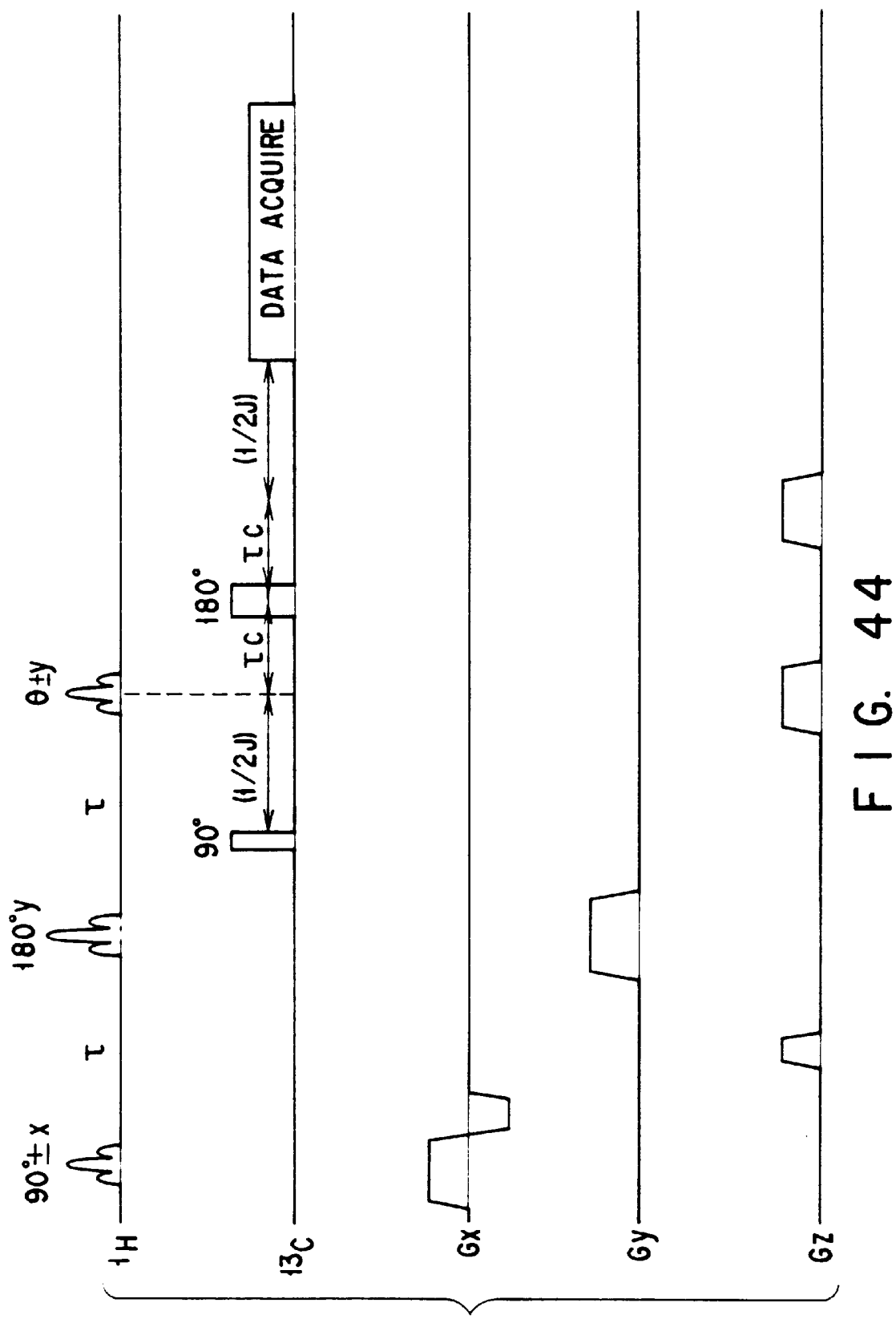
F I G. 44

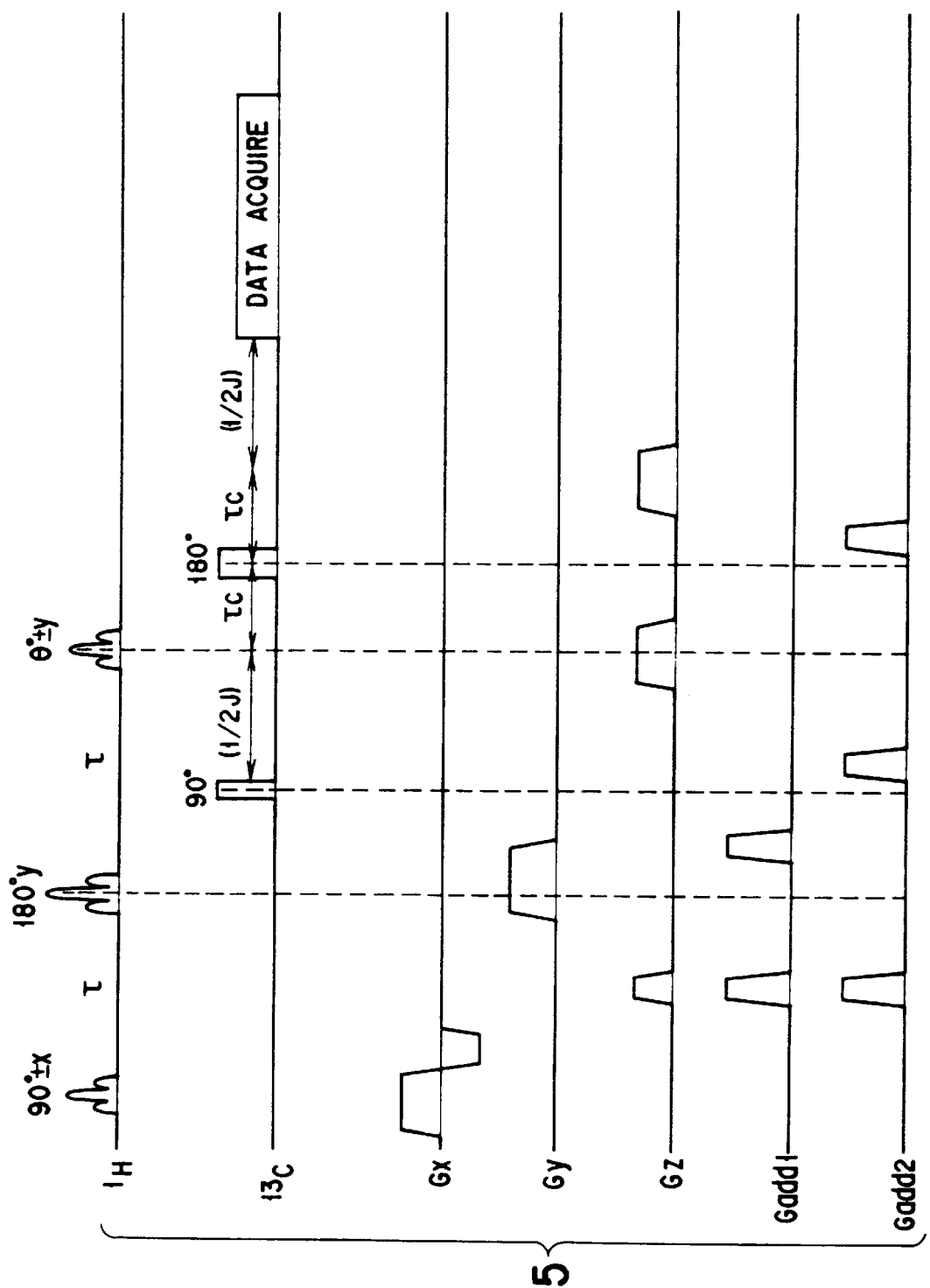
F I G. 45

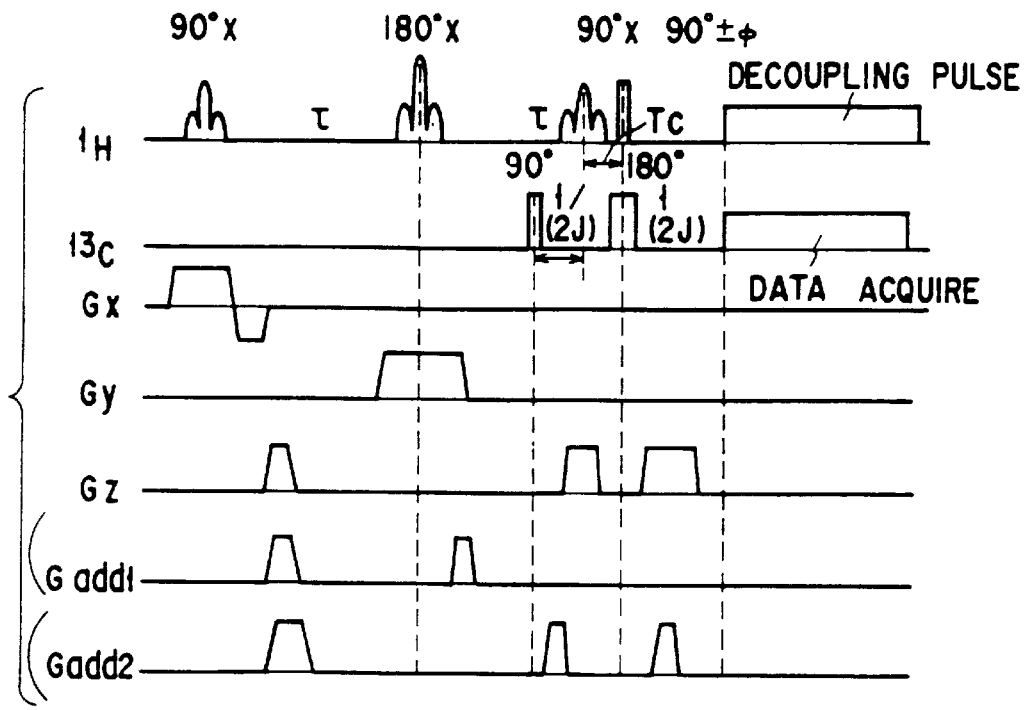
F I G. 48A
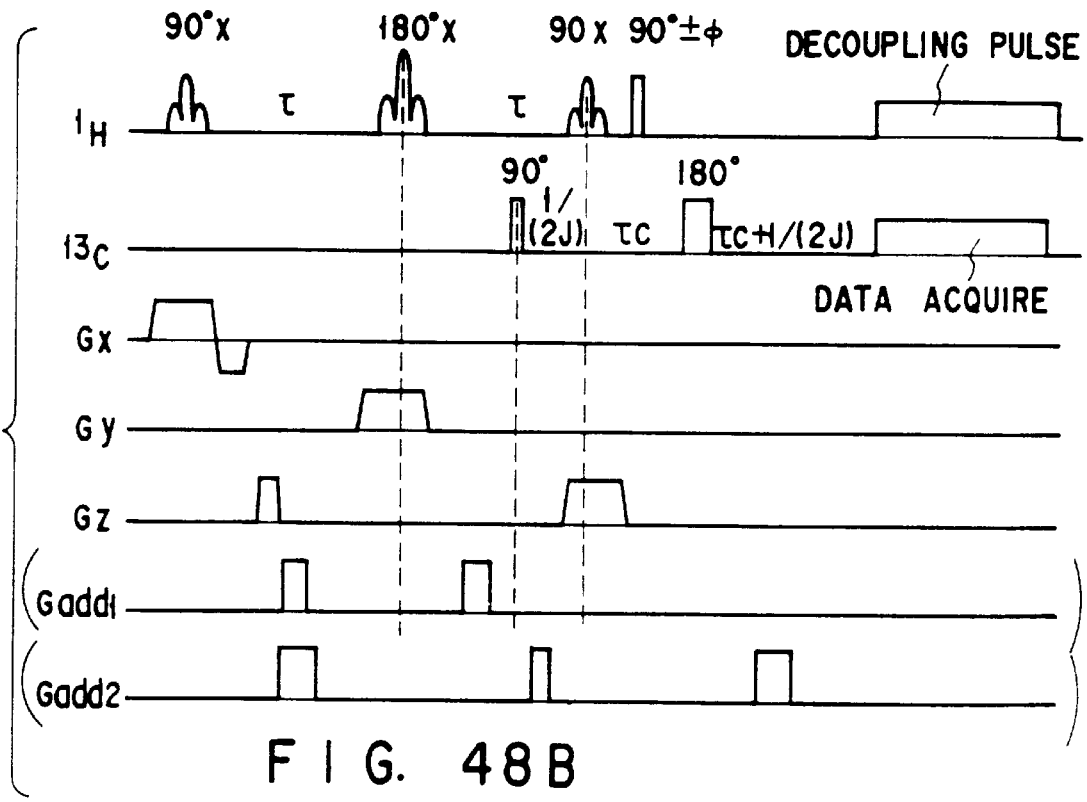
F I G. 48B

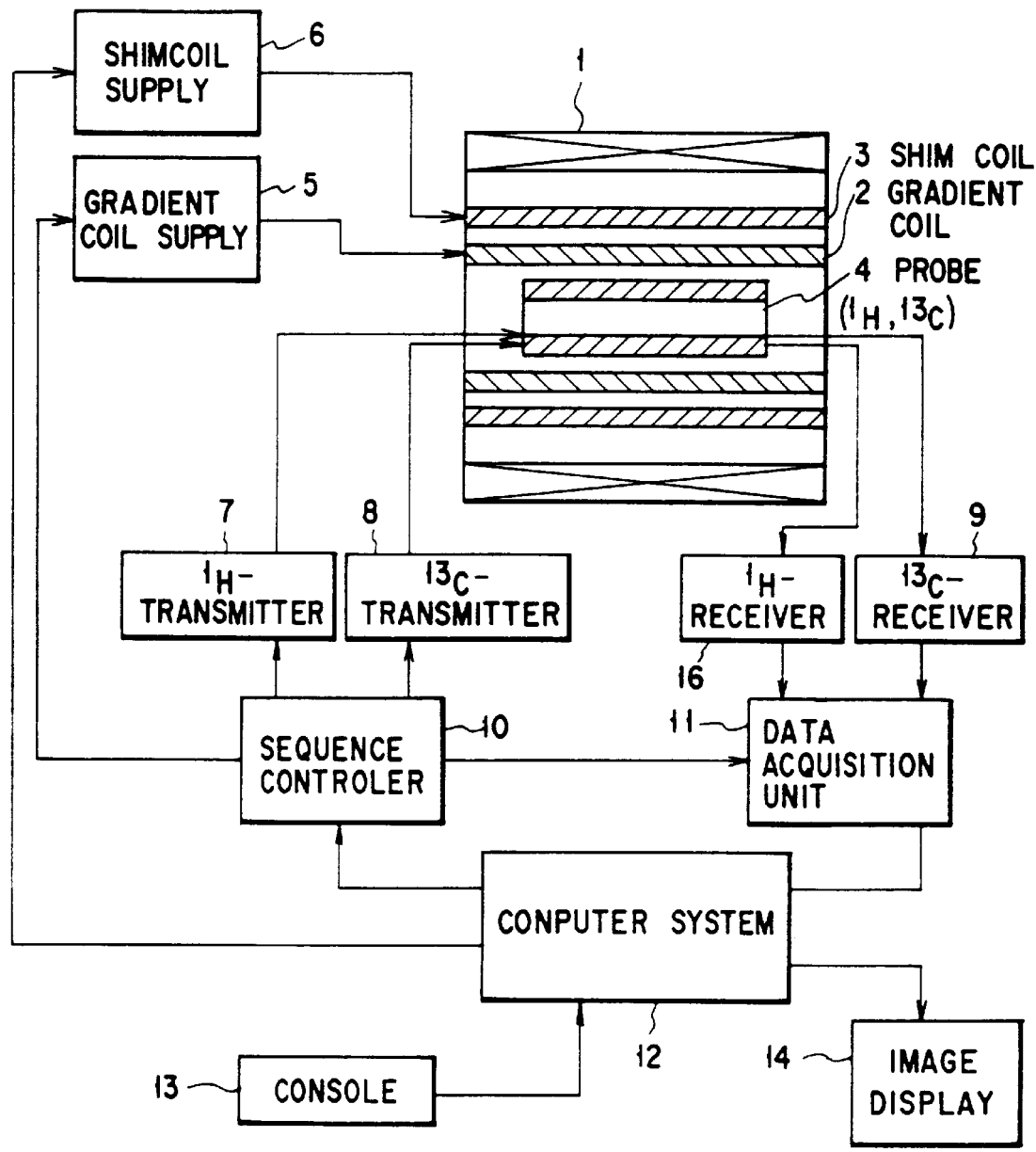
F I G. 50

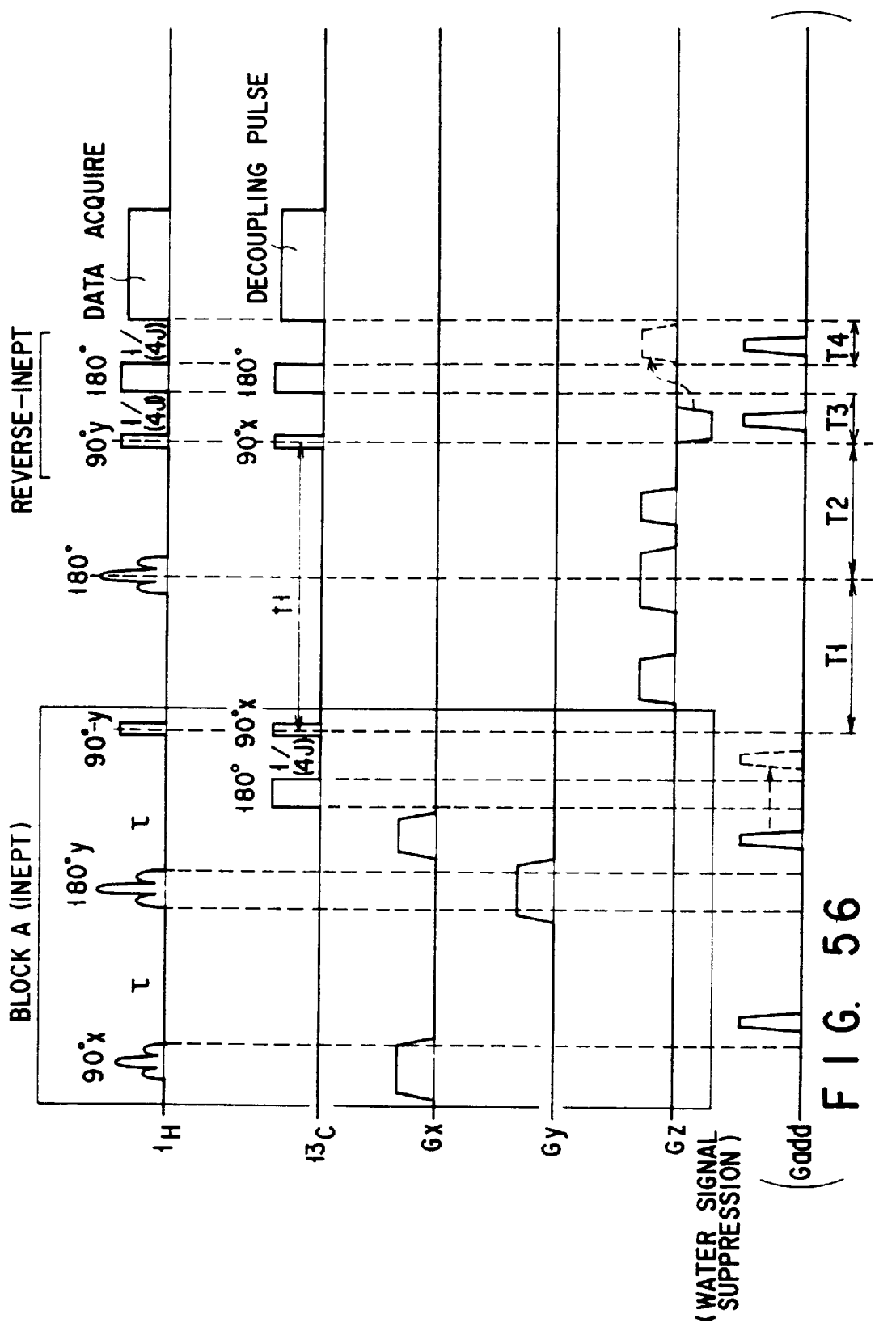
F I G. 56

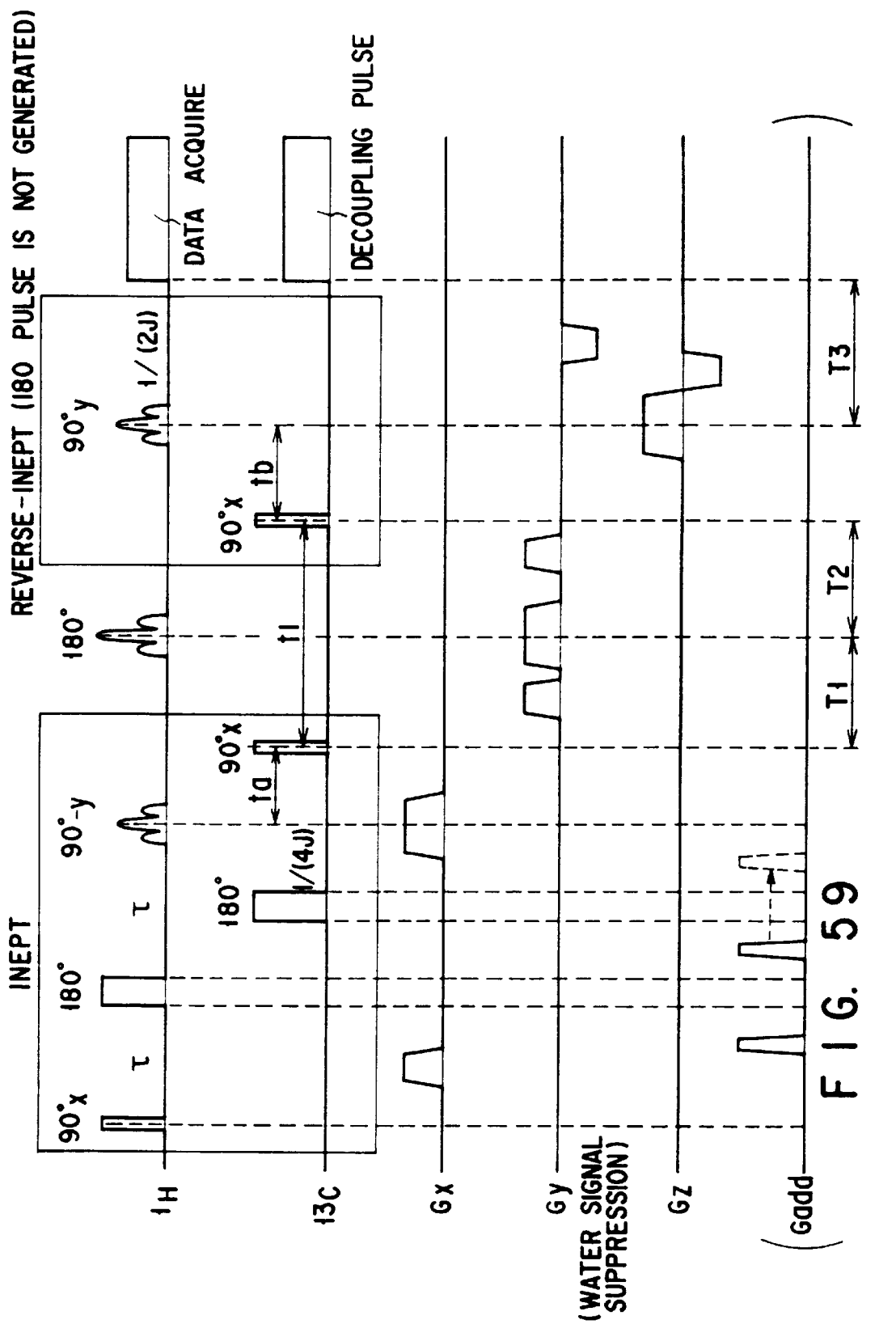
F I G. 59

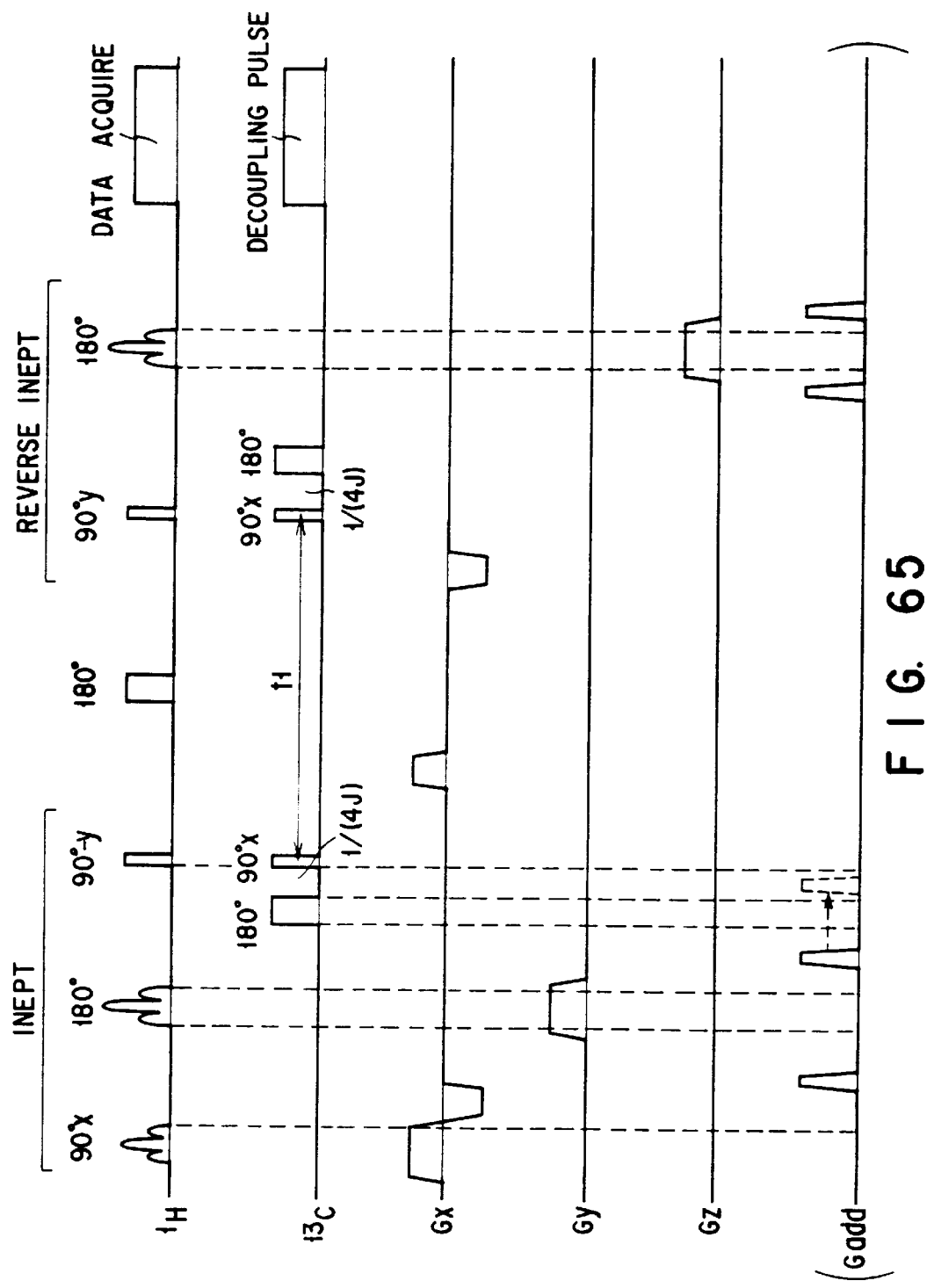
F I G. 65

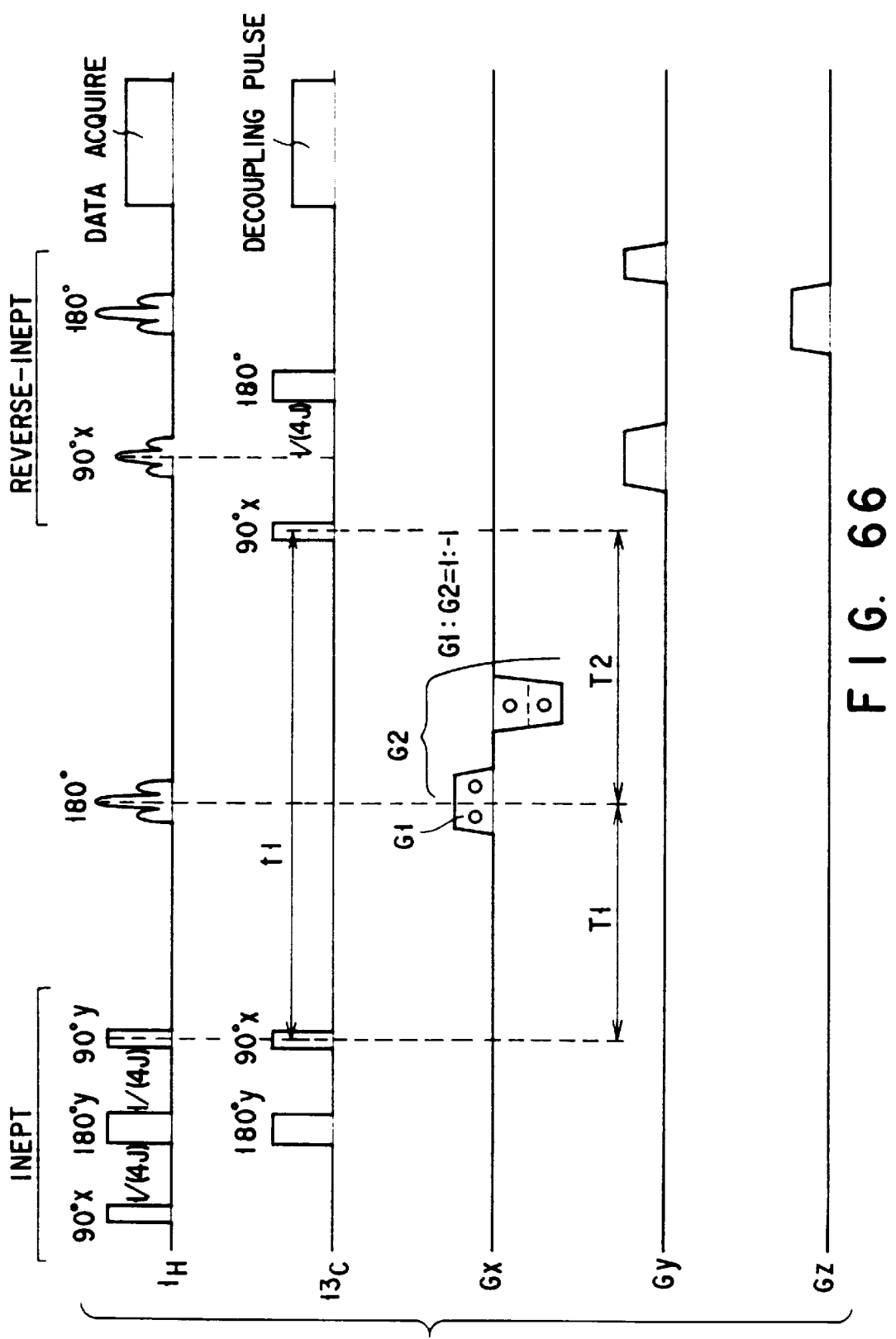
F I G. 66

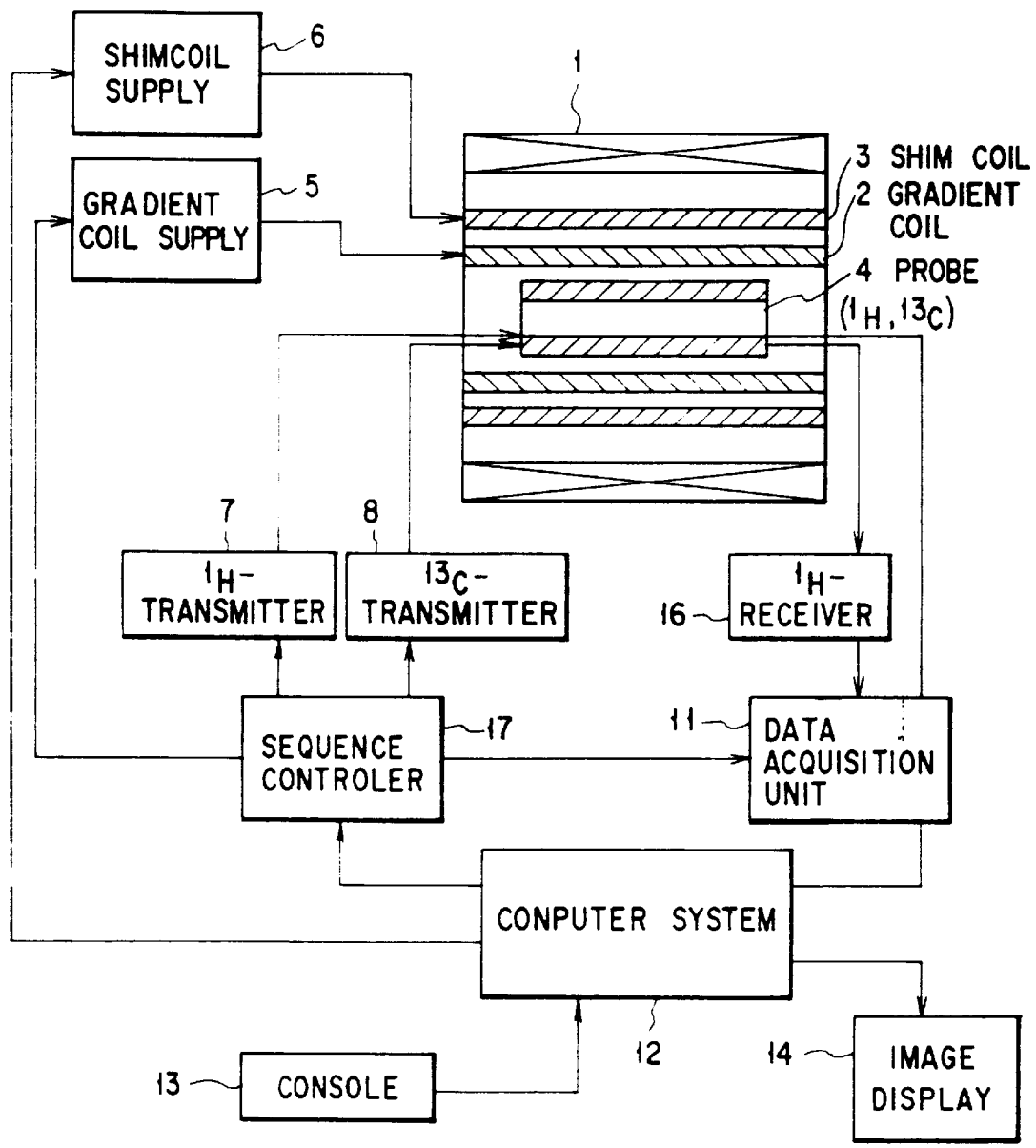
F I G. 69

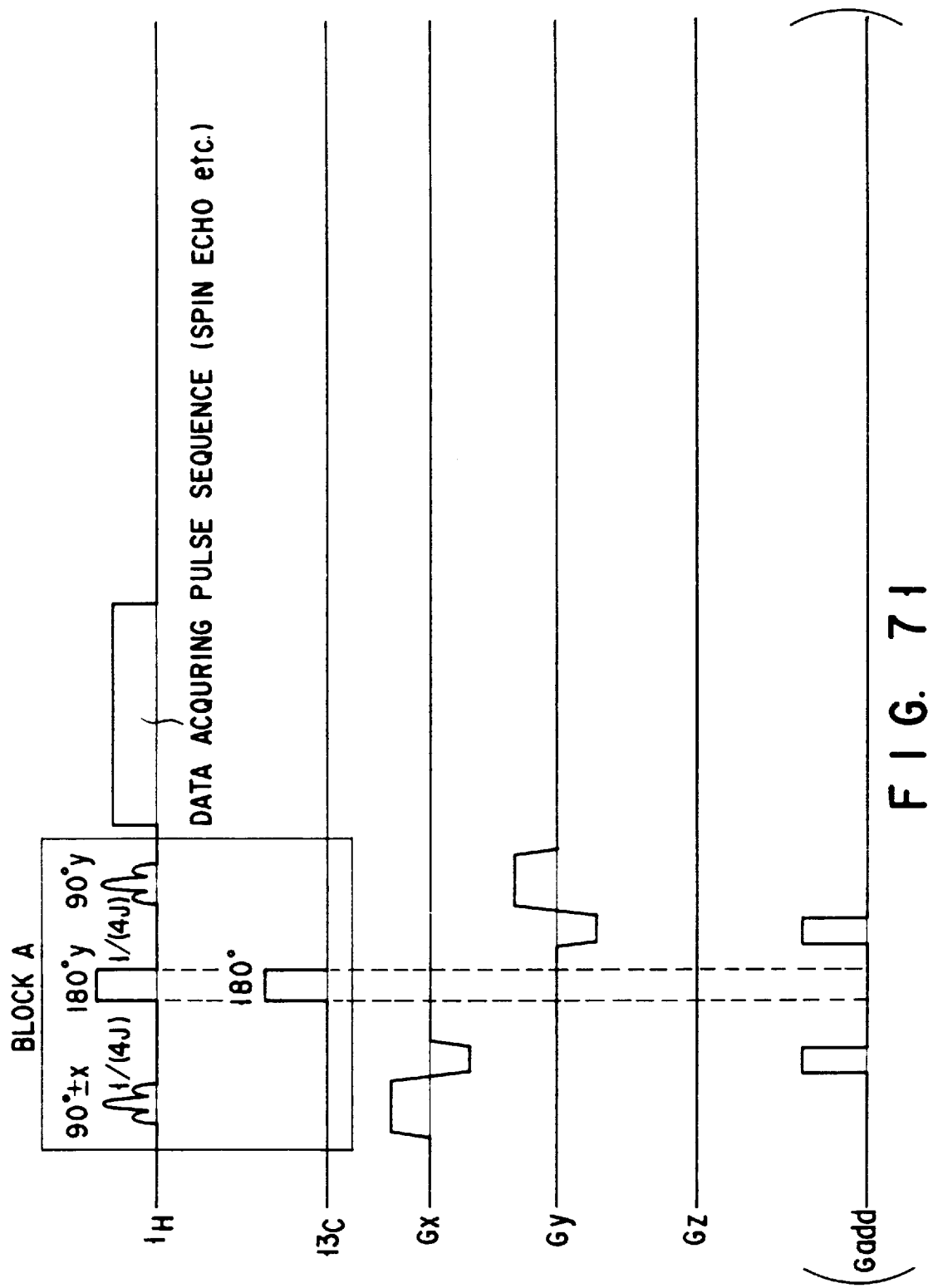
F I G. 71

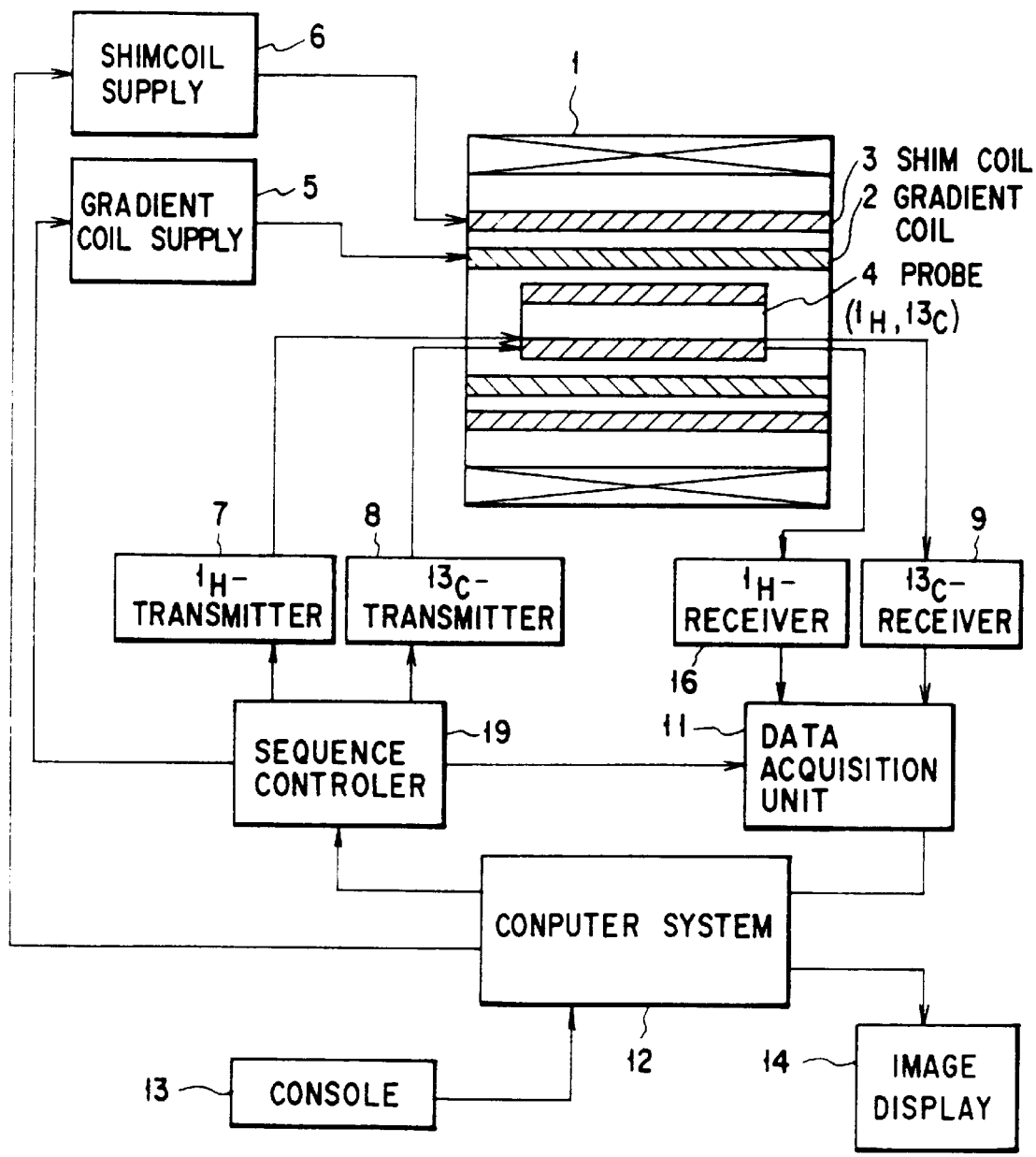
F I G. 83 t=t2

Lm : IMAGINARY
Re : REAL

MAGNETIC RESONANCE DIAGNOSTIC APPARATUS

This application is a Division of application Ser. No. 08/909,948 Filed on Aug. 12, 1997, now U.S. Pat. No. 5,894,221, which is a Division of application Ser. No. 08/617,654, Filed Mar. 15, 1996, now U.S. Pat. No. 5,677,628.

BACKGROUND OF THE INVENTION

1. Field of the Invention

The invention relates to a magnetic resonance diagnostic apparatus which acquires information about relatively insensitive nuclear species, such as $^{13}C$, with high sensitivity.

2. Description of the Related Art

Attention has been paid to the observation of spectra of nuclear species such as $^{13}C$ in that information about biochemistry such as metabolism or energy metabolism can be obtained. Assuming the sensitivity of $^1H$ to be unity, the sensitivity of $^{13}C$ is as low as about ¼. Thus, there arises a problem in that the signal-to-noise ratio becomes very low.

Methods of improving the signal-to-noise ratio by employing large polarization of $^1H$ have been developed recently, which are roughly classified into two categories: $^{13}C$ observation (polarization transfer method) and $^1H$ observation. $^{13}C$ observation methods include INEPT (Insensitive Nuclei Enhanced by Polarization Transfer) methods and DEPT (Distortionless Enhancement by Polarization Transfer) methods. $^1H$ observation methods include HSQC (Heteronuclear Single Quantum-Coherence) methods and HMQC (Heteronuclear Multiple Quantum-Coherence) methods.

Hereinafter each of the above methods will be described. In the following description, $^1H$ combined with $^{13}C$ is represented by "$^1H\{^{13}C\}$". A radio-frequency magnetic field pulse (RF pulse) that selectively rotate $^1H$ or $^{13}C$ spins through $\alpha°$ with respect to the $\beta$ axis ($\beta$=x, y, pr z) is represented by a "$\alpha° \beta(^1H$ or $^{13}C)$ pulse". The spin—spin coupling constant of $^1H$ and $^{13}C$ is represented by J.

FIG. 1 shows an INEPT pulse sequence, and FIG. 2 shows the state of $^1H$ spin at time ta after a lapse of time 1/(4J) from the application of a 180° ($^{13}C$) pulse. For $^1H$ a 90° x($^1H$) pulse, a 180° y($^1H$) pulse and a 90° y($^1H$) pulse are produced in sequence. For $^{13}C$ a 180° ($^{13}C$) pulse and a 90° ($^{13}C$) pulse are produced in sequence. The 180° y($^{13}C$) pulse and the 180° ($^{13}C$) pulse are produced simultaneously. The 90° y($^1H$) pulse and the 90° ($^{13}C$) pulse are produced simultaneously. The time interval between the 90° x($^1H$) pulse and 180° ($^{13}C$) pulse is set to 1/(4J). The time interval between the 180° ($^{13}C$) pulse and 90° y($^1H$) pulse is also set to 1/(4J). FIG. 3 shows a spectrum of data detected from $^{13}C$, which allows various metabolic functions to be diagnosed.

FIG. 4 shows an INEPT pulse sequence which has an additional decoupling pulse produced for $^1H$ at data acquisition time. FIGS. 5 and 6 show INPET pulse sequences which have additional 180° pulses produced for $^1H$ and $^{13}C$ to rephase their spins. FIG. 7 shows a polarization transfer pulse sequence which has no 180° pulse. Even with a 180° pulse removed, polarization transfer can be made, but its efficiency is low because the $^1H$ spins are not refocused.

FIG. 8 shows a DEPT pulse sequence, in which a 90° x($^1H$), a 180° x($^1H$) pulse and a $\theta°$ y($^1H$) pulse are produced sequentially for $^1H$, and a 90° ($^{13}C$) and a 180° ($^{13}C$) pulse are produced sequentially for $^{13}C$. The 180° x($^1H$) pulse and the 90° ($^{13}C$) pulse are produced simultaneously. The $\theta°$ y($^1H$) pulse and the 180° ($^{13}C$) pulse are produced simultaneously. The time interval between the 90° x($^1H$) pulse and 90° ($^{13}C$) pulse is set to 1/(2J). The time interval between the 90° ($^{13}C$) pulse and $\theta°$ y($^1H$) pulse is also set to 1/(2J).

FIG. 9 shows an HSQC pulse sequence. The INEPT pulse sequence indicated by block A allows polarization transfer to be made. Signals are then observed from $^1H$ after a single-quantum coherence period t1 for $^{13}C$ during which time a chemical shift of $^{13}C$ is developed and a reverse-INEPT pulse sequence indicated by block B. Since J coupling is refocused by a 180° pulse at the center of the period t1, only the $^{13}C$ chemical shift is developed during the t1 period. Two-dimensional data S(t1, t2) is acquired by repeating the pulse sequence of FIG. 9 while changing the length of the interval t1. By subjecting the resultant data to two-dimensional Fourier transform, such a spectrum distribution $\sigma(\omega^1H, \omega^{13}C)$ as shown in FIG. 10 is obtained.

FIG. 11 shows an HMQC pulse sequence. In HMQC, signals are observed from $^1H$ after a lapse of a multiple-quantum coherence period t1 during which time $^{13}C$ chemical shift is developed. Data S(t1, t2) is acquired by repeating the pulse sequence of FIG. 11 while changing the length of the period t1. The resultant data is subjected to two-dimensional Fourier transform to produce such a spectrum distribution as shown in FIG. 12.

With the $^1H$ observation, it is essential to remove water signals.

With the HSQC pulse sequence of FIG. 9, water signals are removed by a CHESS (chemical shift selective) pulse.

An important problem with the HSQC and HMQC methods is to remove water signals. However, the above-described methods cannot remove $^1H$ in, for example, glucose (CH) which has a chemical shift close to that of $^1H$ in water.

FIG. 13 shows an HSQC pulse sequence in which gradient magnetic field pulse Gsel for selecting only coherence of $^1H\{^{13}C\}$ are added in order to remove water signals.

FIGS. 14 and 16 show HMQC pulse sequences which are improved to remove water signals. FIG. 15A shows the state of magnetization of $^1H$ at time ta after a lapse of 1/(4J) from the 180° ($^{13}C$) pulse in the INEPT sequence of FIGS. 14 and 16. In FIG. 14, the third proton pulse, which is 90° ($^1H$) pulse is produced for the X axis, so that $^1H\{^{12}C\}$ is returned to longitudinal magnetization and water signals are removed as shown in FIG. 15B. In FIG. 16, the third proton pulse, which is 90° ($^1H$) pulse, is produced for the Y axis to return $^1H\{^{13}C\}$ to longitudinal magnetization and preserve the transverse magnetization of $^1H\{^{12}C\}$. In this state, a gradient magnetic field pulse pulse is produced to thereby dephase $^1H\{^{12}C\}$ and remove water signals. After that, a 90° ($^1H$) pulse is produced to return $^1H\{^{13}C\}$ to transverse magnetization and create the multiple-quantum coherence state.

FIG. 17 shows an HMQC pulse sequence in which gradient magnetic field pulse Gselection are added in order to remove single-quantum coherence of water signals and select only multiple-quantum coherence.

In order to use the INEPT, DEPT, HSQC, or HMQC in in vivo magnetic resonance spectroscopy, the localization is essential.

FIG. 18 shows a DEPT pulse sequence combined with a VSE (volume selective excitation) pulse sequence. In the VSE sequence, a 90° selective excitation pulse and a 90° non-selective excitation pulse are combined to put spins outside a region of interest into pseudo-saturation and make forced recovery of spins within the region of interest, thereby providing the localization of three axes.

However, problems associated with the combined use of the VSE sequence and the DEPT sequence are that widely-used apparatuses cannot produce VSE pulses and the precision of localization is reduced by recovery of longitudinal magnetization of $^1H$ spins outside a region of interest.

FIG. 19 shows a DEPT sequence which was improved by Yeung et al for localization. In this DEPT sequence, the first 90° ($^1H$) pulse for $^1H$ is used as a slice selective pulse, thereby achieving the localization of one axis.

FIG. 20 shows a SZNEPT sequence which was improved by M. Saner et al in localization. In this sequence, two pulses for $^1H$ are used as slice selective pulses, thereby achieving the localization of two axes.

FIG. 21 shows a DEPT pulse sequence which was improved by Bömsdorf et al for localization. In this DEPT sequence, the first 90° ($^1H$) pulse and two 90° ($^1H$) pulses resulting from division of a 180° ($^1H$) pulse are used as slice selective pulses to achieve the localization of three axes.

In addition, the combined use of an ISIS (image selected in vivo spectroscopy) technique and the DEPT sequence is also being considered for localization. However, this method requires two data acquisition steps for one-dimensional localization and eight data acquisition steps for three-dimensional localization. This requires a long observation time. Further, this method also has a problem that the precision of localization is reduced by recovery of longitudinal magnetization.

FIG. 22 shows an HMQC sequence intended to achieve the localization of one axis by using a 90° ($^1H$) pulse for $^1H$ as a slice selective pulse.

As described above, the INEPT, DEPT, HSQC, and HMQC methods have difficulties in achieving efficient localization.

In addition, the $^1H$ observation methods (HSQC, HMQC) have a problem that water signals cannot be successfully removed.

FIG. 23 shows changes of the spectrum of the brain of a monkey with time after glucose in which $^{13}C$ is labeled with carbon is injected into its vein. The area of this spectrum corresponds to the amount of metabolite. As shown in FIG. 24, by observing changes of the area of the spectrum with time, information is obtained which is useful for diagnosis of metabolic speed by way of example. The area of the spectrum was calculated on the basis of an approximate curve of the spectrum curve. However, the precision of the approximate curve was too low to obtain useful information with high precision.

SUMMARY OF THE INVENTION

It is an object of the invention to provide a magnetic resonance diagnostic apparatus which permits the localization to be achieved successfully by improving each of the INEPT, DEPT, HSQC, and HMQC pulse sequences.

According to an aspect of the invention there is provided a magnetic resonance diagnostic apparatus which is adapted to apply to a plurality of nuclear species radio-frequency (RF) magnetic fields corresponding to their respective resonant frequencies, comprising: means for applying a sequence of a first RF pulse, a second RF pulse, and a third RF pulse to a first nuclear species and applying a sequence of a fourth RF pulse and a fifth RF pulse to a second nuclear species to cause poralization transfer from spins of the first nuclear species to spins of the second nuclear species; and means for acquiring a magnetic resonance signal of the second nuclear species based on the polarization transfer, and wherein the fourth RF pulse is an inversion pulse that is applied at a time that is within an interval between the first RF pulse and the third RF pulse and differs from the timing of the second RF pulse, and the fifth RF pulse is applied simultaneously with or after the third RF pulse.

According to other aspect of the invention, there is provided a magnetic resonance diagnostic apparatus which is adapted to apply to a plurality of nuclear species radio-frequency (RF) magnetic fields corresponding to their respective resonant frequencies, comprising: means for applying a sequence of a first RF pulse, a second RF pulse, and a third RF pulse to a first nuclear species and applying a sequence of a fourth RF pulse and a fifth RF pulse to a second nuclear species to thereby cause poralization transfer from spins of the first nuclear species to spins of the second nuclear species; means for, after the occurrence of the polarization transfer, applying a sixth RF pulse to the second nuclear species and a seventh RF pulse to the first nuclear species to thereby return the polarization transfer from spins of the second nuclear species to spins of the first nuclear species; and means for acquiring a magnetic resonance signal from the first nuclear species returned the polarization transfer, and wherein the fourth RF pulse is an inversion pulse that is applied at a time that is within an interval between the first RF pulse and the third RF pulse and differs from the timing of the second RF pulse, the fifth RF pulse is applied simultaneously with or after the third RF pulse, and the seventh RF pulse is applied simultaneously with or after the sixth RF pulse.

According to other aspect of the invention, there is provided a magnetic resonance diagnostic apparatus which is adapted to apply to a plurality of nuclear species radio-frequency (RF) magnetic fields corresponding to their respective resonant frequencies, comprising: means for applying a sequence of a first RF pulse, a second RF pulse, and a third RF pulse to a first nuclear species and applying a fourth RF pulse to a second nuclear species; and means for acquiring a magnetic resonance signal from spins of the first nuclear species that are spin-spin coupled with spins of the second nuclear species, and wherein the fourth RF pulse is an inversion pulse that is applied at a time that is within an interval between the first RF pulse and the third RF pulse and differs from the timing of the second RF pulse, and the third RF pulse is applied in a phase to return spins of the first nuclear species that are not spin-spin coupled with spins of the second nuclear species to the longitudinal magnetization.

According to other aspect of the invention, there is provided a magnetic resonance diagnostic apparatus which is adapted to apply to a plurality of nuclear species radio-frequency (RF) magnetic fields corresponding to their respective resonant frequencies, comprising: means for applying a sequence of a first RF pulse, a second RF pulse, a third RF pulse and a fourth RF pulse to a first nuclear species and applying a fifth RF pulse to a second nuclear species; means for applying a dephase gradient magnetic field pulse during an interval between the third and fourth RF pulses; and means for acquiring a magnetic resonance signal from the first nuclear species that are spin-spin coupled with the second nuclear species, and wherein the fifth RF pulse is an inversion pulse that is applied at a time that is within an interval between the first RF pulse and the third RF pulse and differs from the timing of the second RF pulse, and the third RF pulse is applied in a phase to return spins of the first nuclear species that are spin-spin coupled with spins of the second nuclear species to the longitudinal magnetization.

According to other aspect of the invention, there is provided a magnetic resonance diagnostic apparatus which is adapted to apply to a plurality of nuclear species radio-frequency (RF) magnetic fields corresponding to their respective resonant frequencies, comprising: means for applying a sequence of a first RF pulse, a second RF pulse, and a third RF pulse to a first nuclear species and applying a fourth RF pulse and a fifth RF pulse to a second nuclear species to thereby cause polarization from first nuclear spins to second nuclear spins, the fourth RF pulse is an excitation pulse that is applied during an interval between the second RF pulse and the third RF pulse, the fifth RF pulse is a refocus pulse that is applied simultaneously with or after the third RF pulse; means for applying gradient magnetic field pulses during an interval between the first and second RF pulses and during an interval between the second and fourth RF pulses at an equal integration value with respect to time; and means for acquiring a magnetic resonance signal from the second nuclear species with the polarization transfer.

According to other aspect of the invention, there is provided a magnetic resonance diagnostic apparatus which is adapted to apply to a plurality of nuclear species radio-frequency (RF) magnetic fields corresponding to their respective resonant frequencies, comprising: means for applying a sequence of a first RF pulse, a second RF pulse, and a third RF pulse to a first nuclear species and applying a sequence of at least a fourth RF pulse and a fifth RF pulse to a second nuclear species to thereby cause polarization transfer from first nuclear spins to second nuclear spins, the fourth RF pulse is an excitation pulse that is applied during an interval between the second RF pulse and the third RF pulse, the fifth RF pulse is a refocus pulse that is applied simultaneously with or after the third RF pulse; means for applying gradient magnetic field pulses between an interval the first and second RF pulses, an interval between the fourth and third RF pulses and after the fifth RF pulse at an equal integration value with respect to time; and means for acquiring a magnetic resonance signal of the second nuclear species based on the polarization transfer.

According to other aspect of the invention, there is provided a magnetic resonance diagnostic apparatus which is adapted to apply to a plurality of nuclear species radio-frequency (RF) magnetic fields corresponding to their respective resonant frequencies, comprising: means for applying a sequence of a first RF pulse and a second RF pulse to a first nuclear species and applying at least a third RF pulse to a second nuclear species simultaneously with or after the second RF pulse to thereby cause polarization transfer from first nuclear spins to second nuclear spins; means for, after the occurrence of polarization transfer, applying at least a refocus pulse as a slice selective pulse associated with a first axis to the first nuclear species and at least a fourth RF pulse to the second nuclear species in sequence and applying a fifth RF pulse to the first nuclear species simultaneously with or after the fourth RF pulse to thereby return polarization transfer from the second nuclear spins to the first nuclear spins; means for acquiring a magnetic resonance signal from the first nuclear species at the occurrence of the polarization transfer; and means for applying gradient magnetic field pulses associated with the first axis for selecting a slice with the refocus pulse and suppressing a magnetic resonance signal from the first nuclear species that are not spin—spin coupled with the second nuclear spins.

According to other aspect of the invention, there is provided a magnetic resonance diagnostic apparatus which is adapted to apply to a plurality of nuclear species radio-frequency (RF) magnetic fields corresponding to their respective resonant frequencies, comprising: means for applying a first RF pulse to a first nuclear species; means for applying a second RF pulse to the first nuclear species after the application of the first RF pulse to thereby produce multiple-quantum coherence between the first nuclear species and a second nuclear species, which the first and second nuclear species are spin—spin coupled; means for applying a refocus pulse to the first nuclear species after the application of the second RF pulse as a slice selective pulse associated with a first axis; means for applying a third RF pulse to the second nuclear species after the application of the refocus pulse to produce single-quantum coherence of the first nuclear species and acquiring a magnetic resonance signal from the first nuclear species; and means for applying gradient magnetic field pulses for selecting a slice with the refocus pulse and for suppressing a magnetic resonance signal from first nuclear spins that are not spin—spin coupled with the second nuclear species.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10 shows an example of a two-dimensional spectrum;

FIG. 11 shows a conventional HMQC pulse sequence;

FIG. 12 shows an example of a two-dimensional spectrum;

FIG. 13 shows a conventional HSQC pulse sequence for suppressing water signals;

FIG. 14 shows a conventional HMQC pulse sequence for suppressing water signals;

FIGS. 15A and 15B show the states of $^1$H spins at times ta and tb in FIG. 14;

FIG. 25 shows an arrangement of a magnetic resonance diagnostic apparatus according to a first embodiment of the invention;

FIG. 30 shows the second improved INEPT pulse sequence which has an additional 180° pulse for $^{13}$C;

FIG. 32 shows a third improved INEPT pulse sequence corresponding to the principle of FIG. 31A;

FIG. 33 shows the third improved INEPT pulse sequence which has additional Gadd pulses;

FIGS. 34, 35 and 36 show the third pulse sequences which have an additional decoupling pulse;

FIG. 37 shows a fourth improved INEPT pulse sequence corresponding to the principle of FIG. 31B;

FIGS. 40 and 41 are diagrams for use in explanation of the principles of localization associated with DEPT;

FIG. 44 shows the second improved pulse sequence corresponding to the principle of FIG. 41;

FIG. 45 shows the second improved DEPT pulse sequence which has additional Gadd pulses;

FIGS. 47A, 47B, 48A and 48B show the first and second improved pulse sequences with which the POMMIE method is used combined;

FIG. 50 shows an arrangement of a magnetic resonance diagnostic apparatus according to a fourth embodiment of the invention;

FIG. 56 shows a third improved HSQC pulse sequence corresponding to the principle of FIG. 54A;

FIG. 59 shows a fifth improved HSQC pulse sequence;

FIG. 65 shows a tenth improved HSQC pulse sequence;

FIG. 66 shows an eleventh improved HSQC pulse sequence;

FIG. 69 shows an arrangement of a magnetic resonance diagnostic apparatus according to a fourth embodiment of the invention;

FIG. 71 shows an INEPT combined-use type pulse sequence in which two 90° ($^1$H) pulses are used as slice selective pulses;

FIG. 83 shows an arrangement of a magnetic resonance diagnostic apparatus according to a sixth embodiment of the invention;

DETAILED DESCRIPTION OF THE PREFERRED EMBODIMENTS

Figure 1:
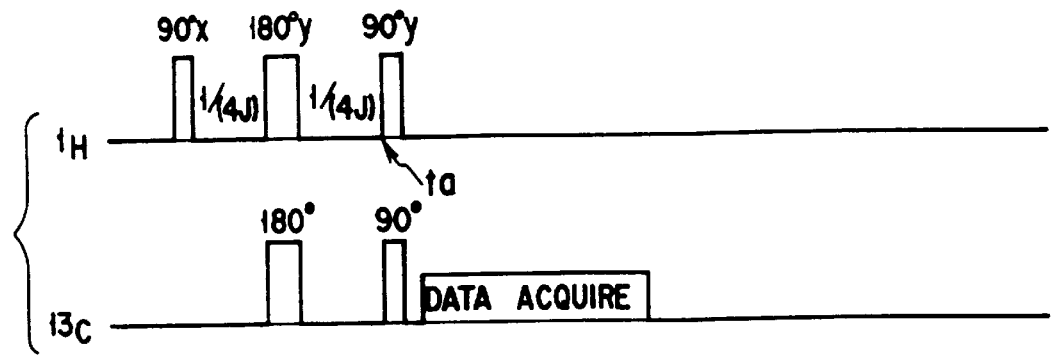
FIG. 1 shows a conventional INEPT pulse sequence.

In the invention, a first nuclear species and a second nuclear species that are magnetically coupled with the first nuclear species are utilized. In this description, the first species and the second species are selected to be $^1$H and $^{13}$C, respectively. This is, however, only illustrative and not restrictive. For example, the second nuclear species may be !15N.

Let the spin—spin coupling factor of $^1$H and $^{13}$C be represented by J. Let $^1$H coupled with $^{13}$C be represented by $^1$H{$^{13}$C} and $^1$H coupled with $^{12}$C by $^1$H{$^{12}$C}.

Further, let a radio-frequency magnetic field pulse that selectively excites only $^1$H spins with respect to the a (a=X or Y) axis be represented by a 90° a($^1$H) pulse. Let a radio-frequency magnetic field pulse that selectively inverts only $^1$H spins with respect to the a (a=X or Y) axis be represented by a 180° a($^1$H) pulse. Let a radio-frequency magnetic field pulse that selectively excites only $^{13}$C spins with respect to the a (X or Y) axis be represented by a 90° a($^{13}$C) pulse. Let a radio-frequency magnetic field pulse that selectively inverts only $^{13}$C spins with respect to the a (X or Y) axis be represented by a 180° a($^{13}$C) pulse.

First Embodiment

FIG. 25 shows an arrangement of a magnetic resonance diagnostic apparatus according to a first embodiment of the invention. A coil assembly includes a static magnetic field magnet 1, gradient coils 2, a shim coil, and a probe 4.

The static magnetic field magnet 1 provides a static magnetic field within the coil assembly. The gradient coils 2 are supplied with currents from a gradient coil power supply system 5 to provide gradient magnetic field pulses along the X, Y and Z-axis directions. The shim coil 3 is supplied with a current from a shim coil power supply to compensate for the inhomogeneity of magnetic fields.

The probe 4 is responsive to a radio-frequency current from a $^1$H transmitter 7 to produce a ($^1$H) pulse and responsive to a radio-frequency current from a $^{13}$C transmitter 8 to produce a ($^{13}$C) pulse.

A $^{13}$C receiver 9 receives a magnetic resonance signal from $^{13}$C through the probe 4. A data acquisition unit 11 amplifies and detects the received magnetic resonance signal and then converts it to a digital signal. A computer system 12 performs Fourier transform on the magnetic resonance signal from the data acquisition unit 11 to thereby produce $^{13}$C spectrum data, which, in turn, is displayed on an image display unit 14. A console 13 is connected to the computer system 12 to enter operator's commands.

The first embodiment achieves the localization by using a radio-frequency magnetic field pulse for $^1$H as a slice selective pulse, not by using a radio-frequency pulse for $^{13}$C. This is because the localization based on the $^{13}$C radio-frequency magnetic field pulse results in a positional change problem due to a chemical shift, whereas the localization by the $^1$H radio-frequency magnetic field pulse is little affected by such a change in position.

In the first embodiment, a radio-frequency magnetic field pulse for $^1$H that was produced in the prior art simultaneously with a radio-frequency magnetic field pulse for $^{13}$C is produced at a different time from the time when that $^{13}$C pulse is produced and used as a slice selective pulse. This is because simultaneously producing a slice selective pulse and a radio-frequency field pulse for $^{13}$C will degrade the flip-angle characteristic of the $^{13}$C pulse.

First, a basic INEPT pulse sequence will be described. A 90° x($^1$H) pulse, a 180° y($^1$H) pulse and a 90° y($^1$H) pulse are sequentially produced for $^1$H. A 180° ($^{13}$C) pulse and a 90° ($^{13}$C) pulse are sequentially produced for $^{13}$C. The second 180° y($^1$H) pulse for $^1$H and the first 180° ($^{13}$C) for $^{13}$C pulse are produced simultaneously. The third 90° y($^1$H) pulse for $^1$H and the second 90° ($^{13}$C) pulse for $^{13}$C are produced simultaneously.

The time interval between the first 90° x($^1$H) pulse for $^1$H and the first 180° ($^{13}$C) for $^{13}$C pulse is set to 1/(4J). The time interval between the first 180° ($^{13}$C) pulse for $^{13}$C and the third 90° y($^1$H) pulse for $^1$H is also set to 1/(4J).

Figure 26:
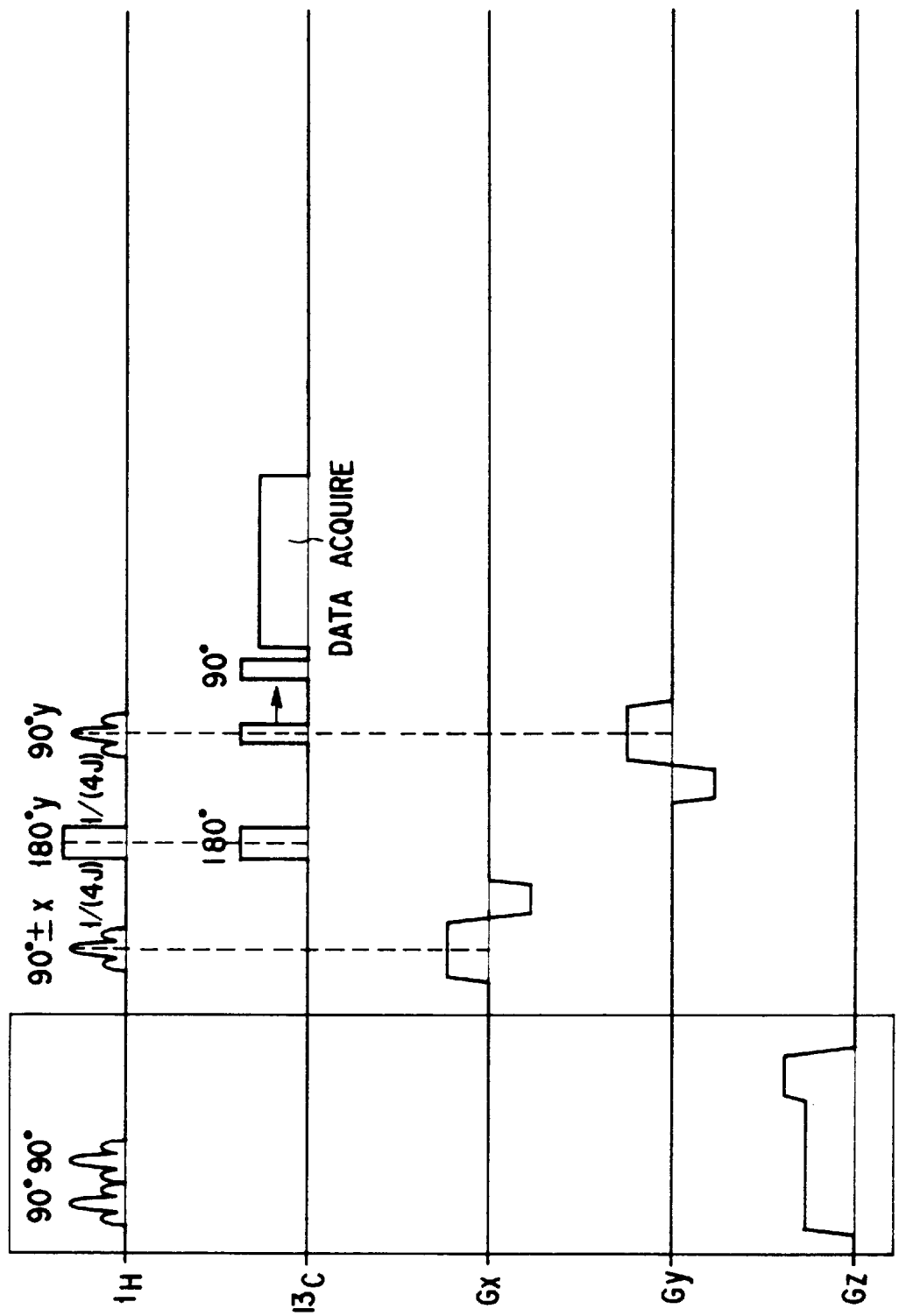
FIG. 26 shows a first improved INEPT pulse sequence.

FIG. 26 shows a first improved INEPT pulse sequence according to the present embodiment. Selective saturation pulses are used as prepulses for the INEPT pulse sequence, which achieve the localization of one axis. Slice selective pulses achieve the localization of the two other axes.

First, spins outside a region of interest are sufficiently dephased by the selective saturation pulses and brought into pseudo saturation. In principle, saturated spins produce no signal. This will achieves the localization of, for example, the Z axis.

After that, the improved INEPT pulse sequence is carried out. A first 90° ±x($^1$H) pulse for $^1$H is produced as a slice selective pulse simultaneously with a gradient magnetic field pulse Gx. This will provide the localization of the X axis.

A second 180° y($^1$H) pulse and a first 180° ($^{13}$C) pulse for $^{13}$C are produced simultaneously after a lapse of 1/(4J) from the time the 90° ±x($^1$H) pulse is produced.

After a lapse of 1/(4J) from the first 180° ($^{13}$C) pulse for $^{13}$C, a third 90° y($^1$H) pulse for $^1$H is produced as a slice selective pulse simultaneously with a gradient magnetic field pulse Gy, thereby achieving the localization of the Y axis.

A second 90° ($^{13}$C) pulse for $^{13}$C is produced after a lapse of a certain time from the time the third 90° y($^1$H) pulse for $^1$H used as a slice selective pulse associated with the Y axis is produced.

In this way, the first improved INEPT pulse sequence allows the localization of the three axes.

The phase of the first 90° ±x($^1$H) pulse for $^1$H is switched between +x and −x with each repetition of the pulse sequence. The polarity of a signal from $^{13}$C that is based on polarization transfer is inverted according to that phase switching. On the other hand, the polarity of a signal from $^{13}$C that is not based on polarization transfer is fixed irrespective of the switching. Thus, subtracting one of a signal obtained by the 90° +x($^1$H) pulse sequence and a signal obtained by the 90° −x($^1$H) pulse sequence from the other allows only the $^{13}$C signal based on polarization transfer to be extracted.

Figure 27:
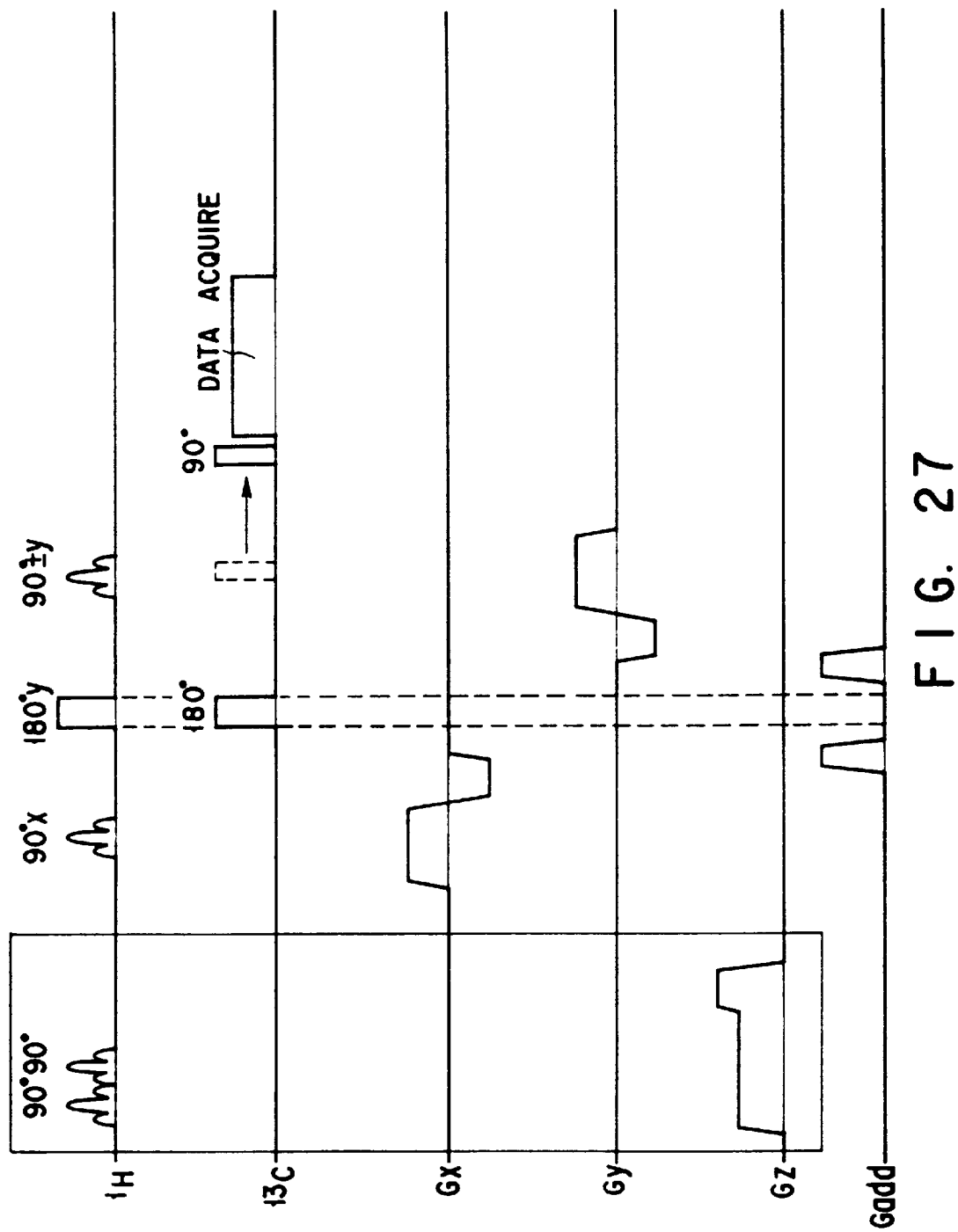
FIG. 27 shows the first improved INEPT pulse sequence which has additional Gadd pulses.

The same effect can be obtained by, instead of switching the phase of the first 90° ±x($^1$H) pulse for $^1$H, switching the phase of a 90° ±y($^1$H) pulse, used in place of the third 90° y($^1$H) pulse, with each repetition of the pulse sequence as shown in FIG. 27.

In the prior art, the localization of all the three axes is effected by the selective saturation pulses. This will causes a problem that the longitudinal magnetization of spins dephased by the selective saturation pulse for the localization of a first axis restores and provides a signal during a long interval from the time that selective saturation pulse is applied to the time the improved INEPT pulse sequence is started.

In contrast, the first improved INEPT pulse sequence is short in that interval and hence is less affected by such a problem than the prior art.

As shown in FIG. 27, the gradient magnetic field pulse Gadd is produced before and after the second 180° y($^1$H) pulse for $^1$H. In this case, the integration value of the previous gradient magnetic field pulse Gadd with respect to time and the integration value of the later gradient magnetic field pulse with respect to time are set equal to each other. The gradient magnetic field pulse Gadd may be Gx, Gy, or Gz. Such a gradient magnetic field pulse Gadd will compensate for the insufficiency of the flip angle of a 180° pulse.

Figure 28:
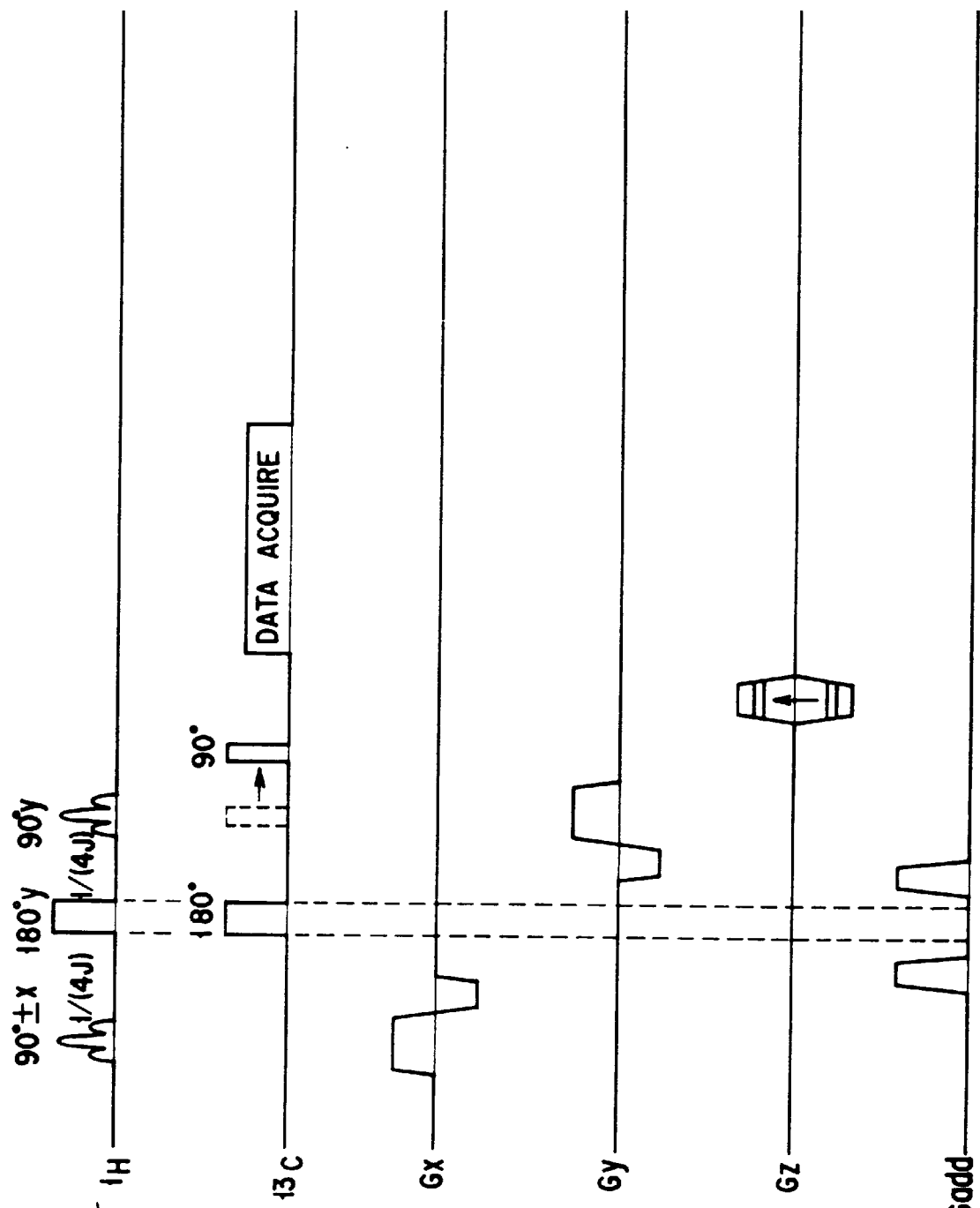
FIG. 28 shows a second improved INEPT pulse sequence.

FIG. 28 shows a second improved INEPT pulse sequence, which implements the localization of the Z axis by phase encoding, not by the selective saturation pulse. The gradient magnetic field pulse Gz is produced prior to data acquisition. The integration value of the gradient field Gz with respect to time is changed with each repetition of the pulse sequence. The gradient field Gz provides phase information to the magnetic resonance signal as spatial information. The localization of the two other axes is effected in the same way as the first improved INEPT pulse sequence.

Figure 29:
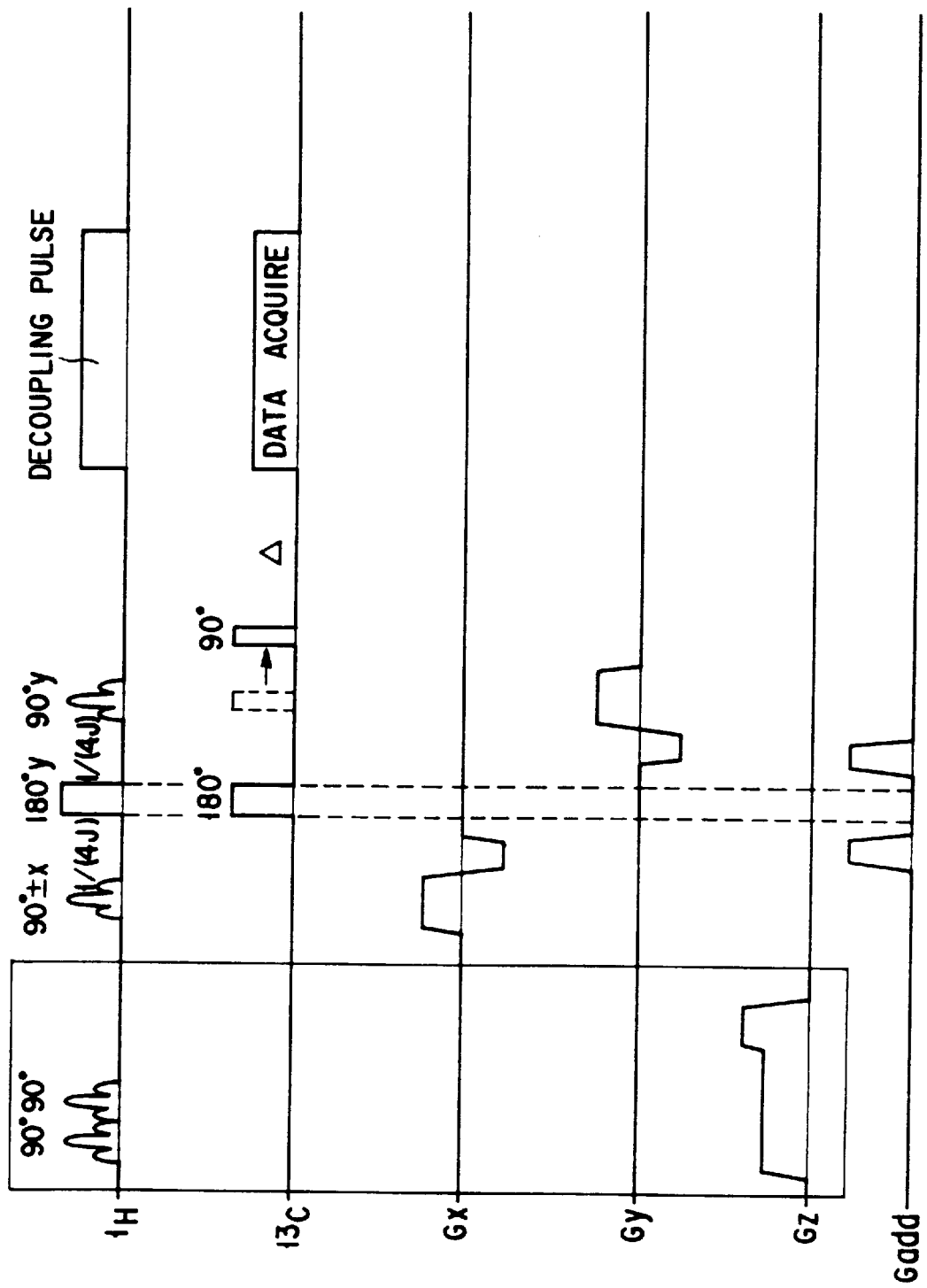
FIG. 29 shows the second improved INEPT pulse sequence which has an additional decoupling pulse.

As shown in FIGS. 29 and 30, a decoupling pulse may be produced continuously during the data acquisition time to thereby improve the signal-to-noise ratio in the magnetic resonance signal.

Figure 31A:
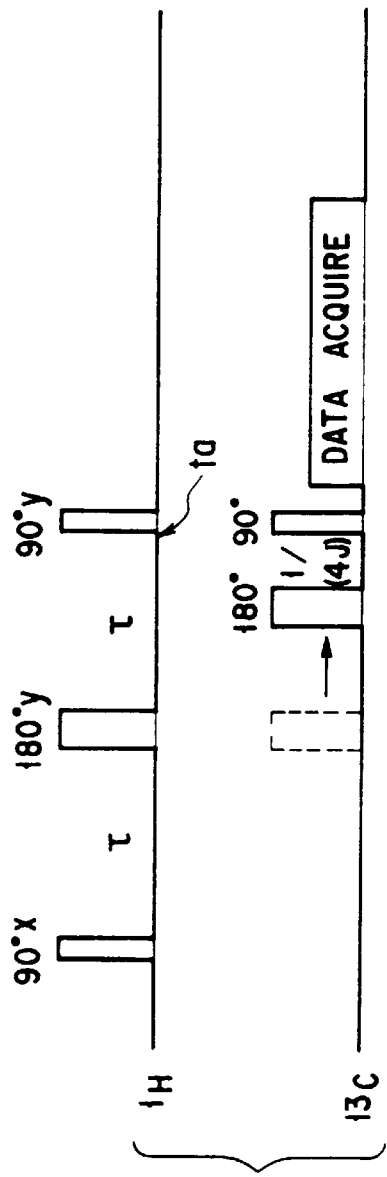
FIGS. 31A and 31B are diagrams for use in explanation of principles of localization associated with the INEPT pulse sequences.
Figure 31B:
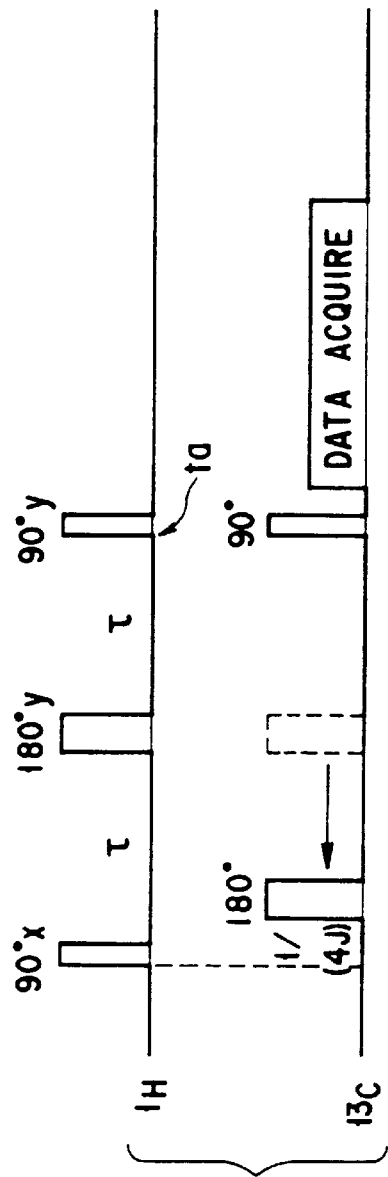

FIGS. 31A and 31B show the principles of achieving the localization of three axes using each of the three radio-frequency magnetic field pulses for $^1H$ as a slice selective pulse. Attention is paid herein to the fact that polarization transfer that is as efficient as the INEPT sequence is effected when the interval between the first 180° ($^{13}C$) pulse for $^{13}C$ and the third 90° y($^1H$) pulse for $^1H$ is 1/(4J) as shown in FIG. 31A. Also, attention is paid to the fact that efficient polarization transfer is effected when the interval between the first 90° ($^1H$) pulse for $^1H$ and the first 180° ($^{13}C$) pulse for $^{13}C$ is 1/(4J) as shown in FIG. 31B.

This allows the second 180° y($^1H$) pulse for $^1H$ to be used as a slice selective pulse without adversely affecting the flip angle of the first 180° ($^{13}C$) pulse for $^{13}C$.

FIG. 32 shows a third improved INEPT pulse sequence corresponding to the principle of FIG. 31A. In this pulse sequence, a 90° ±x($^1H$) pulse, a 180° y($^1H$) pulse and a 90° y($^1H$) pulse are sequentially produced for $^1H$, while a 180° ($^{13}C$) pulse and a 90° ($^{13}C$) pulse are sequentially produced for $^{13}C$.

The interval between the first 90° ±x($^1H$) pulse and the first 180° ($^{13}C$) pulse is set to 1/(4J). The interval τ between the first 90° ±x($^1H$) pulse and the second 180° y($^1H$) pulse is set longer than 1/(4J). The interval between the second 180° y($^1H$) pulse and the third 90° y($^1H$) pulse is also set to τ.

The second 180° y($^1H$) pulse and the first 180° ($^{13}C$) pulse are not produced simultaneously. That is, the second 180° y($^1H$) pulse is produced at a time different from the time when the first 180° ($^{13}C$) pulse is produced, specifically after the 180° ($^{13}C$) pulse.

The third 90° y($^1H$) pulse and the second 90° ($^{13}C$) pulse are not produced simultaneously. That is, the third 90° y($^1H$) pulse is produced at a time different from the time when the second 90° ($^{13}C$) pulse is produced, specifically before the 90° ($^{13}C$) pulse.

The three radio-frequency magnetic field pulses for $^1H$, the 90° ±x($^1H$) pulse, the 180° y($^1H$) pulse and the 90° y($^1H$) pulse, are produced as slice selective pulses associated with the three different axes simultaneously with the gradient magnetic field pulses Gx, Gy, and Gz, respectively.

The localization of the three axes is effected by using each of the three radio-frequency magnetic field pulses for $^1H$ as a slice selective pulse associated with a different axis. Each of the three slice selective pulses is not produced simultaneously with any one of the radio-frequency magnetic field pulses for $^{13}C$, preventing the flip angles of these pulses for $^{13}C$ from becoming insufficient.

The interval between the 90° x($^1H$) pulse and the 180° ($^{13}C$) pulse may be changed to an odd multiple of 1/(4J). Note that with $CH_3$, J=125 Hz, and with $CH_2$, J=160 Hz. That is, J varies with the coupling state. If, therefore, the interval is set relatively long, say, 3/(4J) or 5/(4J), then the difference between the optimum interval for $CH_2$ and the optimum interval for $CH_3$ becomes large, reducing the polarization transfer efficiency. For this reason, it may be said that the interval is best set as short as possible, i.e., 1/(4J), from a viewpoint of polarization transfer efficiency.

However, with J=160 Hz, 1/(4J)=1.6 ms. It is very difficult for the widely-used apparatus's power supply system to, immediately after the slice-selection gradient field GX, produce a refocusing gradient magnetic field pulse (shown dotted in FIG. 32) corresponding to that gradient field Gx within the interval of 1.6 ms.

As shown in FIG. 32, the rephasing gradient field is produced polarity-inverted between the second 180° y($^1H$) pulse and the third 90° y($^1H$) pulse, not immediately after the slice-selection gradient field Gx. This allows the widely-used apparatus to set up the pulse sequence of FIG. 32 under the condition that 1/(4J) 1.6 ms.

The principles illustrated in FIGS. 31A and 31B are also useful for the case where slice selection is not made. In order to remove the effect of insufficiency of a 180° pulse, gradient magnetic field pulses whose integration values with respect time are equal to each other are usually applied before and after a $^1H$ 180° pulse. With the conventional sequence as shown in FIG. 1, however, it is difficult for the widely-used apparatus to apply these gradient magnetic field pulses because the interval between $^1H$ RF pulses is short as described previously. However, the use of the methods illustrated in FIGS. 31A and 31B allows the gradient field pulses for removing the effect of insufficiency of a 180° pulse to be applied because the $^1H$ pulse interval can be set arbitrarily.

Further, such setting of the time of producing the rephasing gradient field during an interval between the second and third pulses for $^1H$, not immediately after the slice-selection gradient field also provides the following advantage. That is, since it is not required to produce the rephasing gradient field during the interval of 1.6 ms, it is allowed to produce the slice selective pulse with a width of 3 ms by making much use of that interval. Therefore, a long RF pulse, such as adiabatic RF pulse, can be used to improve the characterization of slice profile.

As shown in FIG. 33, gradient fields Gadd for compensating for insufficiency of the 180° pulse flip angle should be added to the third improved INEPT pulse sequence as well. However, care must be taken to ensure that the gradient fields Gadd do not overlap in time with the radio-frequency magnetic fields in order to avoid degradation of the slice selective characteristics.

Figure 34:
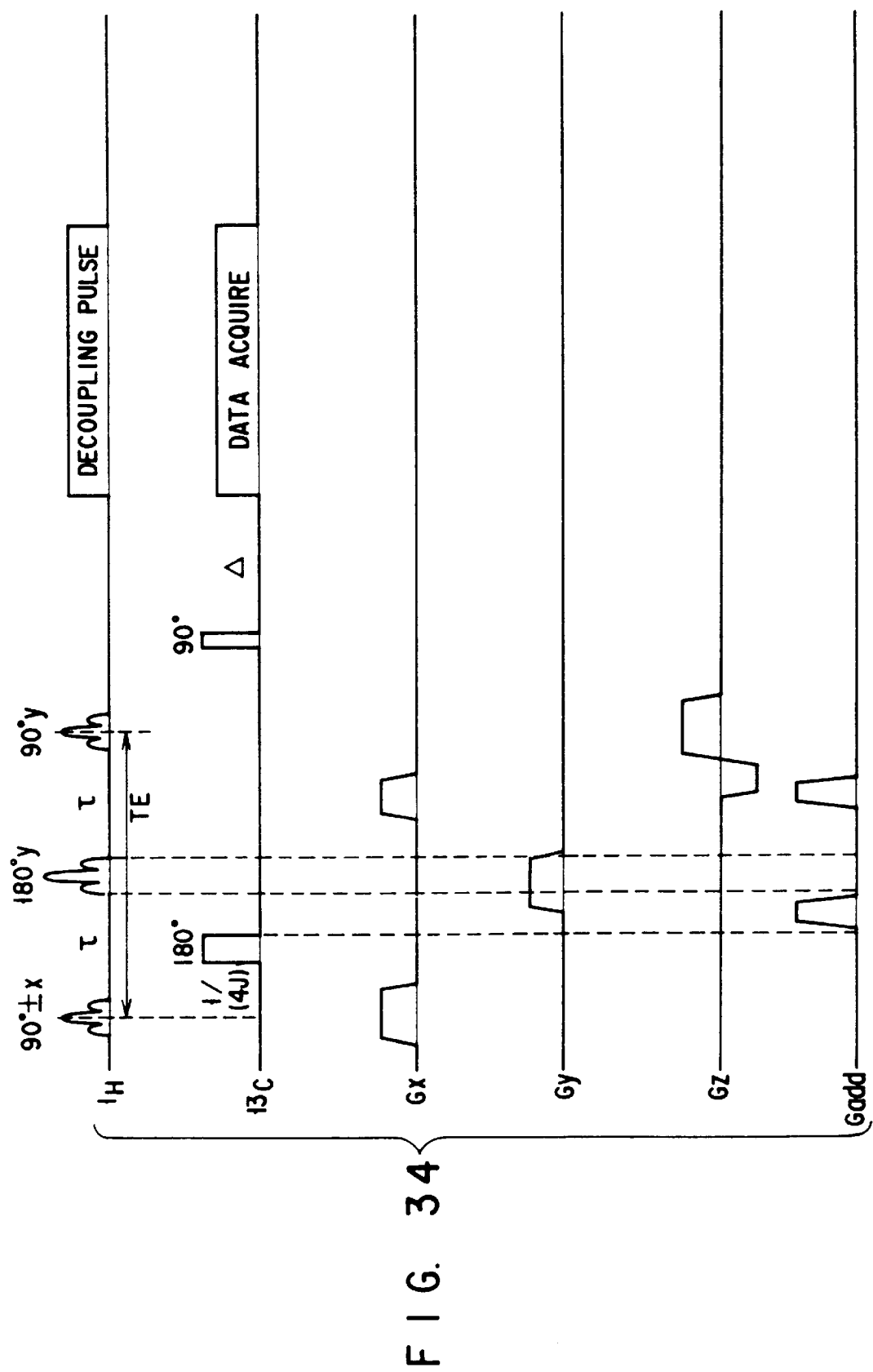
Figure 35:
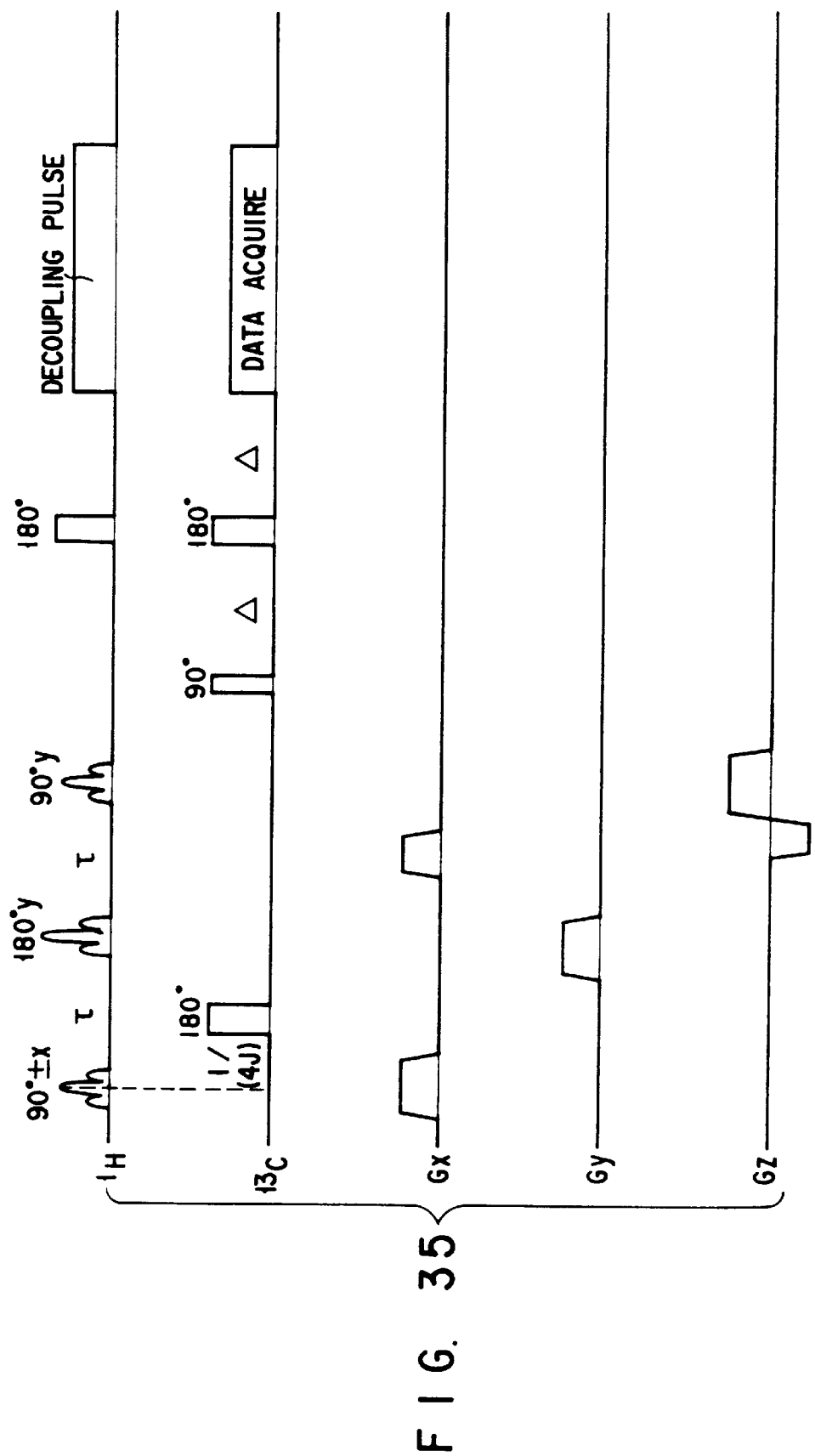

As shown in FIGS. 34, 35 and 36, the third improved INEPT pulse sequence may be added with a decoupling pulse.

FIG. 37 shows a fourth improved INEPT pulse sequence corresponding to the principle illustrated in FIG. 31B. The interval between the first 180° ($^{13}C$) pulse and the third 90° y($^1H$) pulse is set to 1/(4J). The interval between the first 90° ±x($^1H$) pulse and the second 180° y($^1H$) pulse is set to τ longer than 1/(4J). The interval between the second 180° y($^1H$) pulse and the third 90° y($^1H$) pulse is also set to τ.

The second 180° y($^1$H) pulse and the first 180° ($^{13}$C) pulse are not produced simultaneously as in the third INEPT pulse sequence. That is, the second 180° y($^1$H) pulse is produced at a time different from the time when the first 180° ($^{13}$C) pulse is produced, specifically after the 180° ($^{13}$C) pulse.

The third 90° y($^1$H) pulse and the second 90° ($^{13}$C) pulse are not produced simultaneously. That is, the third 90° y($^1$H) pulse is produced at a time different from the time when the second 90° ($^{13}$C) pulse is produced, specifically before the 90° ($^{13}$C) pulse.

The three radio-frequency magnetic field pulses for $^1$H, the 90° ($^1$H) pulse, the 180° y($^1$H) pulse and the 90° y(H) pulse, are applied as slice selective pulses associated with the three different axes simultaneously with the gradient magnetic field pulses Gx, Gy, and Gz, respectively.

The localization of the three axes is effected by using each of the three radio-frequency magnetic field pulses for $^1$H as a slice selective pulse associated with a different axis. Each of the three slice selective pulses is not applied simultaneously with any one of the radio-frequency magnetic field pulses for $^{13}$C, preventing the flip angles of these pulses for $^{13}$C from becoming insufficient. Further, the interval between the 90° x($^1$H) and the second 180° x($^1$H) pulse is set longer than 1/(4J), allowing the widely-used apparatus to produce the refocusing gradient magnetic field pulse immediately after the slice selective gradient field Gx. In addition, the first 180° x($^1$H) pulse can be produced in a sufficiently long width, which improves the precision of the localization.

Figure 38:
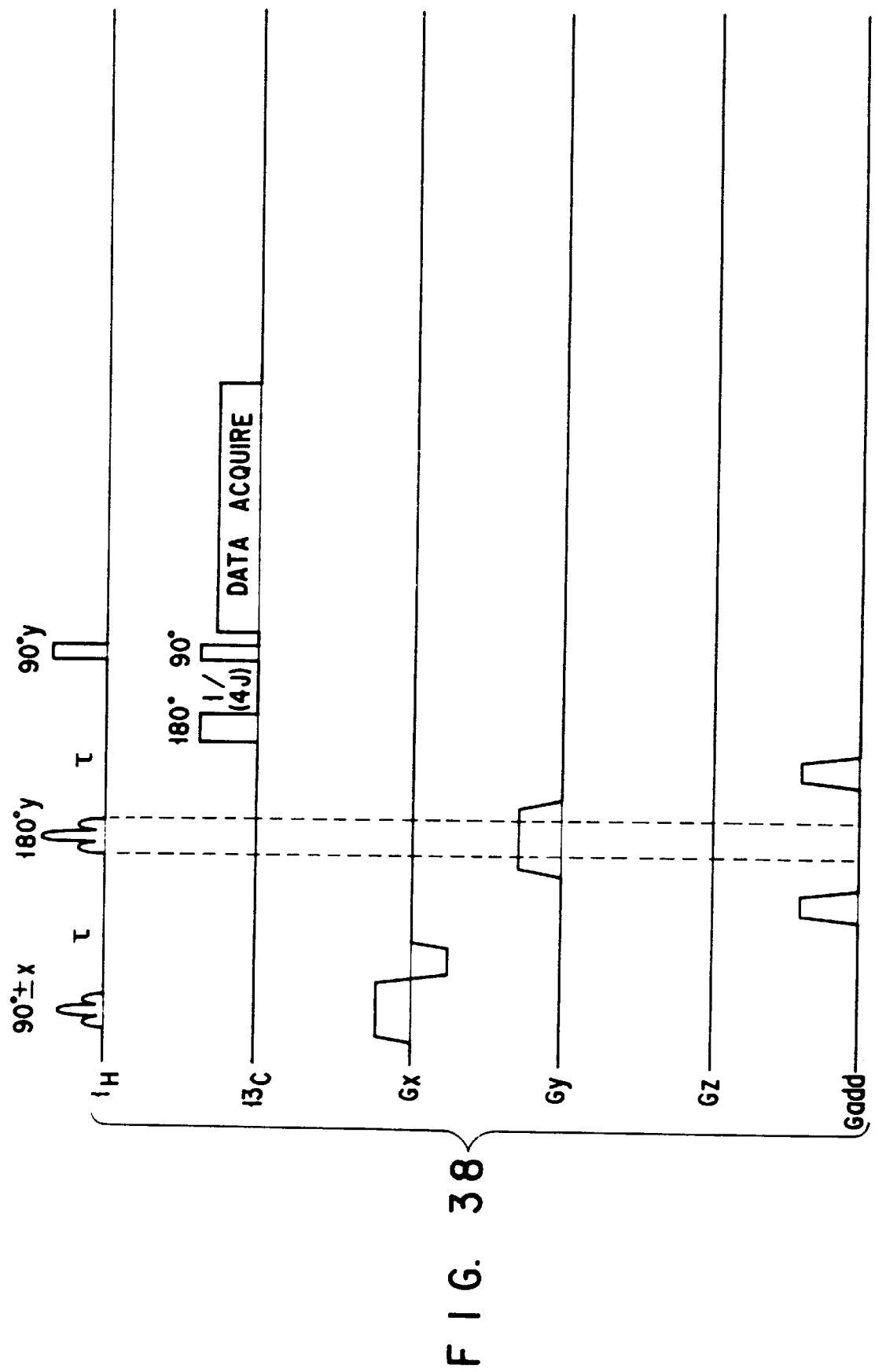
FIG. 38 shows the fourth improved INEPT pulse sequence which has additional Gadd pulses.

As with the third INEPT pulse sequence, in the fourth INEPT pulse sequence as well, gradient magnetic field pulses Gadd should be added, as shown in FIG. 38, to compensate for insufficiency of the 180° pulse flip angle. In addition, a decoupling pulse should be applied during the data acquisition interval.

Figure 39:
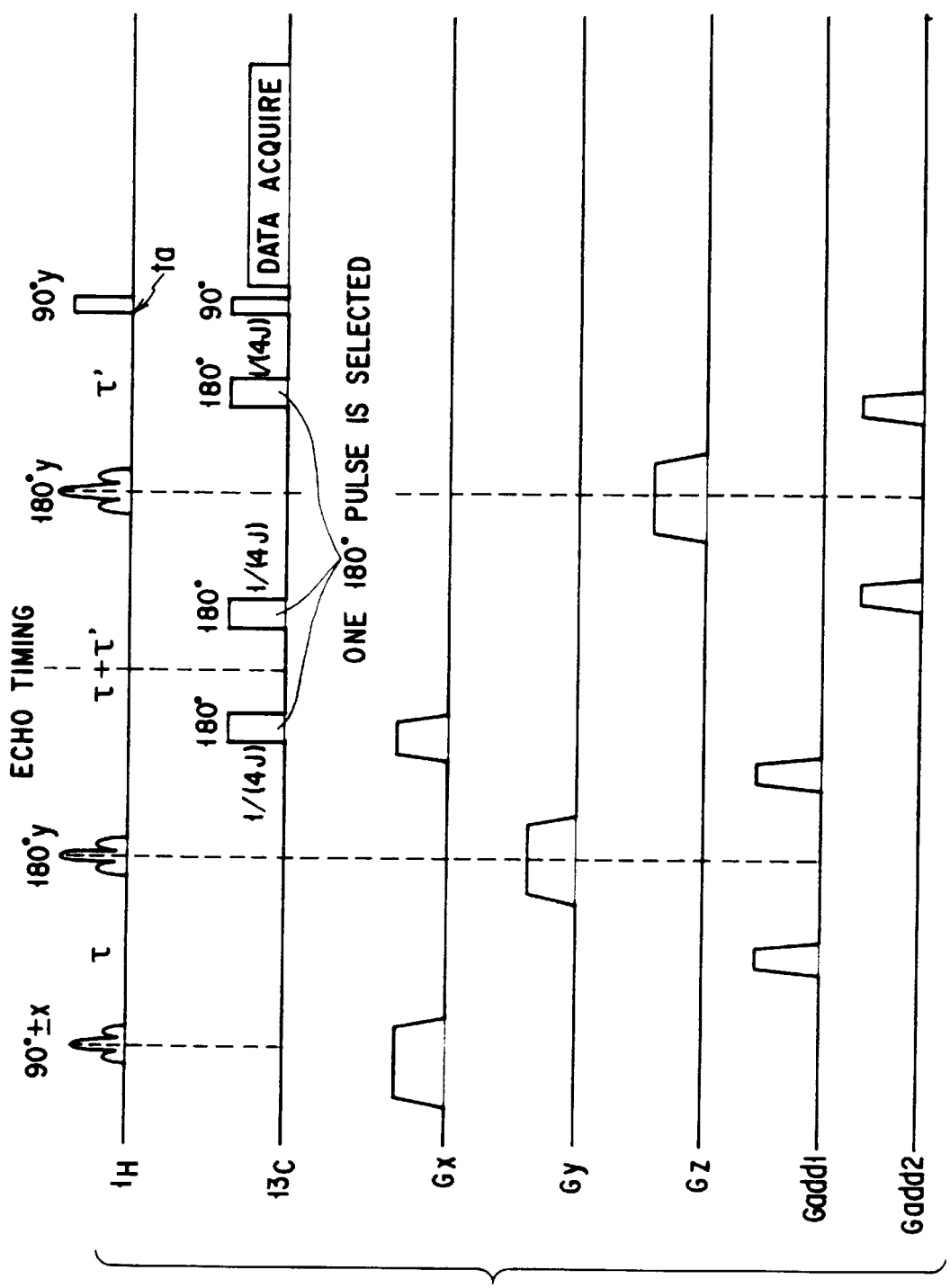
FIG. 39 shows a fifth improved INEPT pulse sequence.

FIG. 39 shows a fifth improved INEPT pulse sequence, in which a 90° ±x($^1$H) pulse, a 180° y($^1$H) pulse, a 180° y($^1$H) pulse and a 90° y($^1$H) pulse are sequentially applied for $^1$H. By applying the third 180° y($^1$H) pulse after a lapse of τ' from the echo timing that occurs after a delay of τ from the second 180° y($^1$H) pulse and applying the fourth 90° y($^1$H) pulse after a lapse of τ' from the third pulse, the spin state required of polarization transfer can be secured at time ta immediately before the fourth pulse even with the third pulse added.

The fifth improved INEPT pulse sequence uses the added third 180° y($^1$H) pulse as a slice selective pulse for the third axis.

The first 180° ($^{13}$C) pulse is applied during the interval between the second 180° y($^1$H) pulse and the echo time, the interval between the echo time and the third 180° y($^1$H) pulse, or the interval between the third pulse and the fourth 90° y($^1$H) pulse.

Second Embodiment

The second embodiment is directed to improvements in the DEPT pulse sequence. A magnetic resonance diagnostic apparatus therefor is the same in arrangement as that shown in FIG. 25 and description thereof is omitted.

FIGS. 40 and 41 illustrate the principles of the localization in the DEPT pulse sequence. According to these principles, the polarization transfer is effected when the time interval between the first 90° ($^{13}$C) pulse for $^{13}$C and the third θ ±($^1$H) pulse for $^1$H is set to 1/(4J) as shown in FIGS. 40 and 41. In addition, as shown in FIG. 41, if the second 180° ($^{13}$C) for $^{13}$C is at the center of the interval from the first 90° ($^{13}$C) pulse for $^{13}$C to the start of data acquisition, then it is not required that the interval between the first 90° ($^{13}$C) pulse and the second 180° ($^{13}$C) pulse be 1/(2J). These principles allow the second and third radio-frequency magnetic field pulses for $^1$H to be used as slice selective pulses without making the flip angles of the first and second pulses for $^{13}$C insufficient.

Figure 42:
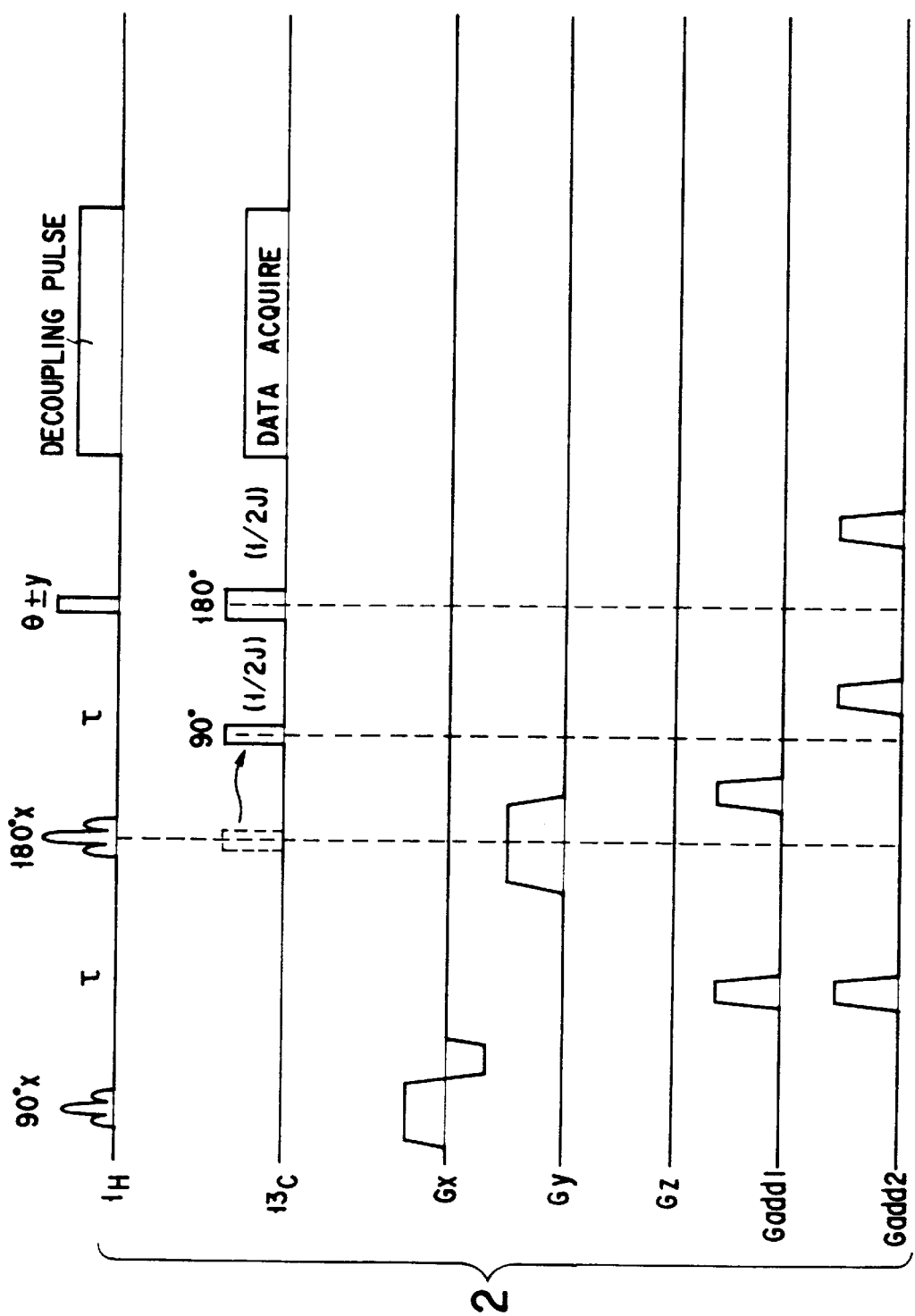
FIG. 42 shows a first improved DEPT pulse sequence corresponding to the principle of FIG. 40.

FIG. 42 shows a first improved DEPT pulse sequence corresponding to the principle illustrated in FIG. 40. In this pulse sequence, a 90° x($^1$H) pulse, a 180° x($^1$H) pulse and a θ° y($^1$H) pulse are sequentially applied for $^1$H, while a 90° ($^{13}$C) pulse and a 180° ($^{13}$C) pulse are sequentially applied for $^{13}$C.

The interval between the first 90° ±($^{13}$C) pulse and the third θ° ±y($^1$H) pulse is set to 1/(2J).

The interval between the first 90° x($^1$H) pulse and the second 180° x($^1$H) pulse and the interval between the second 180° x($^1$H) pulse and the third θ° y($^1$H) pulse are each set to τ longer than 1/(2J).

The second 180° x($^1$H) pulse for $^1$H and the first 90° ($^{13}$C) pulse for C are not applied simultaneously. That is, the second 90° x($^1$H) pulse is applied at a time different from the time when the first 90° ($^{13}$C) pulse is applied, specifically before that 90° ($^{13}$C) pulse.

The two first and second radio-frequency magnetic field pulses for $^1$H, the 90° x($^1$H) pulse and the 180° x($^1$H) pulse, are applied as slice selective pulses associated with the two different axes simultaneously with the gradient magnetic field pulses Gx and Gy, respectively.

The localization of the two axes is achieved by using each of the radio-frequency magnetic field pulses for $^1$H as a slice selective pulse associated with a different axis. Each of the two slice selective pulses is not applied simultaneously with any one of the radio-frequency magnetic field pulses for $^{13}$C, preventing the flip angles of these pulses for $^{13}$C from becoming insufficient. The localization of three axes is effected by adding a selective saturation pulse for one axis to the pulse sequence of FIG. 42.

Gradient magnetic field pulses Gadd1 or Gadd2 for compensating for insufficiency of the flip angle of the 180° pulse are applied for the 180° pulse. The field pulse Gadd1 is applied during the interval between the first 90° x($^1$H) pulse and the second 180° x($^1$H) pulse and the interval between the second 180° x($^1$H) pulse and the third θ° ±y($^1$H) pulse with an equal integration value with respect to time. The field pulse Gadd2 is applied during the interval between the first 90° x($^1$H) pulse and the second 180° x($^1$H) pulse, the interval between the first 90° ($^{13}$C) pulse and the second 180° ($^{13}$C) pulse, and the interval between the second 180° ($^{13}$C) pulse and the start of data acquisition with an equal time integration value.

In FIG. 42, the phase of the last θ ±y($^1$H) is switched between +y and −y with each repetition of the pulse sequence. The difference between magnetic resonance signals for two successive pulse sequences will extract only signals from $^{13}$C.

Figure 43:
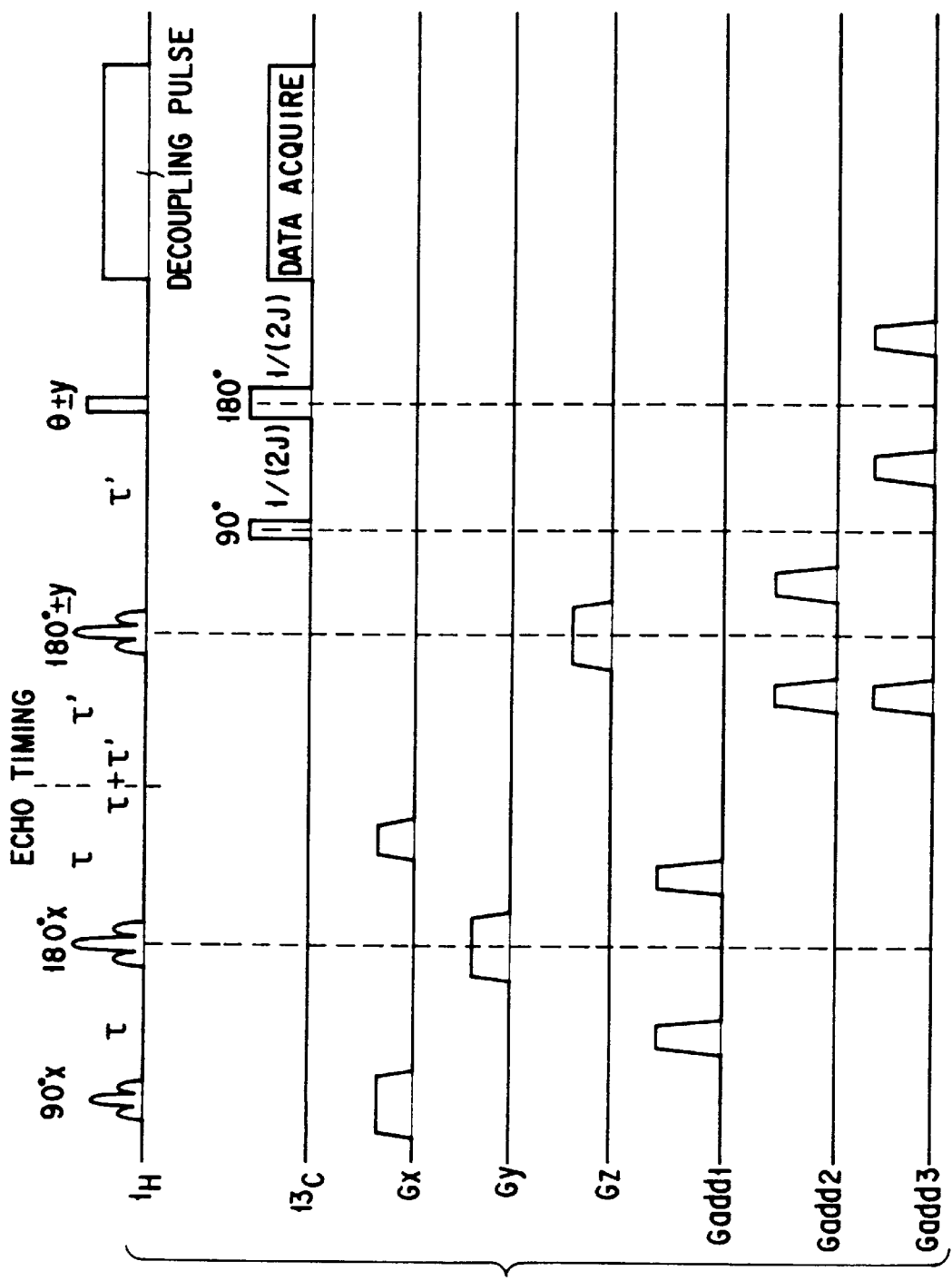
FIG. 43 shows a second improved DEPT pulse sequence.

FIG. 43 shows a DEPT pulse sequence that is improved so as to achieve the localization of all the three axes by using radio-frequency magnetic field pulses for $^1$H as slice selective pulses. In this pulse sequence, a 180° ±y($^1$H) pulse is added to the interval between the 180° x($^1$H) pulse and the θ Y($^1$H) pulse. This additional pulse is applied at the center of the interval 2τ 'between the echo timing associated with the second 180° x($^1$H) pulse and the last θ Y($^1$H) pulse. The phase of the added pulse is switched between +y and −y with each repetition of the pulse sequence.

Like the first and second radio-frequency magnetic field pulses for $^1$H, the additional pulse is used as a slice selective pulse. The first, second and third radio-frequency magnetic field pulses for $^1$H are used as slice selective pulses for the three different axes. Thus, the localization of three axes is achieved.

The gradient magnetic field pulses Gadd1, Gadd2 or Gadd3 for compensating for insufficiency of the 180° pulse flip angle are applied for the corresponding 180° pulse. The gradient field pulses Gadd1 are applied during the interval between the first 90° x($^1$H) and the second 180° x($^1$H) and the interval between the second 180° x($^1$H) pulse and the echo timing to have an equal time integration value. The gradient field pulses Gadd2 are produced in the interval between the echo timing and the added 180° x($^1$H) pulse and the first 90° ($^{13}$C) pulse for $^{13}$C to have an equal integration value with respect to time. The pulses Gadd3 are applied during the interval between the first 90° ($^{13}$C) pulse and the second 180° ($^{13}$C) pulse and the interval between the second 180° ($^{13}$C) pulse and the start of data acquisition with an equal integration value with respect to time.

FIG. 44 shows a second improved DEPT pulse sequence set up according to the principle of FIG. 41. The second 180° ($^{13}$C) pulse for $^{13}$C is applied at the center of the interval between the first 180° ($^{13}$C) pulse and the start of data acquisition.

The interval between the first 90° ($^{13}$C) pulse for $^{13}$C and the third θ° ±y($^1$H) pulse for $^1$H is set to 1/(2J). The interval between the first 90° ($^{13}$C) pulse and the second 180° ($^{13}$C) pulse for $^{13}$C is set to 1/(2J)+τc longer than 1/(2J). The interval between the second 180° ($^{13}$C) pulse and the start of data acquisition is also set to 1/(2J)+τc.

Thus, the third θ° ±y($^1$H) pulse for $^1$H is not applied simultaneously with the second 180° ($^{13}$C) pulse for $^{13}$C. The third pulse is applied before the second pulse for $^{13}$C.

Like the first and second radio-frequency magnetic field pulses for $^1$H, the third pulse for $^1$H is used as a slice selective pulse. The first, second and third radio-frequency magnetic field pulses for $^1$H are used as slice selective pulses associated with the three different axes. Thereby, the localization of the three axes is achieved.

In order to rephase the $^{13}$C spins, it is required to apply a gradient magnetic field pulse Gz which has the same time integration value as the gradient magnetic field pulse Gz applied simultaneously with the third pulse for $^1$H during the interval between the second pulse for $^{13}$C and the start of data acquisition.

In the second improved DEPT pulse sequence, as shown in FIG. 45, gradient magnetic field pulses Gadd1 or Gadd2 for compensating for insufficiency of the flip angle of a 180° pulse should be applied for that 180° pulse. The gradient fields Gadd1 are applied during the interval between the first and second pulses for $^1$H and the interval between the second pulse for $^1$H and the first pulse for $^{13}$C to have an equal integration value with respect to time. The gradient fields Gadd2 are applied during the interval between the first and second pulses for $^1$H, the interval between the first pulse for $^{13}$C and the third pulse for $^1$H, and the interval between the second pulse for $^{13}$C and the start of data acquisition to have an equal integration value with respect to time.

Figure 46:
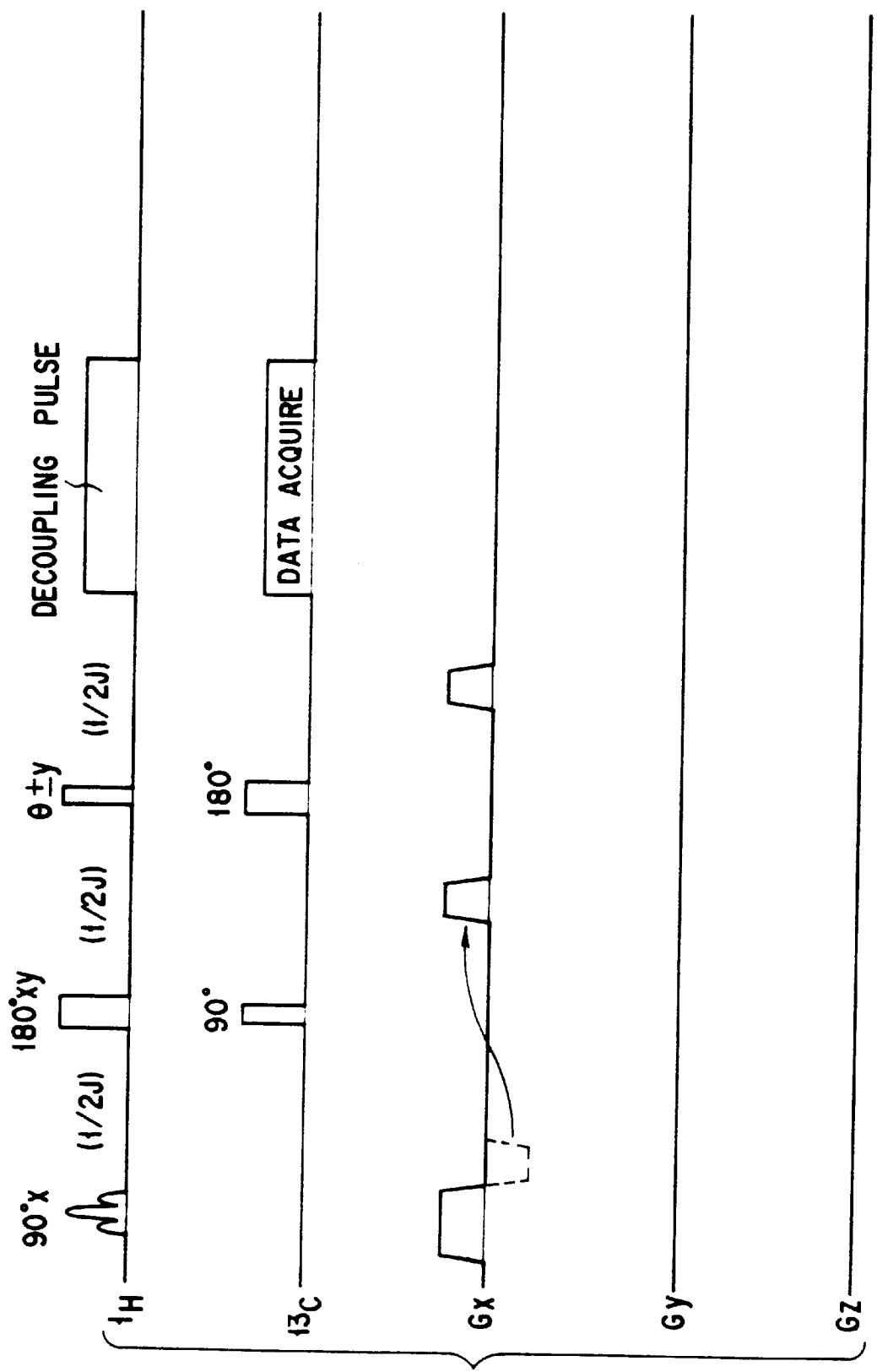
FIG. 46 shows a third improved DEPT pulse sequence.
Figure 47A:
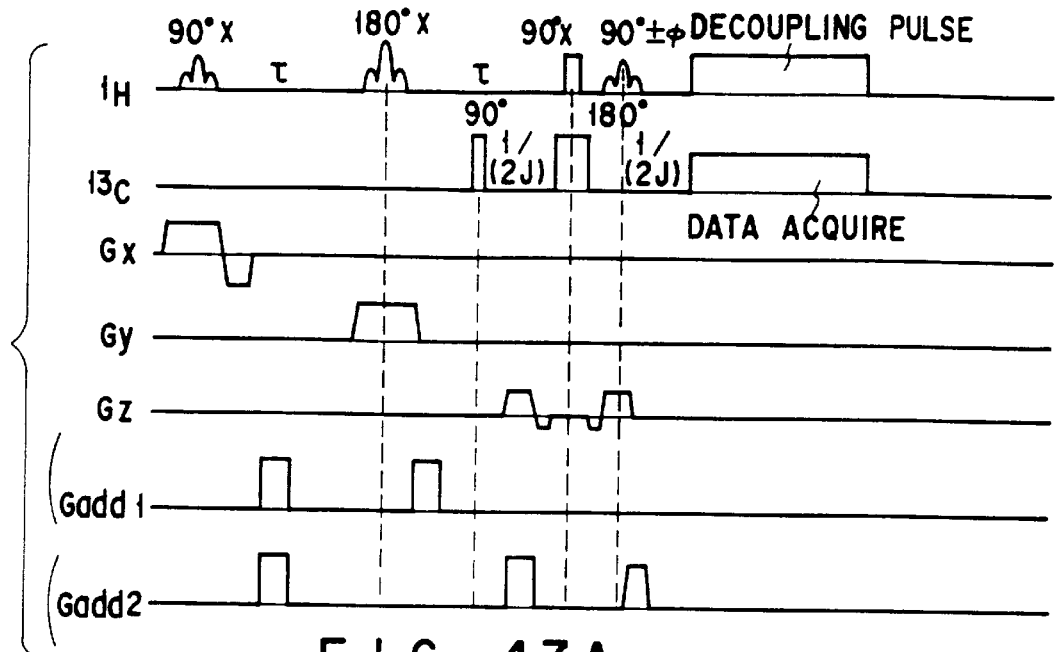
Figure 47B:
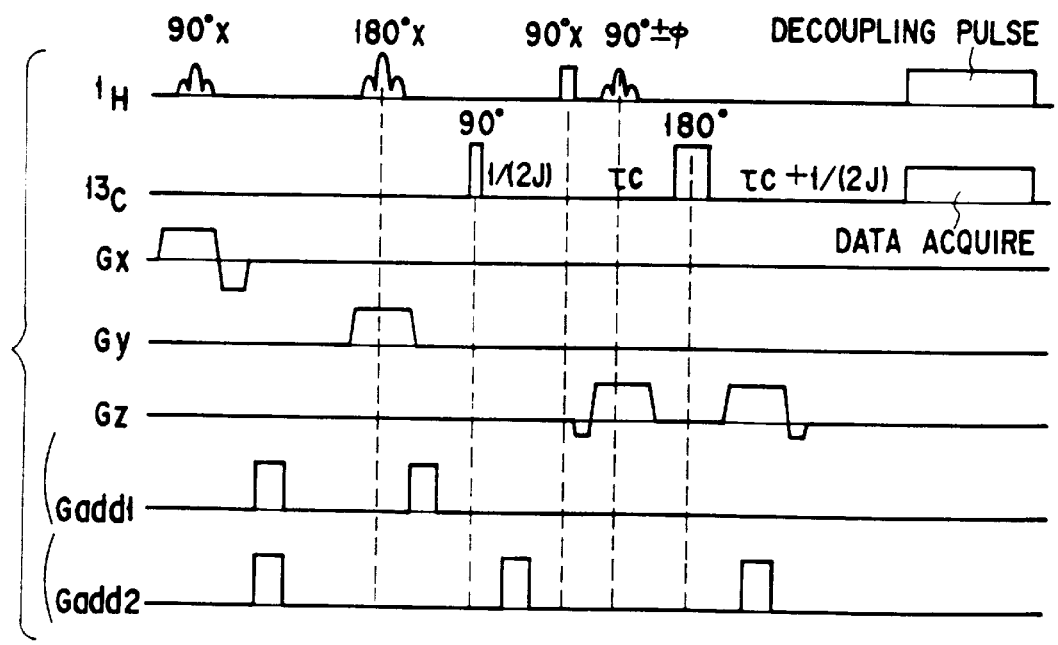

FIG. 46 shows a third improved DEPT pulse sequence. In this pulse sequence, only the first 90° x($^1$H) pulse for $^1$H is used as a slice selective pulse to effect the localization of one axis. The interval between the first pulse and the second 180° y($^1$H) pulse is set to as short as 1/(2J). It is difficult for the widely-used apparatus power supply to produce a rephasing gradient magnetic field pulse (shown dotted) for the slice gradient magnetic field pulse Gx during that short interval. This difficulty is solved by producing the rephasing gradient magnetic field pulse in the interval between the second 180° y($^1$H) pulse and the third θ° y($^1$H).

As shown in FIGS. 47A, 47B, 48A and 48B, the POMM method published by J. M. Bulsing et al in the Journal of Magnetic Resonance, vol. 56, p. 167, (1984) may be used combined with the first and second improved DEPT pulse sequences. A 90° ±φ ($^1$H) pulse is added before or after the last 90° x($^1$H) pulse for $^1$H, which is used as a slice selective pulse along with the first and second pulses for $^1$H. The first and second pulses and the 90° ±φ ($^1$H) pulse are applied as slice selective pulses associated with the three different axes. Thereby, the localization of the three axes is achieved. The phase of the 90° ±φ ($^1$H) pulse is inverted with respect to the φ axis with each repetition of the pulse sequence. The difference between magnetic resonance signals corresponding to two successive pulse sequences will eliminate unwanted signals resulting from the addition of the 90° ±φ ($^1$H) pulse.

Figure 49:
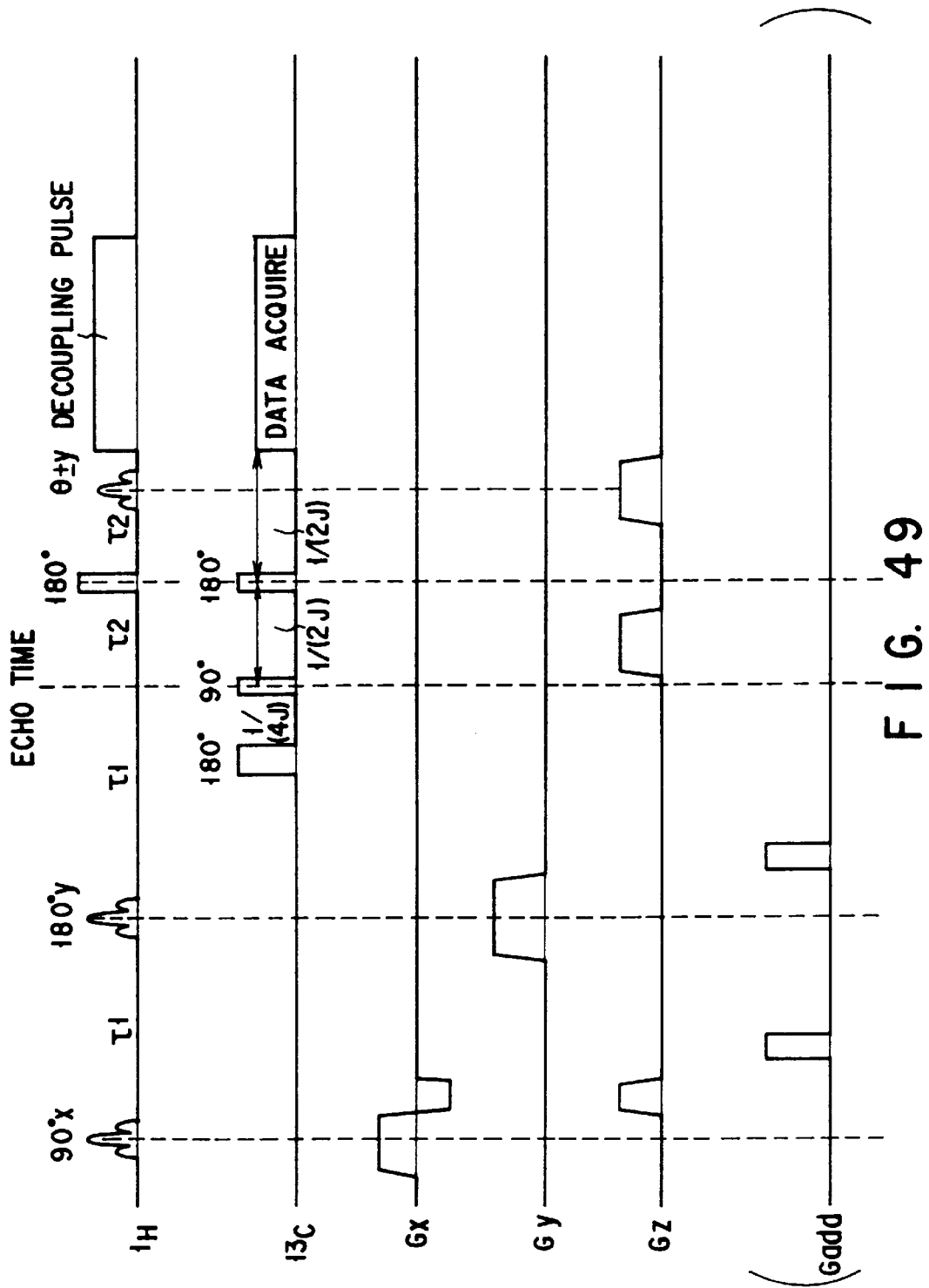
FIG. 49 shows a fourth improved DEPT pulse sequence.

The above-described improved DEPT sequence may be modified as shown in FIG. 49.

Third Embodiment

The third embodiment relates to improvements in the HSQC (Heteronuclear Single Quantum Coherence) method which is one of the $^1$H observation methods for observing signals from $^1$H. For $^1$H observation, the axial localization and the removal of water signals are important. The third embodiment and a fifth embodiment to be described later are intended to achieve the localization of axes and remove water signals.

FIG. 50 shows an arrangement of a magnetic resonance diagnostic apparatus according to the third embodiment. In this figure, like reference numerals are used to denote corresponding parts to those in FIG. 25 and description thereof is omitted. A $^1$H receiver 16 is added to the arrangement of FIG. 25 in order to receive signals from $^1$H spins through the probe 4.

The basic HSQC sequence comprises a preceding INEPT section, an intermediate single-quantum coherence section, and a succeeding reverse-INEPT section.

In the INEPT section, a 90° x($^1$H) pulse, a 180° y($^1$H) pulse and a 90° y($^1$H) pulse are sequentially applied for $^1$H, while a 180° ($^{13}$C) pulse and a 90° ($^{13}$C) pulse are sequentially applied for $^{13}$C. The interval between the first 90° x($^1$H) pulse for $^1$H and the first 180° ($^{13}$C) pulse for $^{13}$C is set to 1/(4J). The interval between the first 180° ($^{13}$C) pulse and the and the third 90° y($^1$H) pulse for $^1$H are also set to 1/(4J).

In the reverse-INEPT section, a 90° ($^1$H) pulse and a 180° ($^1$H) pulse are sequentially applied for $^1$H, while a 90° ($^{13}$C) pulse and a 180° ($^{13}$C) pulse are sequentially applied for $^{13}$C. The interval between the 90° ($^{13}$C) pulse for $^{13}$C and the 180° ($^1$H) pulse for $^1$H is set to 1/(4J). The 180 ($^1$H) pulse for $^1$H is produced at the center of the interval between the 90° ($^1$H) pulse and the start of data acquisition.

In the single-quantum coherence section, a 180° ($^1$H) pulse is applied during an interval between the INEPT pulse sequence and the reverse-INEPT pulse sequence.

Figure 51:
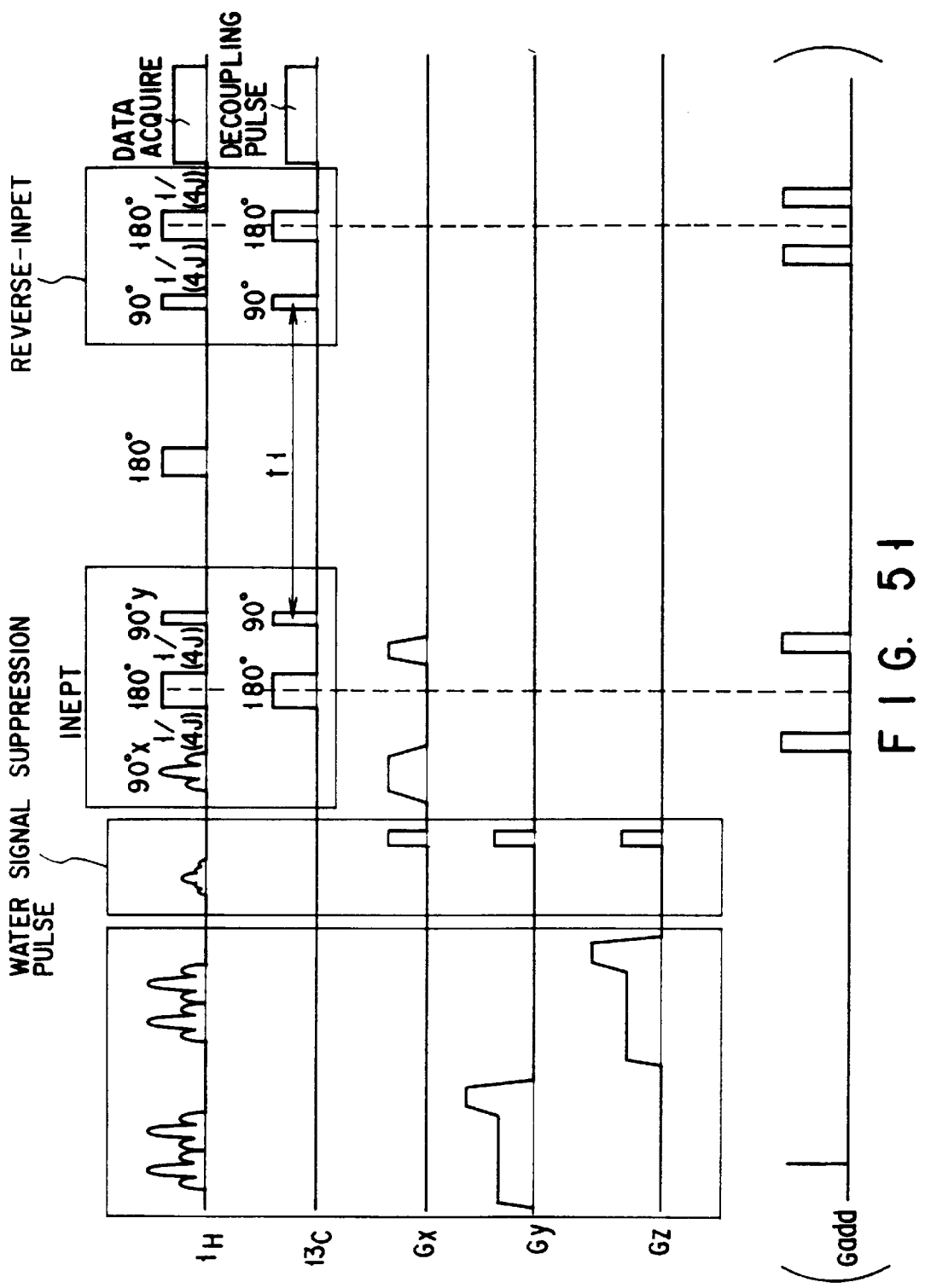
FIG. 51 shows a first improved HSQC pulse sequence.

FIG. 51 shows a first improved HSQC pulse sequence. Prior to the HSQC sequence, the localization of two axes (Gy and Gz) is achieved by selective saturation pulses. The first 90° x($^1$H) pulse for $^1$H is used as a slice selective pulse for localizing the remaining axis (Gx). Thus, the localization of three axes is achieved.

Water signals are removed by a water signal suppression pulse before the improved HSQC sequence is carried out. The water suppression pulse, which is a radio-frequency magnetic field pulse, selectively excites only water spins. The gradient magnetic field pulses Gx, Gy and Gz along the three axes sufficiently dephase only excited water spins, thereby substantially suppressing the generation of signals from water spins.

Figure 52:
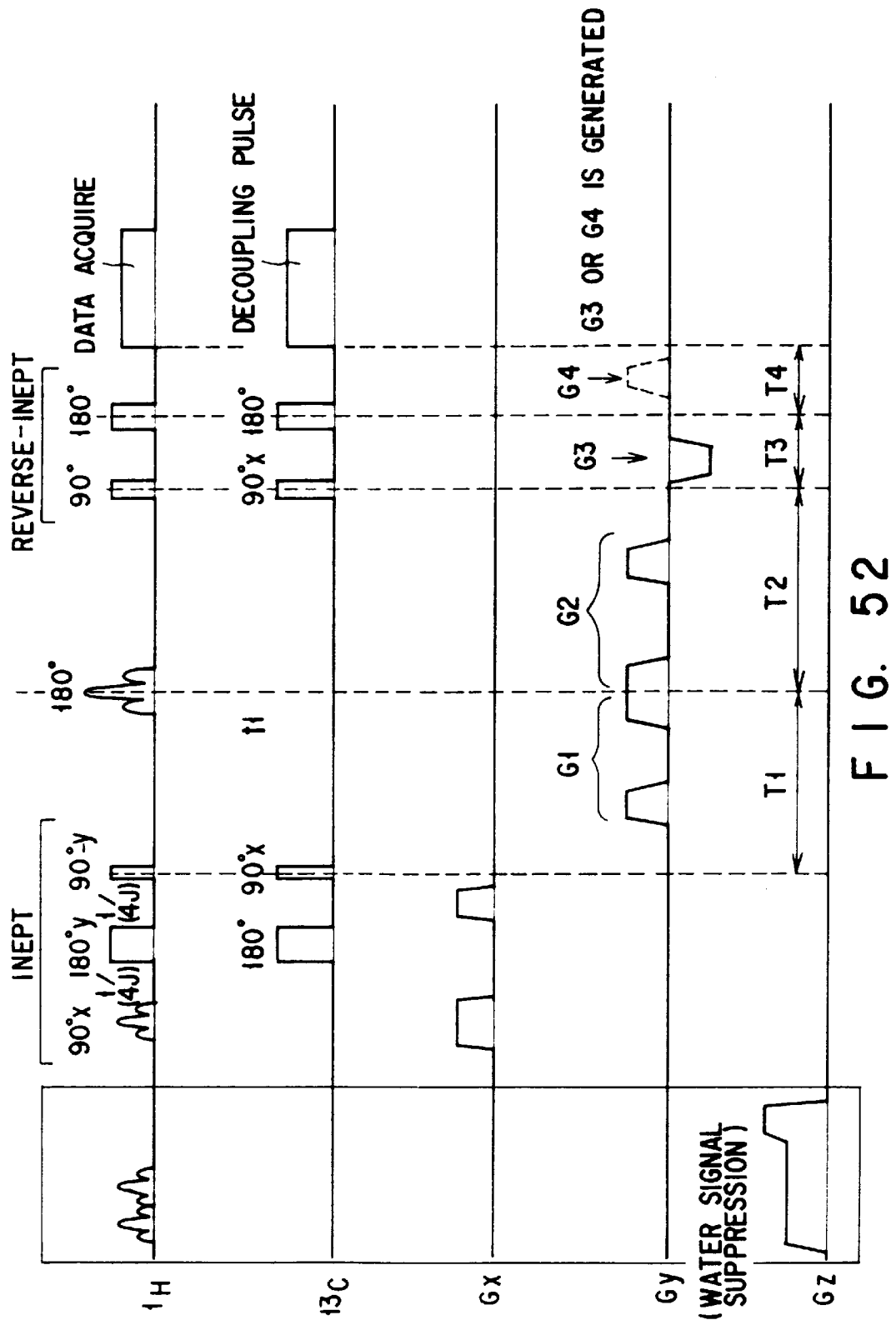
FIG. 52 shows a second improved HSQC pulse sequence.

FIG. 52 shows a second improved HSQC pulse sequence. The localization of one axis (Gz) is achieved by selective saturation pulses before the HSQC sequence is carried out. A first 90° x($^1$H) pulse for $^1$H in the INEPT section is used as a slice selective pulse for localizing another axis (Gx). A 180° ($^1$H) pulse in the single-quantum coherence period t1 is used as a slice selective pulse for localizing the remaining axis (Gy). Thus, the three axes are localized.

A pulse train in the gradient magnetic field pulse Gy, which is applied with the 180° ($^1$H) pulse (slice selective pulse) during the single-quantum coherence period t1, is adjusted so as to satisfy equation (1) or (2) below so that it can have a function of localizing the Y axis and a function of suppressing water signals. G1, G2, G3 and G4 are defined as follows:

G1: The integration value with respect to time of the gradient field Gy applied during the interval T1 between the center of the last 90° x($^{13}$C) pulse for $^{13}$C in the INEPT section and the center of 180° ($^1$H) pulse in the single-quantum coherence period t1.

G2: The integration value with respect to time of the gradient field Gy produced during the interval T2 between the center of the 180° ($^1$H) pulse in the single-quantum coherence section and the center of the first 90° x($^{13}$C) for $^{13}$C in the reverse-INEPT section.

G3: The integration value with respect to time of the gradient field Gy produced during the interval T3 between the center of the first 90° x($^1$H) pulse for $^{13}$C in the reverse-INEPT section and the center of the second 180° ($^1$H) for $^{13}$C in the reverse-INEPT section.

G4: The integration value with respect to time of the gradient field Gy produced during the interval T4 between the center of the 180° ($^1$H) pulse for $^{13}$C in the reverse-INEPT section and the start of data acquisition.

$$\gamma 2 \cdot G1 + \gamma 2 \cdot G2 + \gamma 1 \cdot G3 - \gamma 1 \cdot G4 = 0 \quad (1)$$

$$\gamma 2 \cdot G1 + \gamma 2 \cdot G2 - \gamma 1 \cdot G3 + \gamma 1 \cdot G4 = 0 \quad (2)$$

where $\gamma 1$ is the gyromagnetic ratio of the first nuclear species and $\gamma 2$ is the gyromagnetic ratio of the second nuclear species.

When the first nuclear species is $^1$H and the second nuclear species is $^{13}$C, $\gamma 1 = 4$ and $\gamma 2 = 1$. Then, equations (1) and (2) are respectively rewritten as follows:

$$G1 + G2 + 4 G3 - 4 \cdot G4 = 0 \quad (3)$$

$$G1 + G2 - 4 G3 + 4 \cdot G4 = 0 \quad (4)$$

In the case of $^1$H and $^{13}$C, therefore, by applying the gradient magnetic field pulse train, including slice-selection gradient fields, in such a way as to satisfy equation (3) or (4) only the single-quantum coherence path for $^{13}$C can be selected to suppress mainly water signals.

As with the improved INEPT sequence, in the improved HSQC sequence as well, the localization of three axes can be achieved by using three radio-frequency magnetic field pulses for $^1$H as slice selective pulses associated with different axes without using the selective saturation pulses. In the second HSQC sequence, the first 90° x($^1$H) pulse in the INEPT section and the 180° ($^1$H) pulse in the single-quantum coherence section are used as slice selective pulses. By using, in addition to these two pulses, the second 180° ($^1$H) pulse in the INEPT section as a slice selective pulse, the localization of three axes can be effected.

Figure 53:
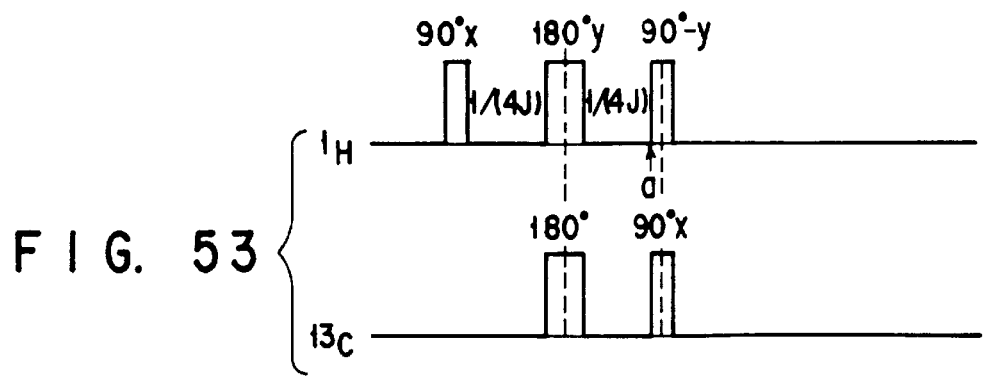
FIG. 53 shows the basic sequence in the INEPT section.
Figure 54A:
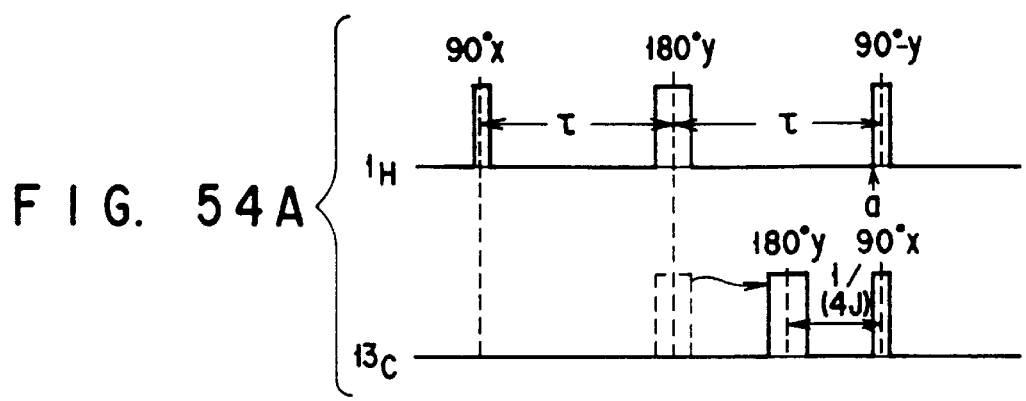
FIGS. 54A and 54B are diagrams for use in explanation of the principle that allows the second 180° y($^1$H) pulse for $^1$H in the INEPT section to be used as a slice selective pulse.
Figure 54B:
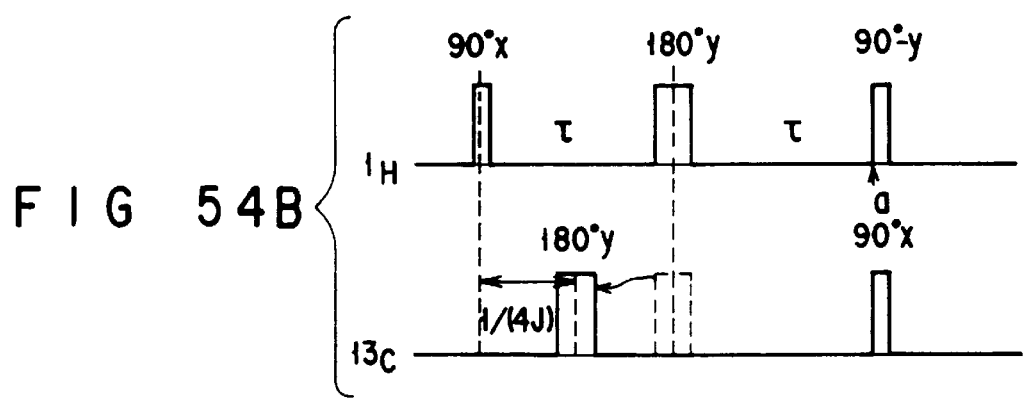
Figure 55:
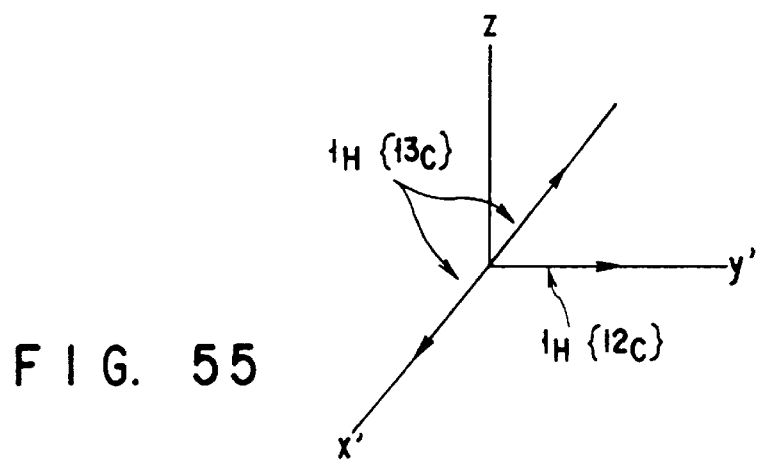
FIG. 55 shows the state of $^1$H spins after a lapse of 1/(4J) from the application of the 180° y($^1$H) pulse.

FIG. 53 shows the basic sequence for INEPT. FIGS. 54A and 54B illustrate the principles of permitting the second 180° y($^1$H) pulse for $^1$H in the INEPT section to be used as a slice selective pulse. FIG. 55 shows the state of $^1$H spins. If this state is obtained at the center of the third 90° -y($^1$H) pulse for $^1$H in the INEPT section, the polarization transfer is achieved. The principle is the same as that described in connection with FIGS. 31A and 31B.

The above-described method can be applied to the reverse-INEPT section. That is, six $^1$H pulses are used in the HSQC sequence of the invention. Any one of these pulses may be used as a selective excitation pulse. Several embodiments therefor will be described below. Although, in some of these embodiments, a decoupling pulse is applied, it need not necessarily be applied.

FIG. 56 shows a third improved HSQC pulse sequence that corresponds to the principle illustrated in FIG. 54A. In the third HSQC pulse sequence, a first 90° x($^1$H) for $^1$H and a second 180° y($^1$H) pulse for $^1$H in the INEPT section and a 180° ($^1$H) pulse in the single-quantum coherence period t1 are used as slice selective pulses for different axes, thereby achieving the localization of three axes.

Figure 57:
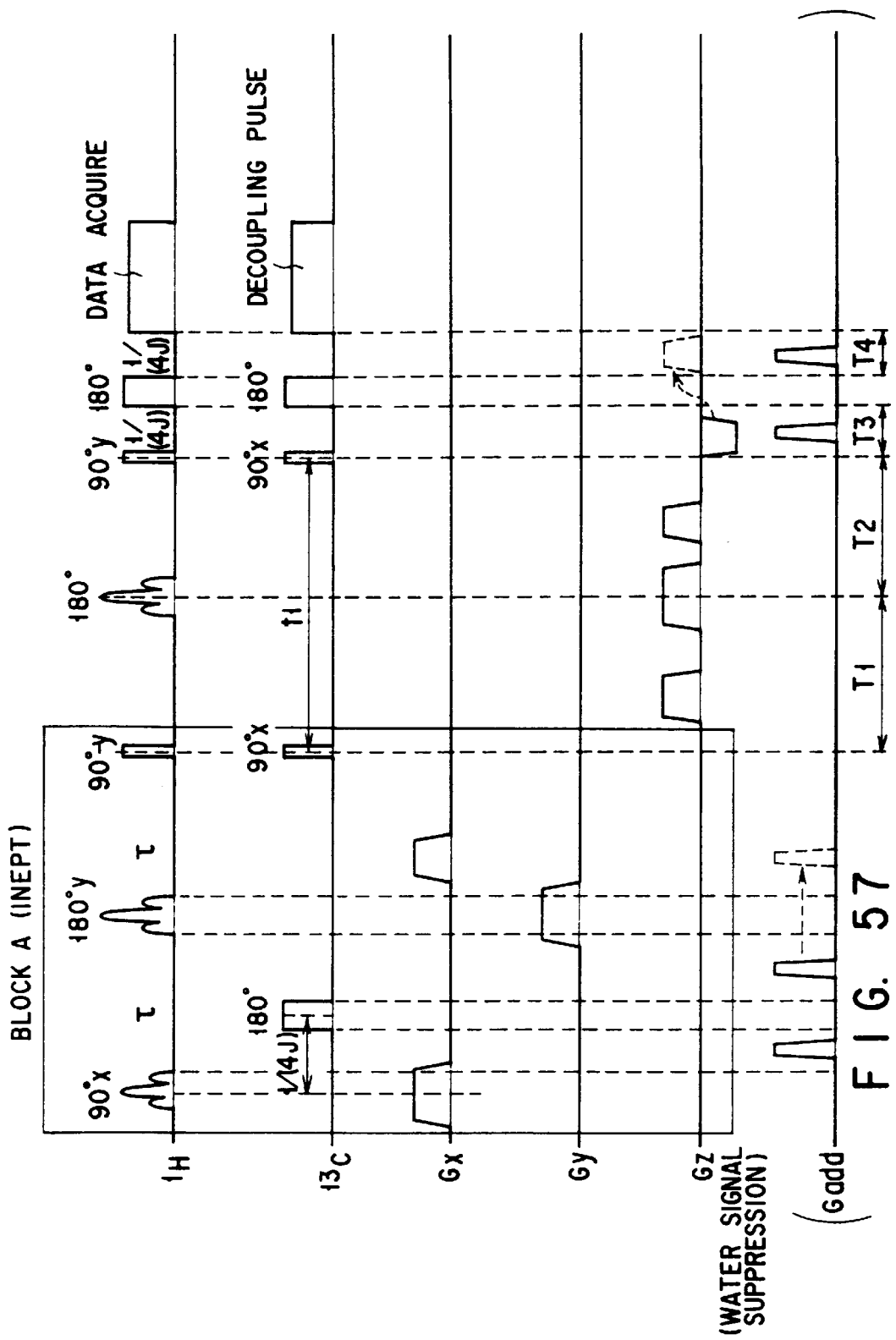
FIG. 57 shows a fourth improved HSQC pulse sequence corresponding to the principle of FIG. 54B.

FIG. 57 shows a fourth improved HSQC pulse sequence corresponding to the principle illustrated in FIG. 54B. In the fourth improved HSQC pulse sequence as well, by using a first 90° x($^1$H) for $^1$H and a second 180° y($^1$H) pulse for $^1$H in the INEPT section and a 180° ($^1$H) pulse in the single-quantum coherence section as slice selective pulses for different axes, the localization of three axes is achieved.

In the HSQC sequence as well, gradient magnetic field pulses Gadd should be applied to compensate for insufficient flip angles of the 180° pulses.

Figure 58:
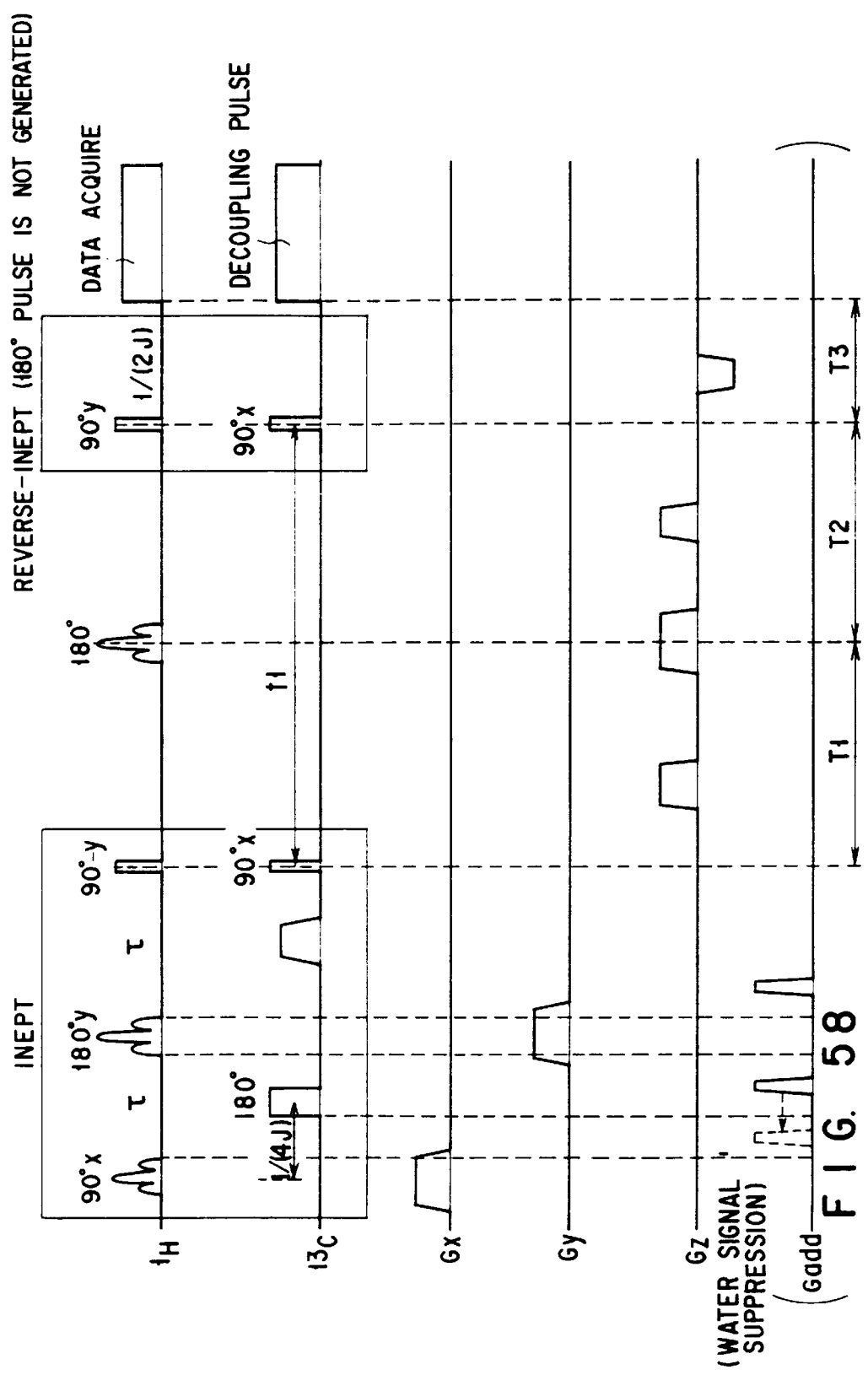
FIG. 58 shows an improved HSQC pulse sequence in which the 180° pulse in the reverse INEPT section is removed.

As shown in FIGS. 58 and 59, the 180° pulses in the reverse-INEPT section are applied to rephase spins dispersed by chemical shifts and magnetic field inhomogeneity. Thus, it cannot be said that the 180° pulses in the reverse-INEPT section are essential. If the 180° pulses are removed from the reverse-INEPT section, then equations (5) and (6) are adopted for the gradient magnetic field pulse train for suppressing water signals. Here, equations (5) and (6) are general expressions, and equations (7) and (8) are adopted for $^1$H and $^{13}$C combination. In this case, the definition of G3 is changed as follows:

G3: The integration value with respect to time of the gradient magnetic field pulse Gy applied during the interval T3 between the center of the first 90° x($^1$H) pulse for $^1$H in the reverse-INEPT section and the start of data acquisition.

$$\gamma 2 \cdot G1 + \gamma 2 \cdot G2 + \gamma 1 \cdot G3 = 0 \quad (5)$$

$$\gamma 2 \cdot G1 + \gamma 2 \cdot G2 - \gamma 1 \cdot G3 = 0 \quad (6)$$

$$G1 + G2 + 4 G3 = 0 \quad (7)$$

$$G1 + G2 - 4 G3 = 0 \quad (8)$$

Even when the 180° pulses are removed from the reverse-INEPT section, the interval between the last 90° y($^1$H) pulse for $^1$H in the reverse-INEPT section and the start of data acquisition (the beginning of the decoupling pulse) remains unchanged from 1/(2J). Note that although the embodiment which has both a function of localization of the Y axis and a function of removing water signals is described in connection with the HSQC sequence only, it goes without saying that it is useful to any sequence in which a 180° pulse for $^1$H is applied within the single-quantum coherence period of $^{13}$C (within the t1 period).

FIG. 59 shows a fifth improved HSQC pulse sequence. In this pulse sequence, the localization of three axes is achieved by using a first 90° x($^1$H) pulse for $^1$H and a third 90° –y($^1$H) pulse for $^1$H in the INEPT section and a 180° ($^1$H) pulse in the single-quantum coherence section as slice selective pulses for different axes.

Figure 60:
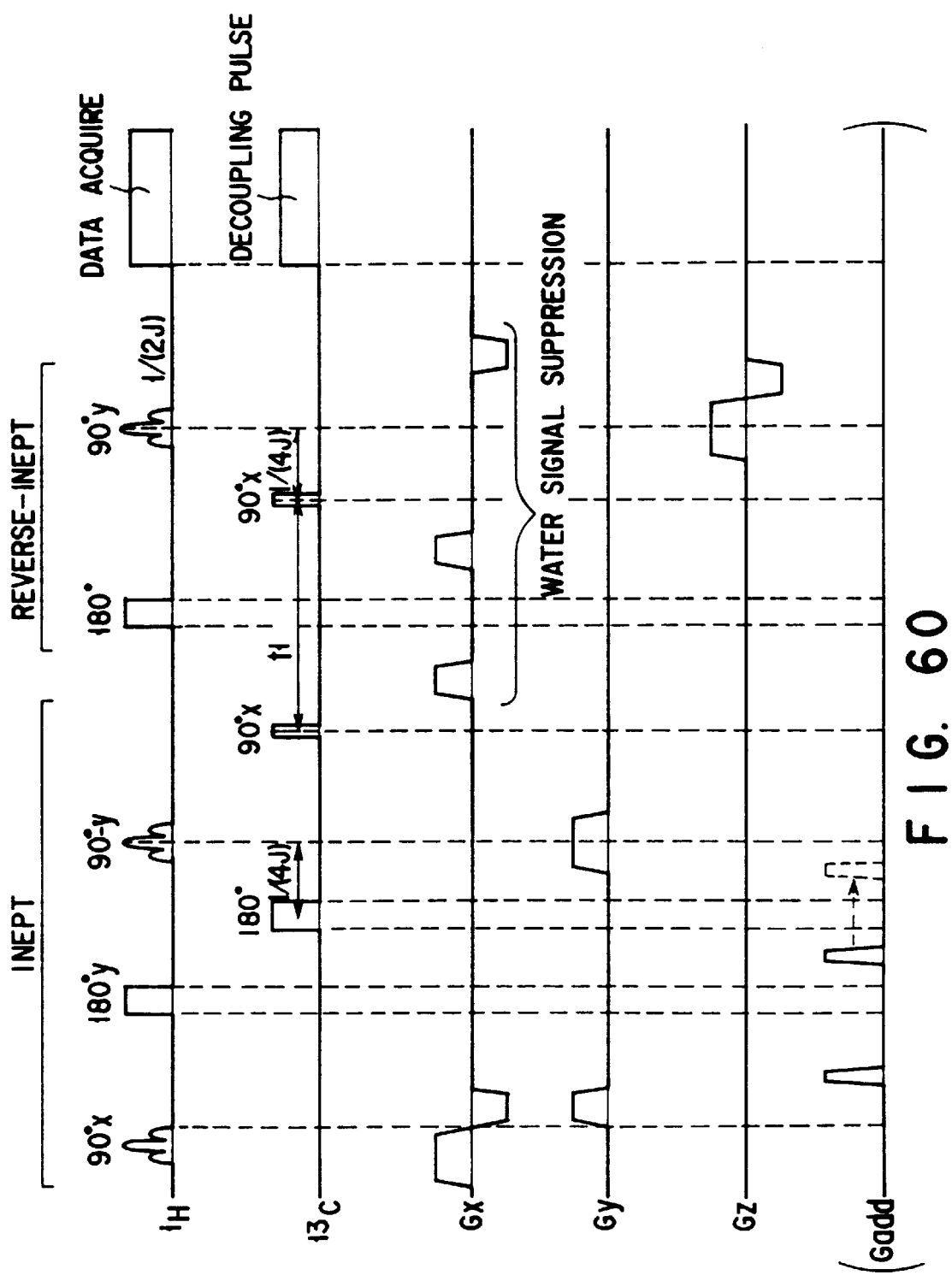
FIG. 60 shows a sixth improved HSQC pulse sequence.

FIG. 60 shows a sixth improved HSQC pulse sequence, which is intended to achieve the localization of three axes by using three excitation radio-frequency magnetic field pulses each of which provides a 90° flip for $^1$H spins. That is, the localization of three axes is achieved by using a first 90° x($^1$H) for $^1$H and a third 90° –y($^1$H) pulse for $^1$H in the INEPT section and a second 90° y($^1$H) pulse in the reverse-INEPT as slice selective pulses associated with different axes.

A 90° pulse is superior to a 180° pulse in slice selective characteristics. Thus, the sixth improved HSQC sequence is superior in the characterization of slice profile to the HSQC sequence that uses a 180° pulse for the localization of one axis.

Figure 61:
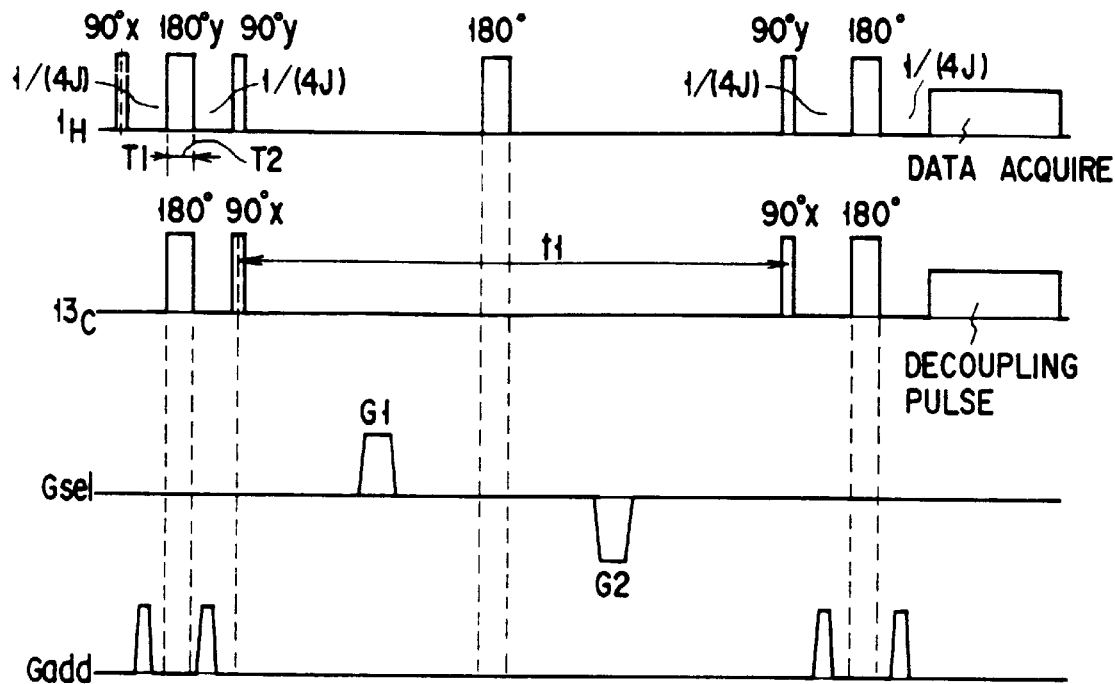
FIG. 61 shows a seventh improved HSQC pulse sequence.

FIG. 61 shows a seventh improved HSQC pulse sequence, which, by selecting all of coherence paths, solves a problem that the signal strength becomes ½. To this end, a first gradient field G1 is produced during the interval between a second 90° x($^{13}$C) for $^{13}$C in the INEPT section and a 180° ($^1$H) pulse in the single-quantum coherence period t1 and a second gradient field G1 is produced during the interval between the 180° ($^1$H) pulse in the single-quantum coherence period and a first 90° x($^{13}$C) pulse for Q13C in the reverse-INEPT section. The first and second gradient magnetic field pulses are opposite to each other in polarity and adjusted so that their integration value with respect to time becomes equal. Such adjustment allows all the coherence paths to be selected.

Figure 62:
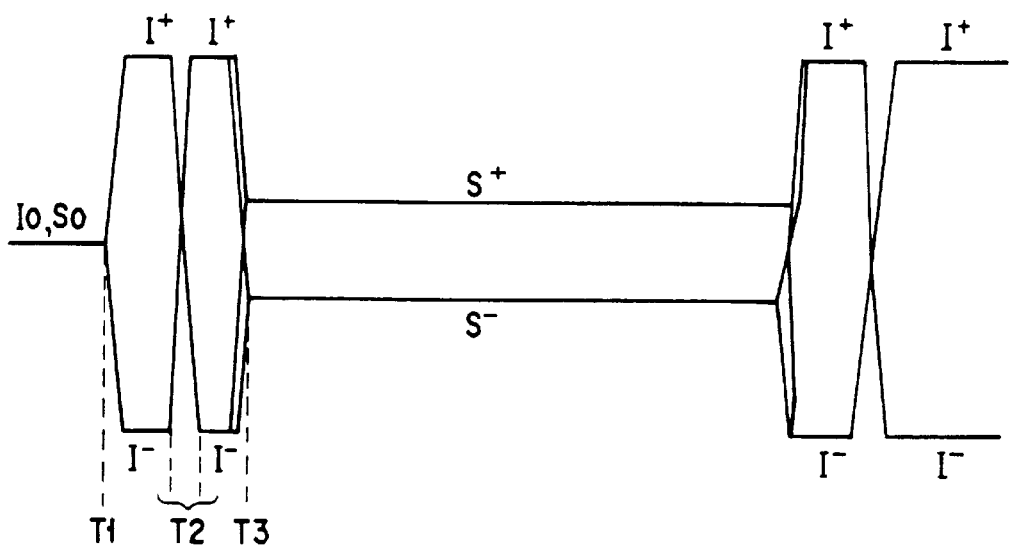
FIG. 62 shows a coherence path.

FIG. 62 shows all the coherence paths. I and S correspond to $^1$H and $^{13}$C, respectively. First, the coherence path separates into S$^+$ and S$^-$ immediately after polarization transfer (T3). In this state, the first and second gradient magnetic field pulses G1 and G2 are applied. As a result, refocusing is performed in both S$^+$ and S$^-$, i.e., in all the coherence paths. In contrast, $^1$H spins that, like water, are not combined with $^{13}$C spins are dephased. As a result, all the coherence paths for $^1$H and $^{13}$C spins are selected, while no coherence path for water is selected.

Figure 63:
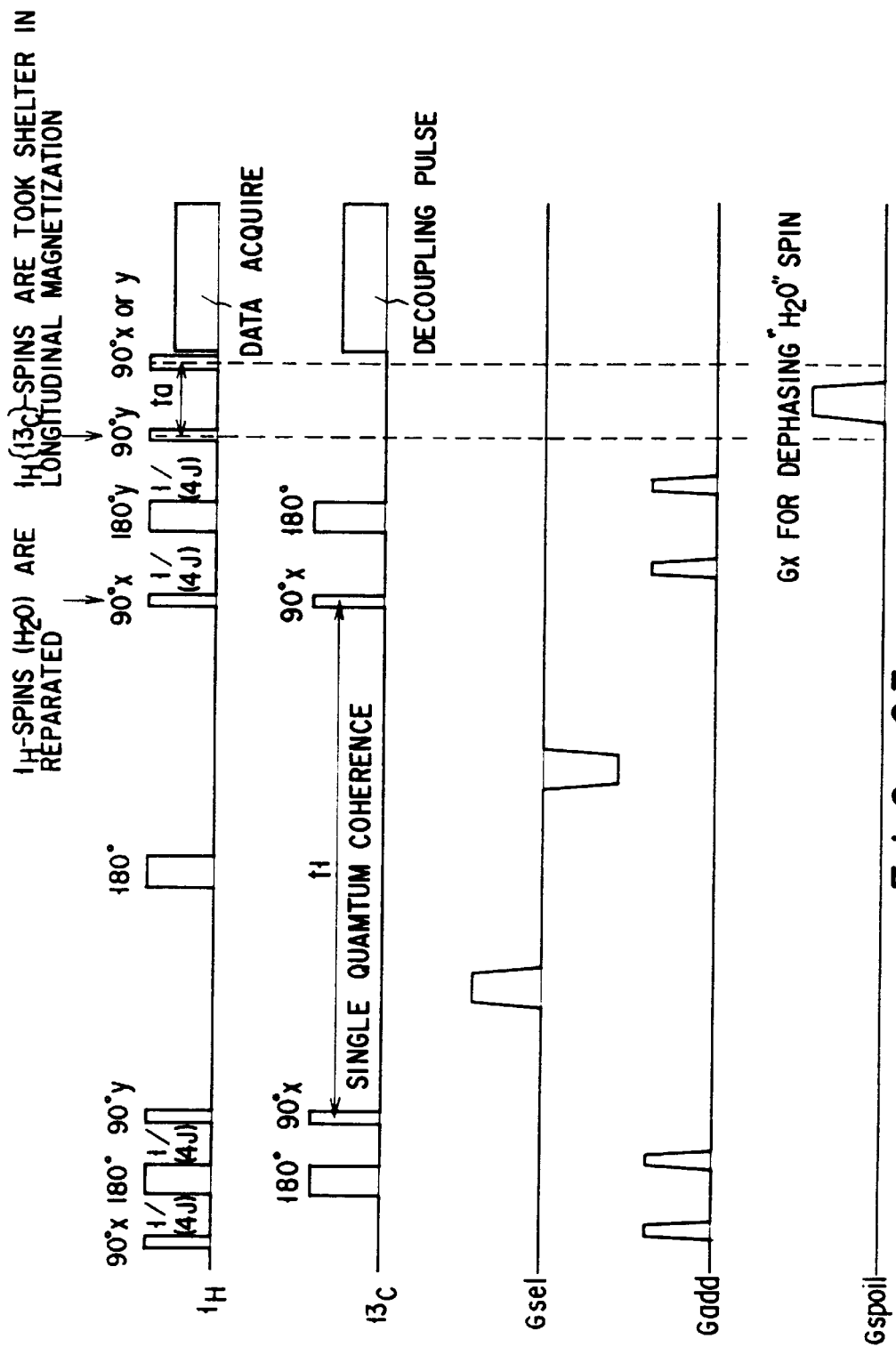
FIG. 63 shows an eighth improved HSQC pulse sequence.

FIG. 63 shows an eighth improved HSQC pulse sequence. In this sequence, a first 90° x($^1$H) pulse for $^1$H in the reverse-INEPT section puts the $^1$H spins in water in longitudinal magnetization and the $^1$H{$^{13}$C} spins in transverse magnetization. The $^1$H spins and the $^1$H{$^{13}$C} spins in water are developed into transverse magnetization and longitudinal magnetization, respectively, through a 180° y($^1$H) and a 90° y($^1$H) pulse. A gradient magnetic field pulse Gspoil is applied after the 90° y($^1$H) pulse, dephasing the $^1$H spins in water. However, the $^1$H{$^{13}$C} spins are not dephased because they are in the longitudinal magnetization. Thus, water signals are suppressed.

Figure 64:
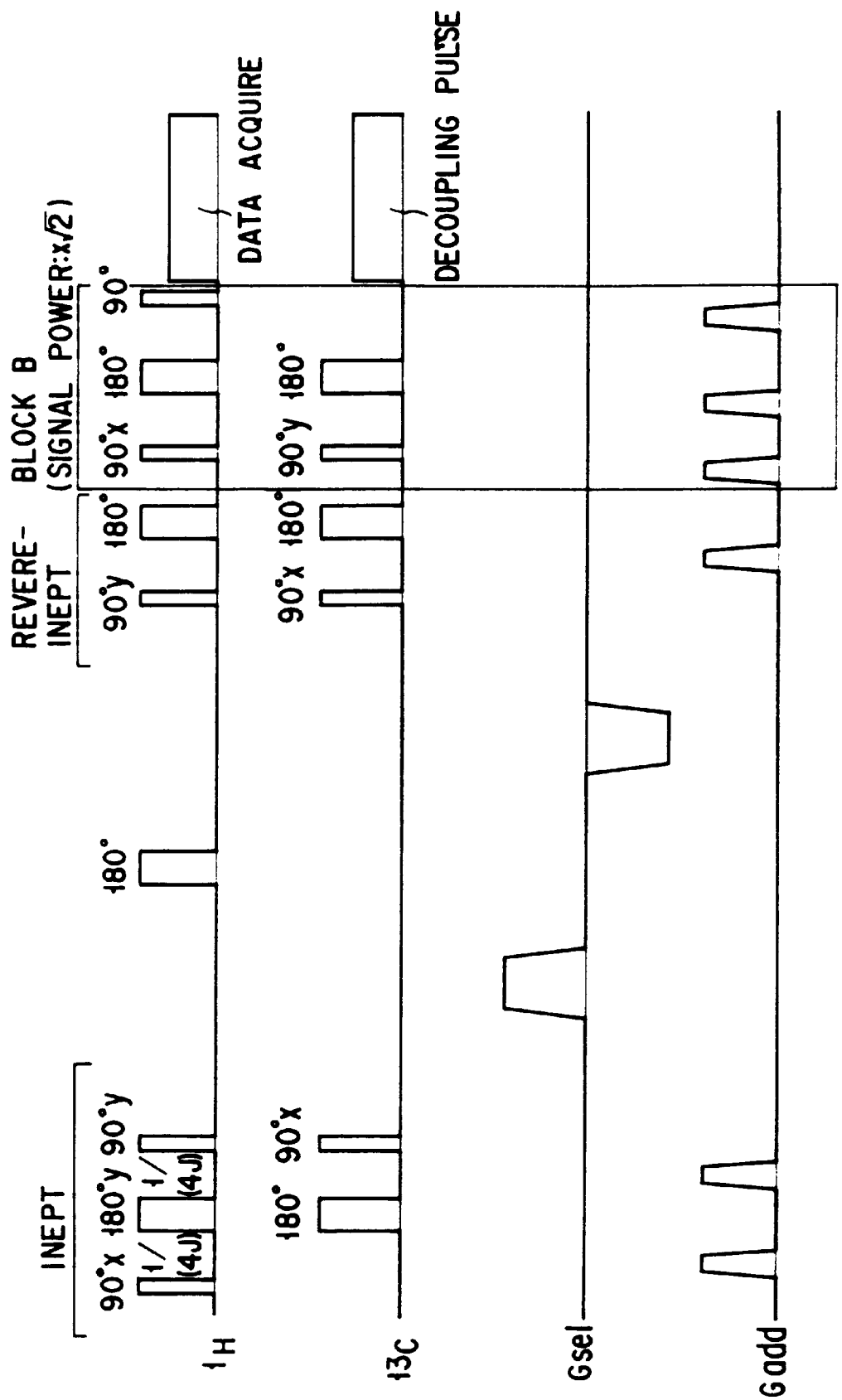
FIG. 64 shows a ninth improved HSQC pulse sequence.

FIG. 64 shows a ninth improved HSQC pulse sequence, which is combined with the method by A. G. Palmer (see the Journal of Magnetic Resonance vol. 93, pp. 151 to 170, 1991) in order to improve sensitivity. After the reverse-INEPT section a pulse sequence in block B is carried out. In this block, a 90° ($^1$H) pulse, a 180° ($^1$H) pulse and a 90° ($^1$H) pulse are sequentially applied for $^1$H. A 90° ($^{13}$C) pulse and a 180° ($^{13}$C) pulse are sequentially applied for $^{13}$C. The 90° ($^1$H) pulse and the 90° ($^{13}$C) pulse are applied simultaneously. The 180° ($^1$H) pulse and the 180° ($^{13}$C) pulse are applied simultaneously. Such a pulse sequence allows the signal strength to be increased in principle by a factor of $\sqrt{2}$.

FIG. 65 shows a tenth improved HSQC pulse sequence. In this pulse sequence, the localization of three axes is effected by using the first 90° x($^1$H) pulse and the second 180° ($^1$H) pulse for $^1$H in the INEPT section and the 180° ($^1$H) pulse in the reverse-INEPT section as slice selective pulses associated with different axes.

FIG. 66 shows an eleventh improved HSQC pulse sequence. In this pulse sequence, a 180° ($^1$H) pulse in the single-quantum coherence section and a first 90° x($^1$H) pulse for $^1$H and a second 180° ($^1$H) pulse for $^1$H in the reverse-INEPT section are used as slice selective pulses for different axes, thereby achieving the localization of three axes.

In the eleventh improved HSQC pulse sequence, a slice-selection gradient magnetic field pulse Gx applied with the 180° ($^1$H) pulse (slice selective pulse) during the period t1 is adjusted to satisfy the following condition. Suppose that an integration value with respect to time of the gradient magnetic field pulse Gx produced during the interval T1 between the center of the 90° x($^{13}$C) in the INEPT section and the center of the 180 ($^1$H) pulse in the single-quantum coherence section is G1 and an integration value with respect to time of the gradient magnetic field pulse Gx produced during the interval T2 between the center of the 180° ($^1$H) and the center of the first 90° ($^{13}$C) pulse in the reverse-INEPT section is G2. Then, the gradient magnetic field pulse Gx is adjusted, including the slice-selection gradient magnetic field pulse, so as to satisfy the condition that G1:G2=1:–1.

Figure 67:
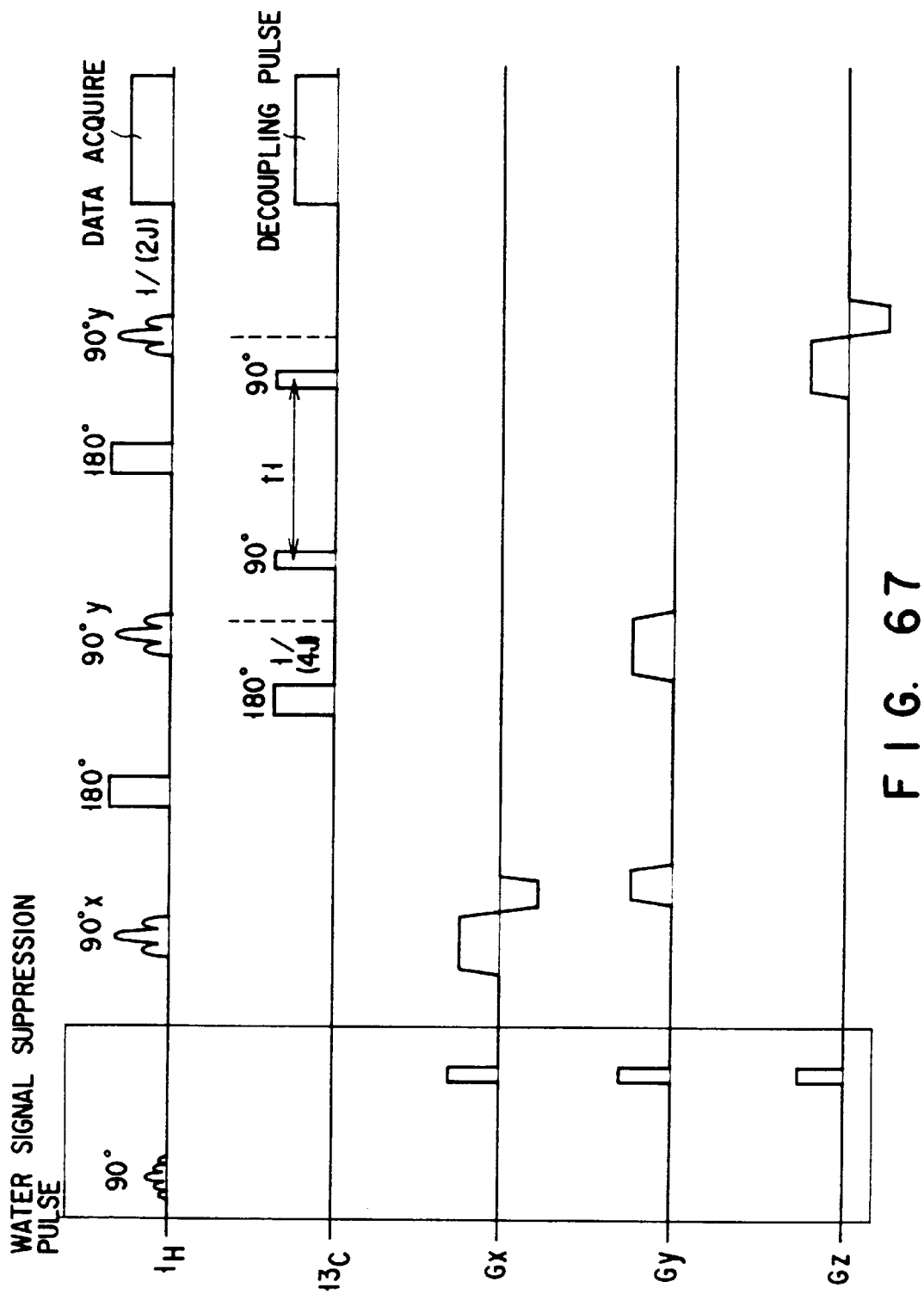
FIG. 67 shows an improved HSQC pulse sequence which has additional water signal suppression pulses.

Water signals may be suppressed by generating water suppression pulses as prepulses as shown in FIG. 67. That is, the $^1$H spins in water are first selectively excited by a 90° pulse and then sufficiently dephased by gradient magnetic field pulses Gx, Gy and Gz.

Figure 68:
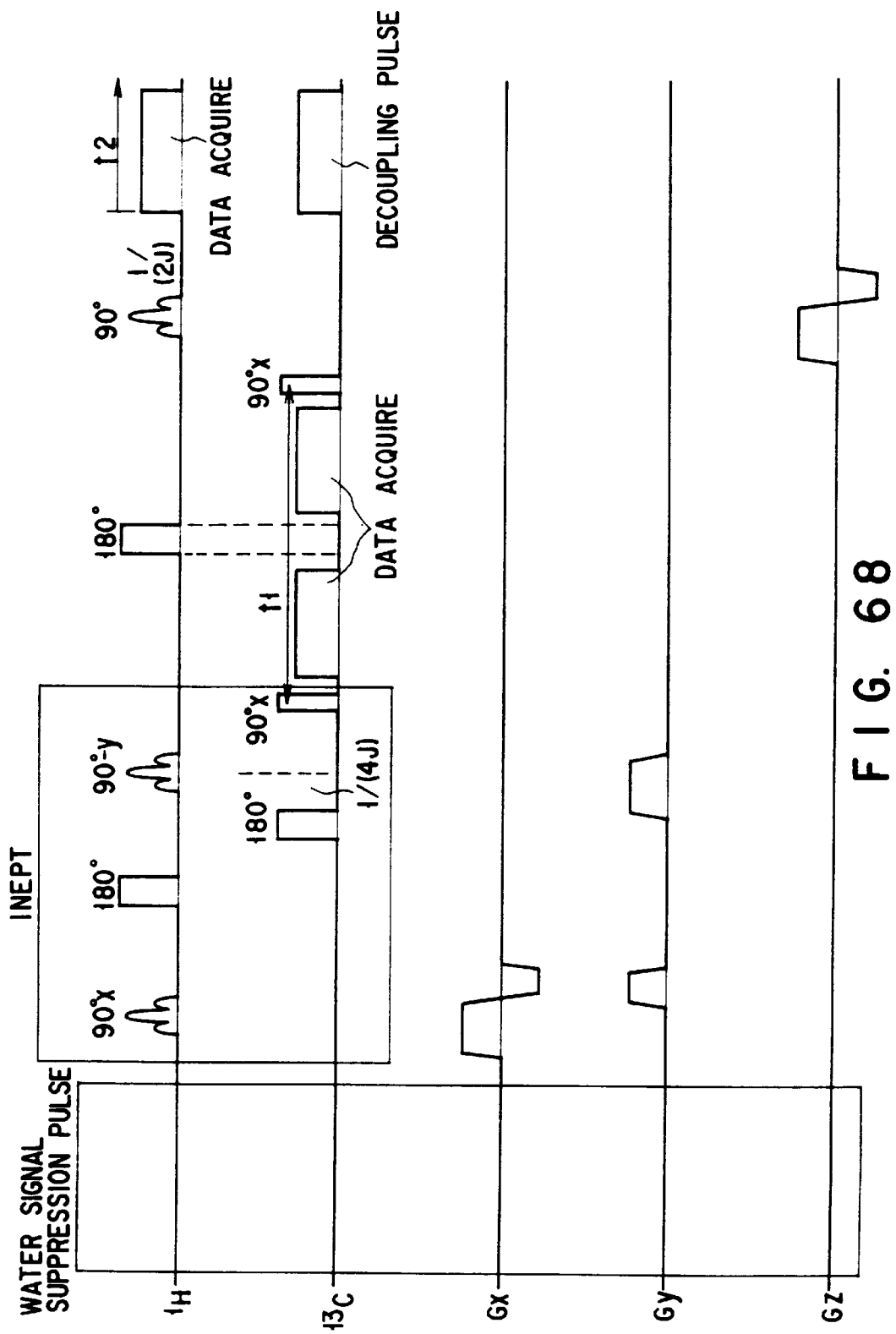
FIG. 68 shows a twelfth improved HSQC pulse sequence.

FIG. 68 shows a twelfth improved HSQC pulse sequence. In this sequence, data is acquired before and after a 180° ($^1$H) pulse in the single-quantum coherence period t1. Data acquired during the period t1 and data acquired during an interval t2 after the reverse-INEPT sequence are subjected to proper signal processing such as arithmetic mean, which improves the signal-to-noise ratio. Two-dimensional data σ(ω$^1$H, ω$^{13}$C) acquired during the interval t2 is projected onto the ω$^{13}$C axis and converted to one-dimensional data σ1(ω$^{13}$C). The data σ1(ω$^{13}$C) and the data σ2(ω$^{13}$C) in the period t1 are added and averaged. The number of data sampling points over the period t1 changes each time phase encoding changes and does not generally coincide with the number of times phase encoding is performed. For this reason, σ1(ω$^{13}$C) and σ2(ω$^{13}$C) cannot be simply added. Thus, it is required to adjust the number of sampling points by processing such as zero-filling.

Fourth Embodiment

The fourth embodiment of the invention is directed to combined use of a general data acquisition pulse sequence such as a spin echo method and an INEPT pulse sequence and improvements in localization by the INEPT-combined pulse sequence for acquiring magnetic resonance signals from $^1$H spins ($^1$H observation method).

FIG. 69 shows an arrangement of a magnetic resonance diagnostic apparatus according to the fourth embodiment. In this figure, like reference numerals are used to denote corresponding parts to those in the arrangement of FIG. 50 and description thereof is omitted.

Figure 70:
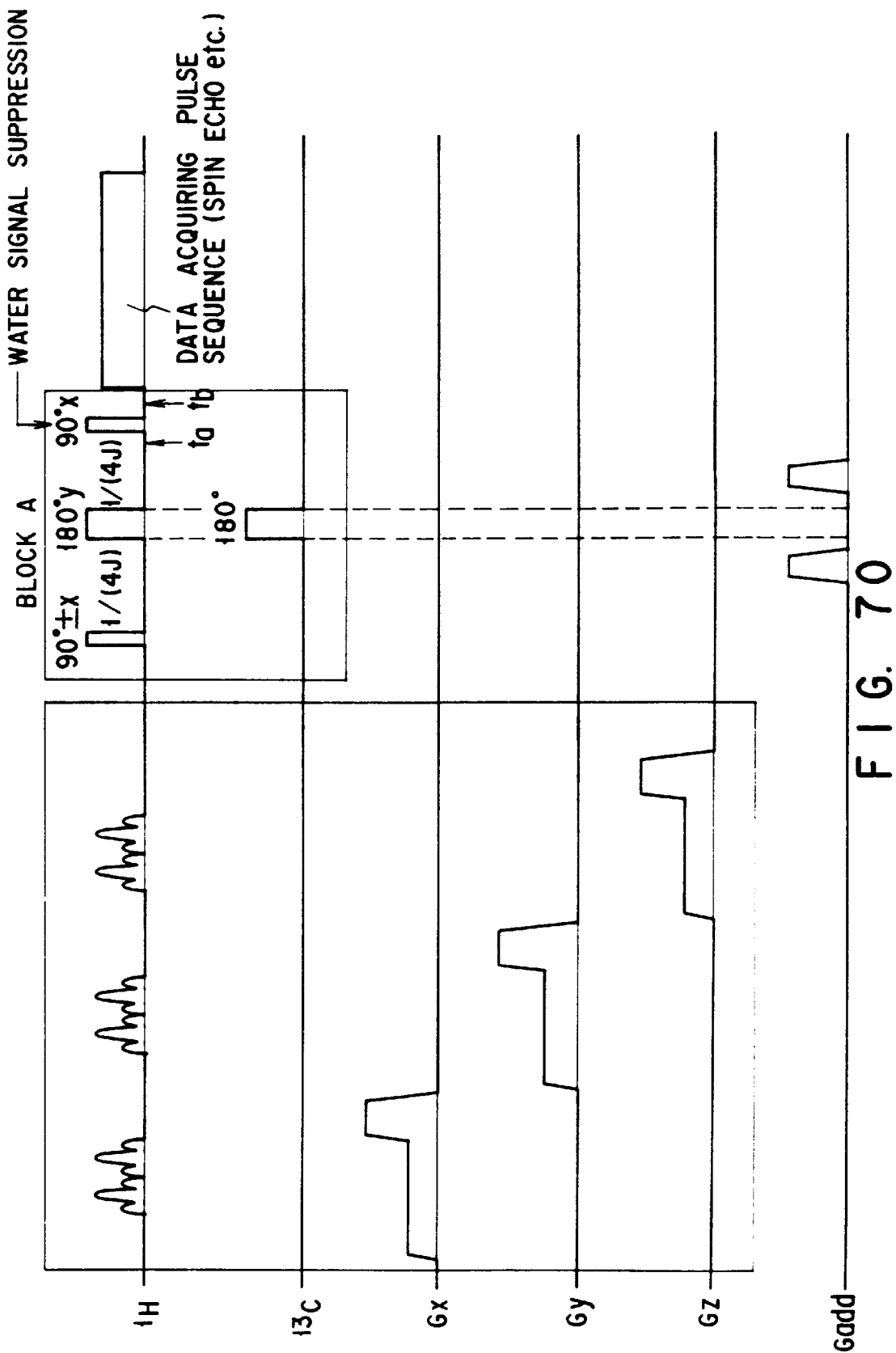
FIG. 70 shows an INEPT combined-use type pulse sequence which has selective saturation pulses.
Figure 72:
FIGS. 72 and 74 show INEPT combined-use type pulse sequences in which three 90° pulses for $^1$H are used as slice selective pulses.

The methods of localization described in connection with the improved INEPT pulse sequences can be applied to such an INEPT-combined pulse sequence. In a pulse sequence shown in FIG. 70, spins outside a region of interest are sufficiently dephased by selective saturation pulses to provide the localization of three axes. In a pulse sequence of FIG. 71, two 90° (H) pulses in the INEPT section in block A are used as slice selective pulses to provide the localization of two axes. In a pulse sequence of FIG. 72, a 90° ($^1$H) pulse is added to the INEPT section of block B. Three 90° pulses for $^1$H, including the added pulse, are used as slice selective pulses to provide the localization of three axes. In these pulse sequences as well, of course, gradient magnetic field pulses Gadd should be generated to compensate for insufficiency of 180°-pulse flip angles. In addition, a decoupling pulse should also be applied during data acquisition interval. Moreover, as shown in a pulse sequence of FIG. 75, a second 180° y($^1$H) pulse for $^1$H may be applied as a slice selective pulse at a time different from the time a first 180° ($^{13}$C) pulse is applied.

Figure 73:
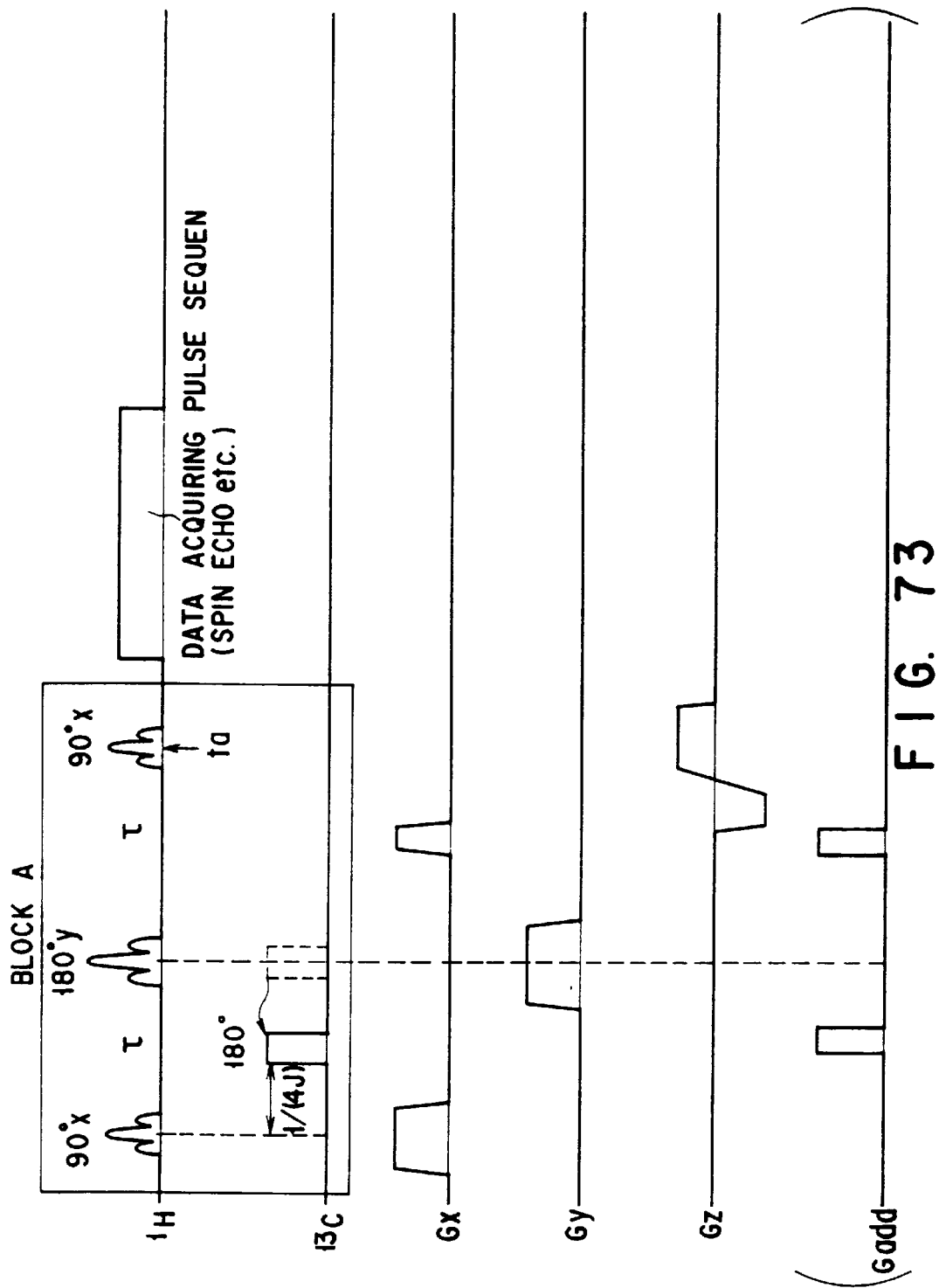
FIGS. 73 and 75 show INEPT combined-use type pulse sequences in which the second 180° y($^1$H) pulse for $^1$H are used as a slice selective pulse.
Figure 74:
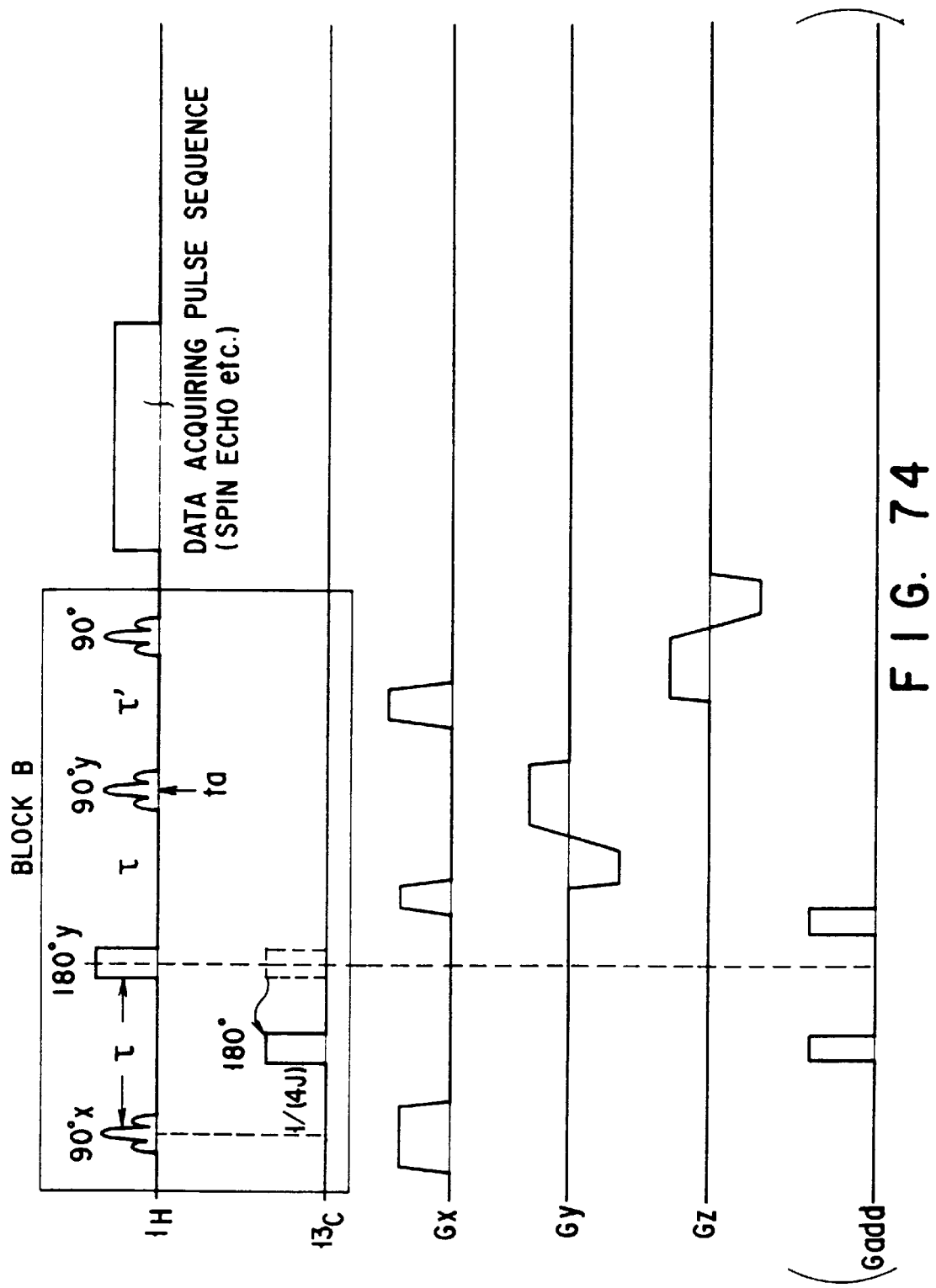

Since the pulse sequences of the fourth embodiment are adapted to observe $^1$H spins, it is necessary to suppress water signals ($^1$H{$^{12}$C}). FIGS. 73 and 74 illustrate methods of suppressing the water signals.

Figure 2:
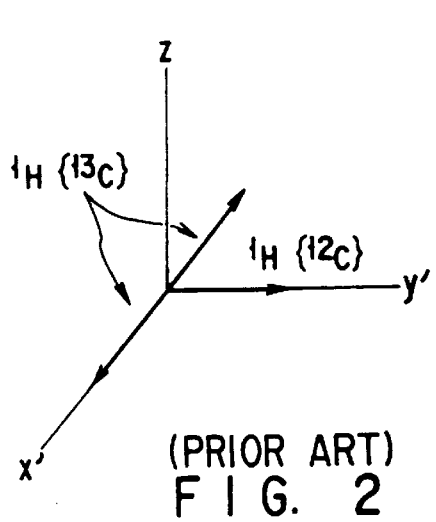
FIG. 2 shows the state of $^1$H spins at time ta in FIG. 1.
Figure 3:
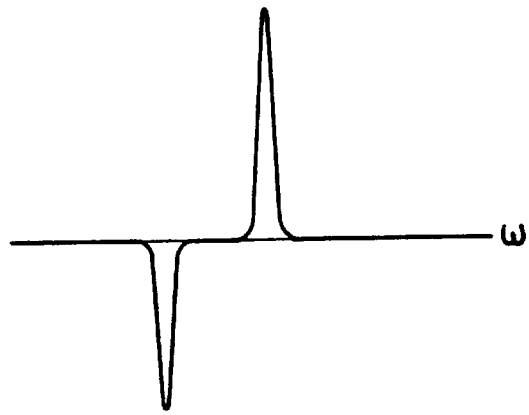
FIG. 3 shows an example of a spectrum of $^{13}$C.
Figure 4:
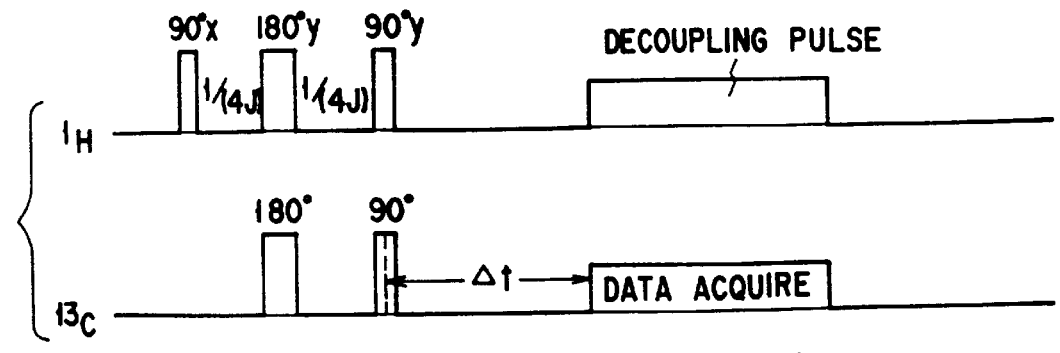
FIG. 4 shows a conventional INEPT pulse sequence which has an additional decoupling pulse.
Figure 5:
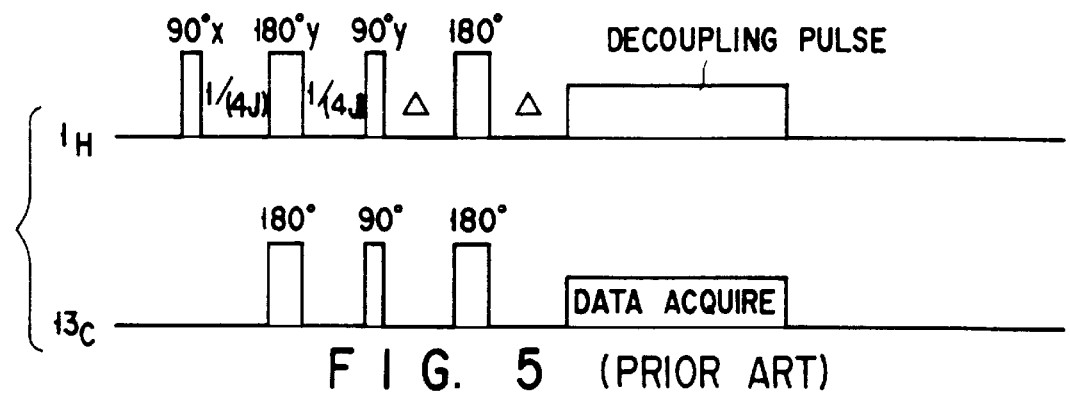
FIG. 5 shows a conventional INEPT pulse sequence which has additional 180° pulses for $^1$H and $^{13}$C.
Figure 6:
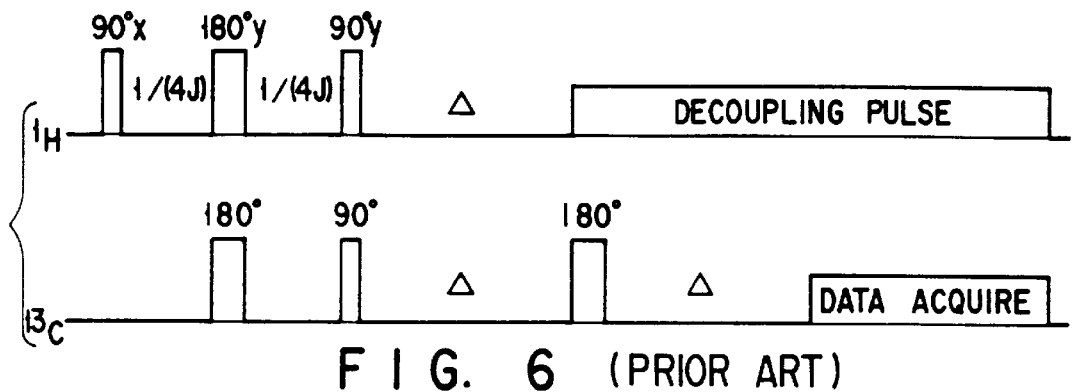
FIG. 6 shows a conventional INEPT pulse sequence which has an additional 180° pulse for $^{13}$C.
Figure 7:
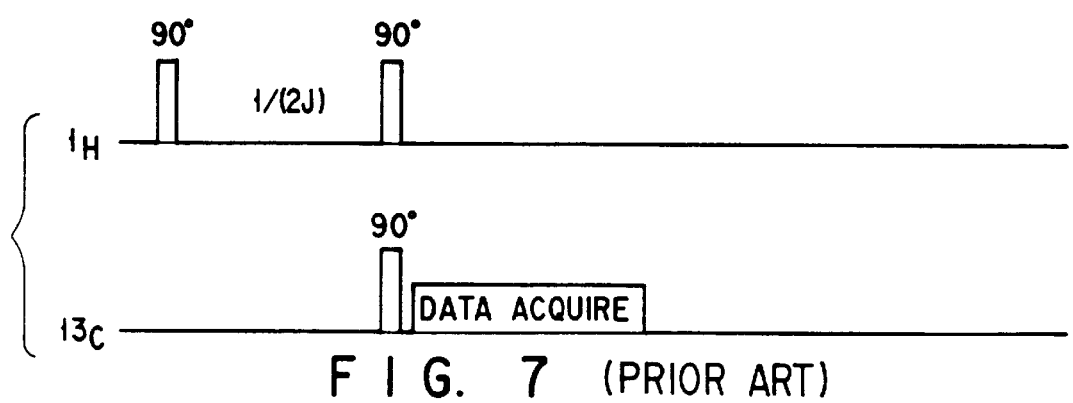
FIG. 7 shows a conventional DEPT pulse sequence.
Figure 8:
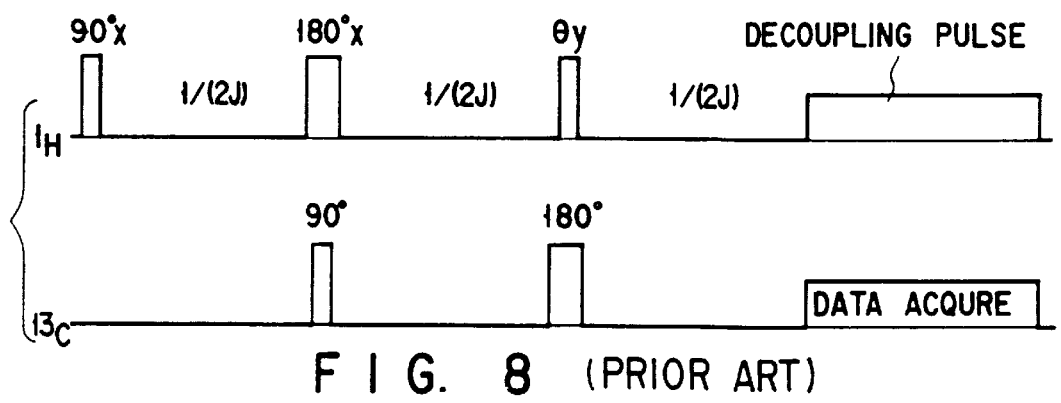
FIG. 8 shows another conventional DEPT pulse sequence.
Figure 9:
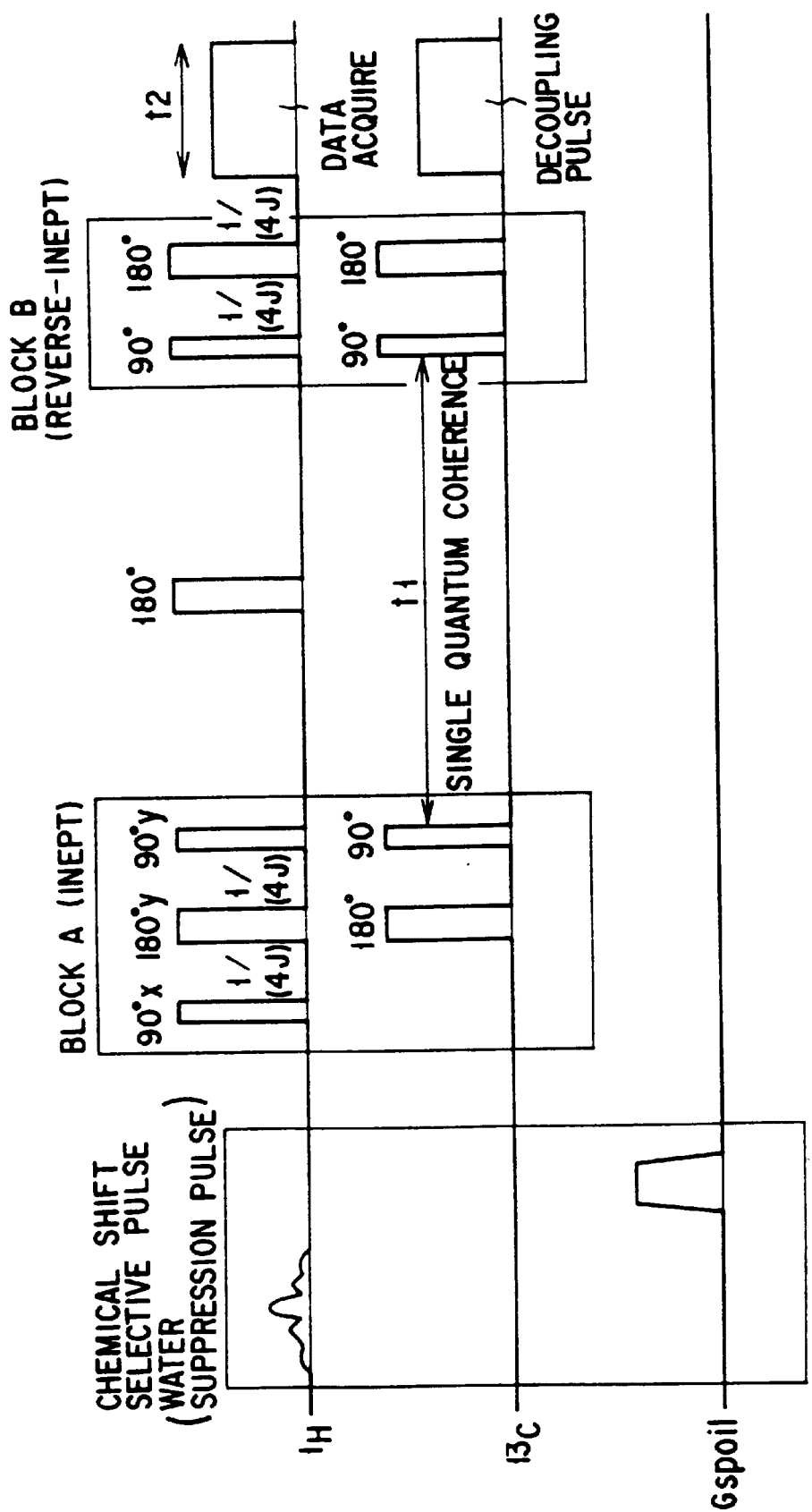
FIG. 9 shows a conventional HSQC pulse sequence which has an additional water signal suppression pulse.
Figure 16:
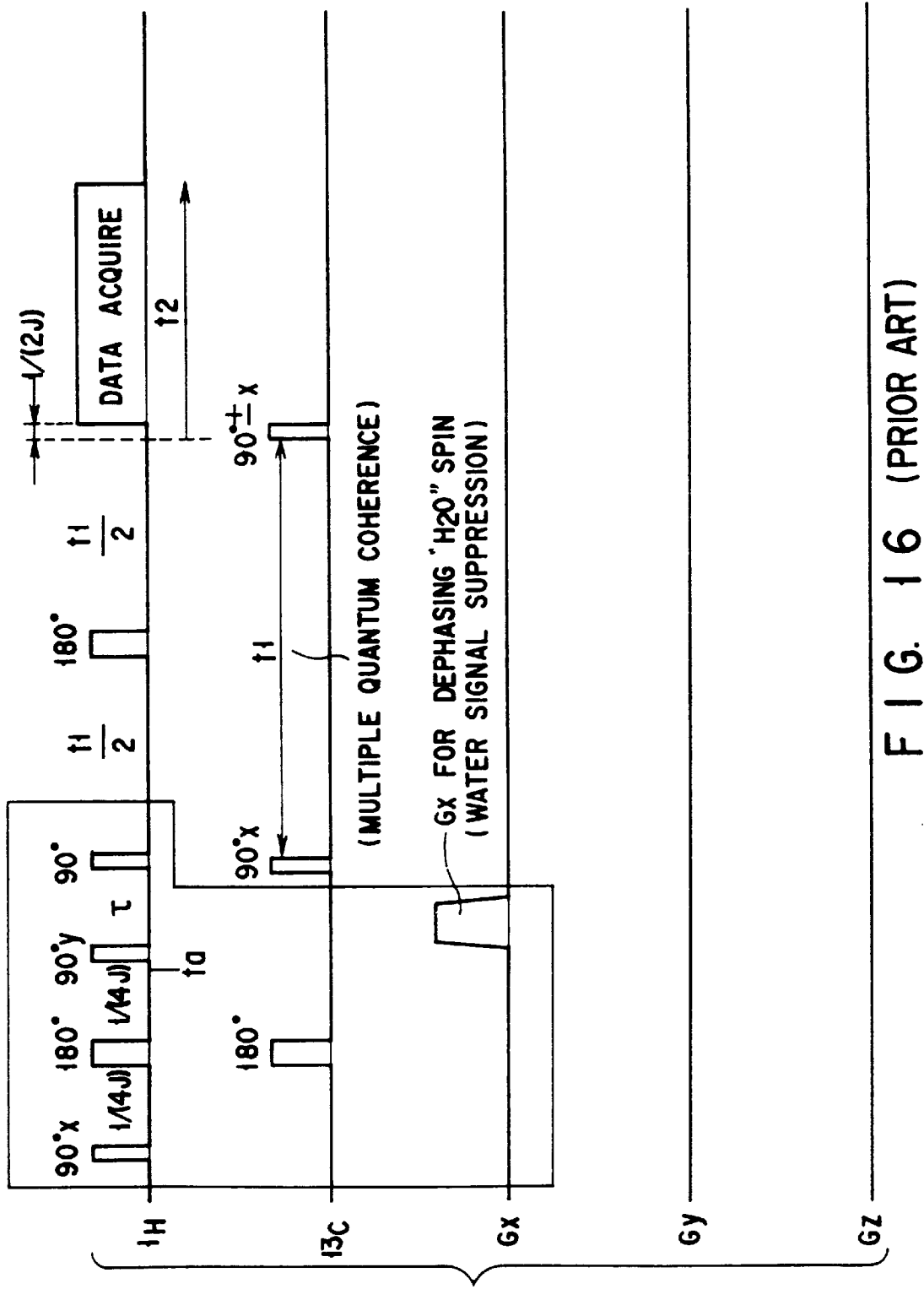
FIG. 16 shows another conventional HMQC pulse sequence for suppressing water signals.
Figure 17:
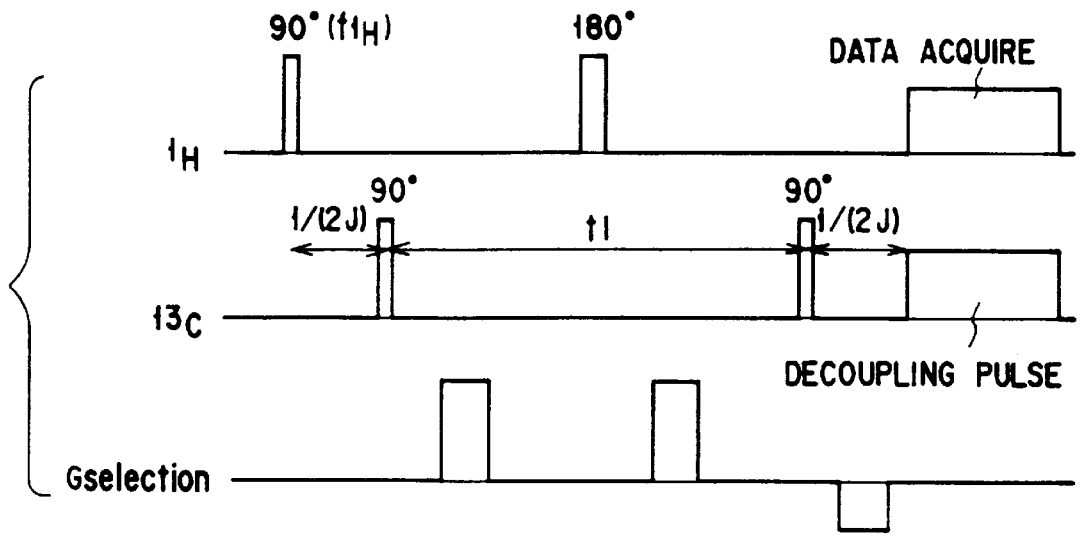
FIG. 17 shows a conventional HMQC pulse sequence which has additional Gselection pulses.
Figure 22:
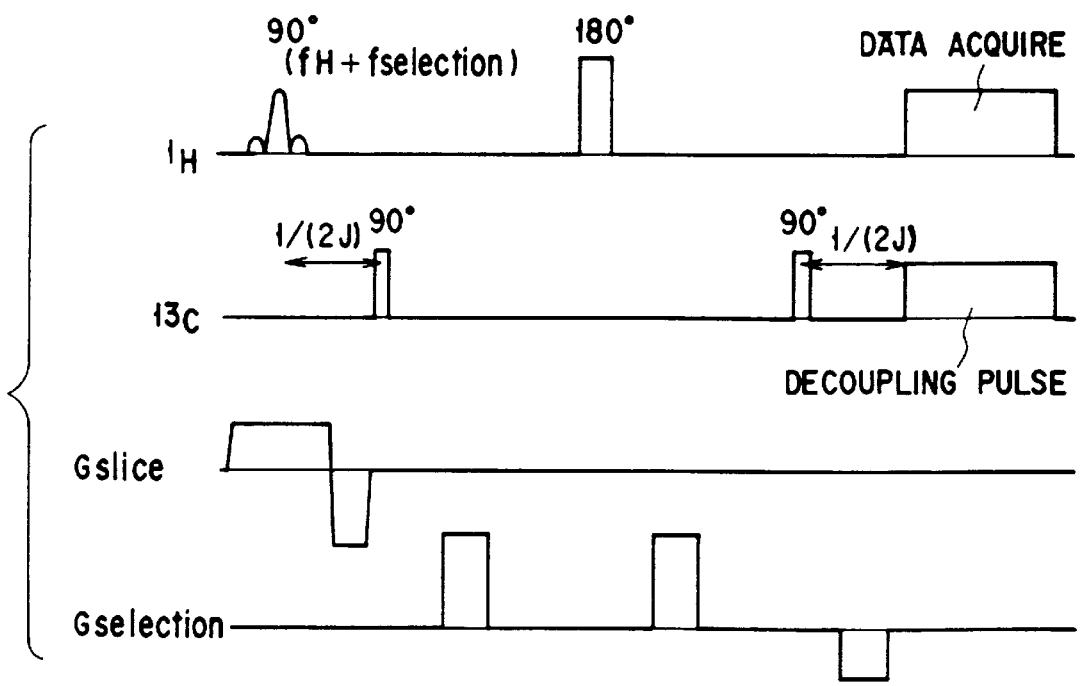
FIG. 22 shows a conventional HMQC pulse sequence for localization.
Figure 18:
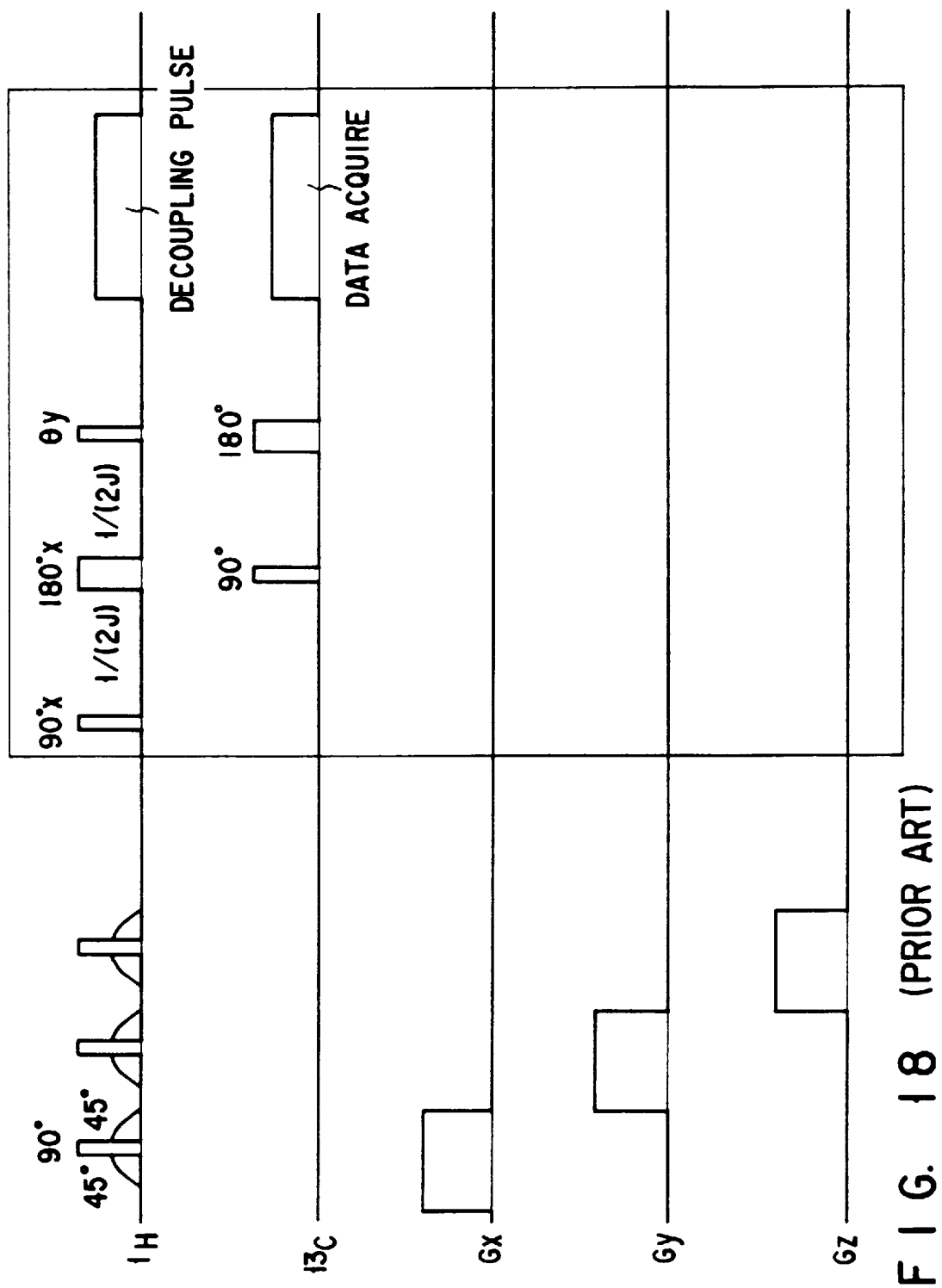
FIG. 18 shows a conventional DEPT pulse sequence for localization.
Figure 19:
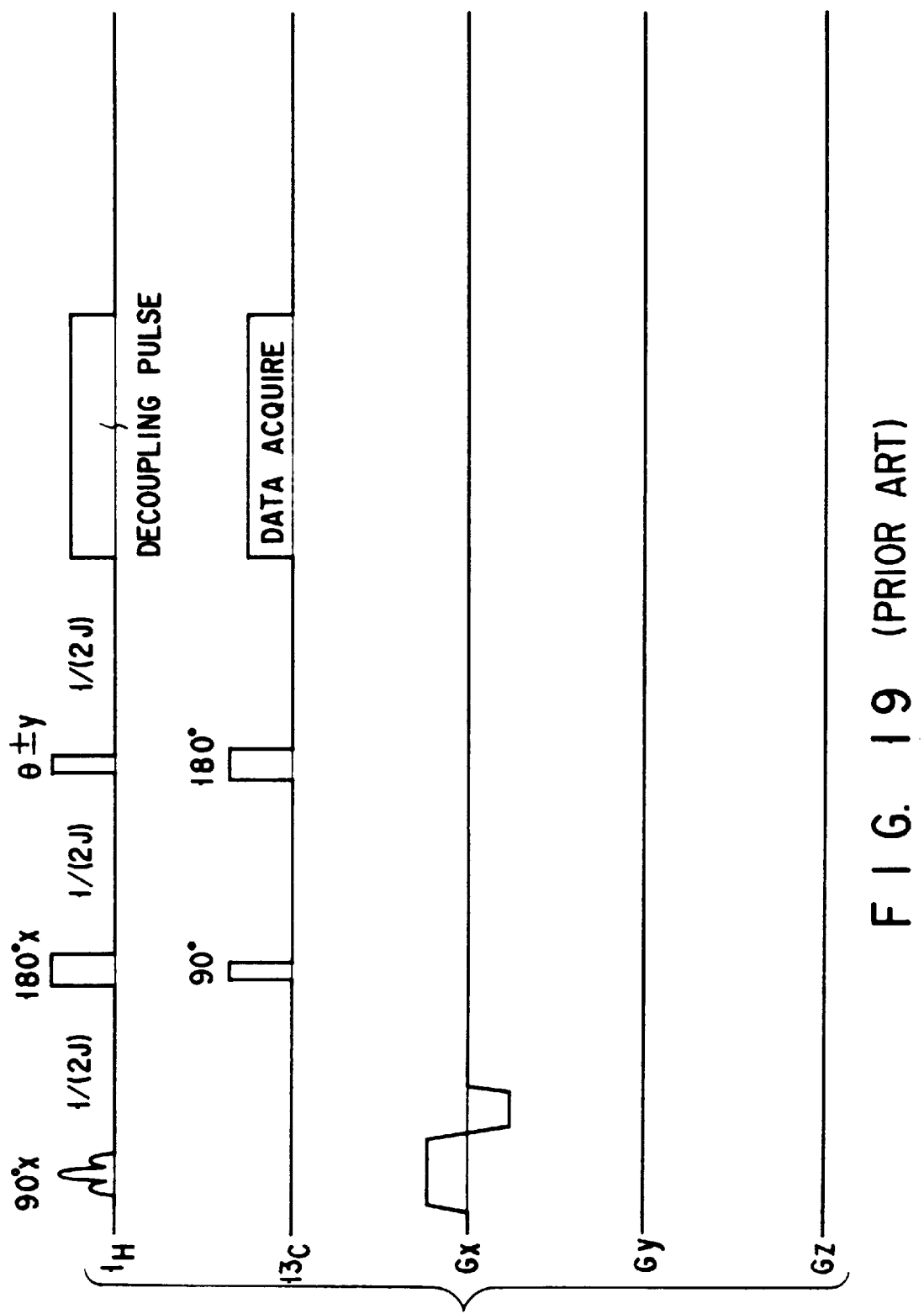
FIG. 19 shows another conventional DEPT pulse sequence for localization.
Figure 20:
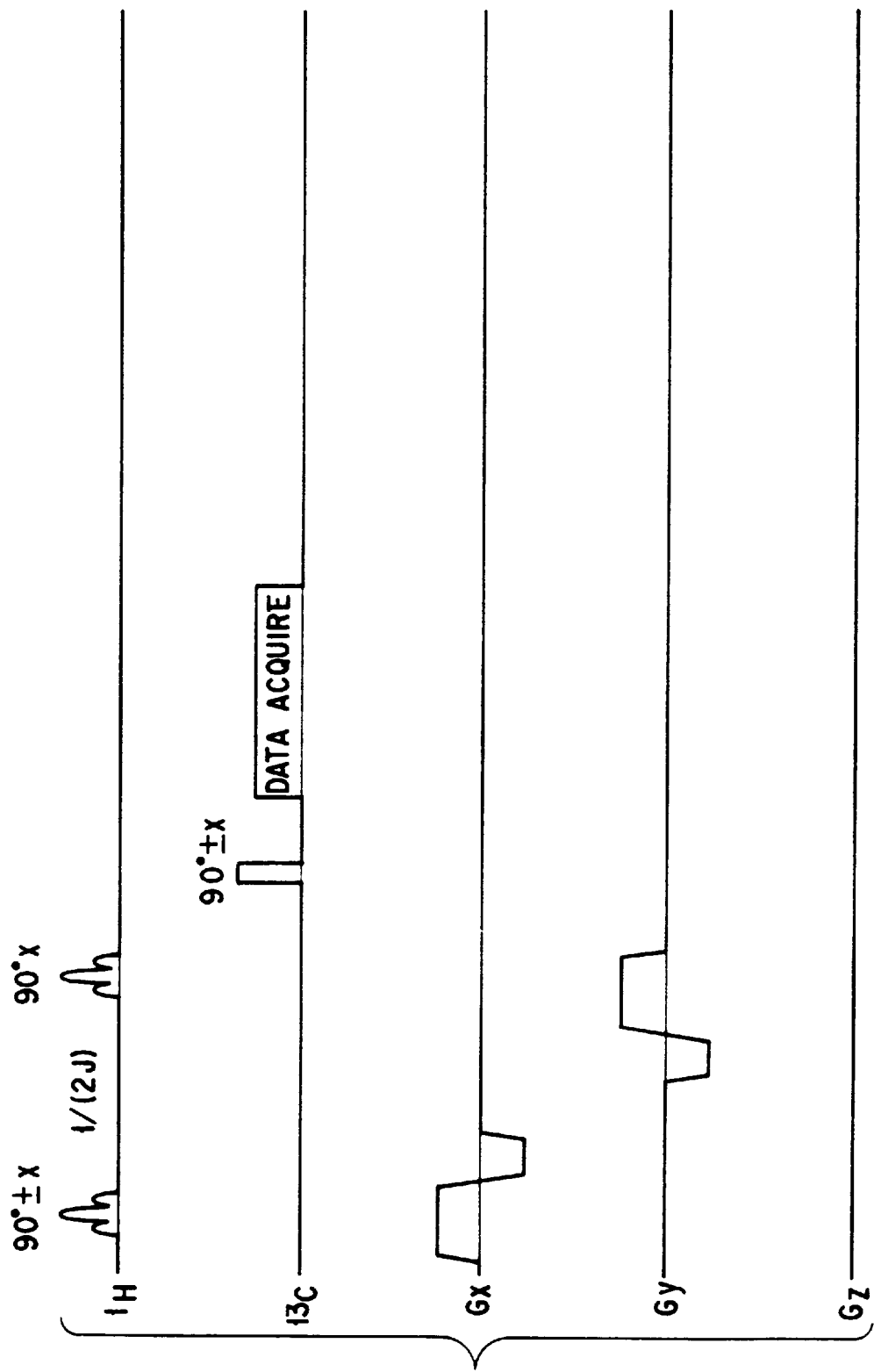
FIG. 20 shows still another conventional INEPT pulse sequence for localization.
Figure 21:
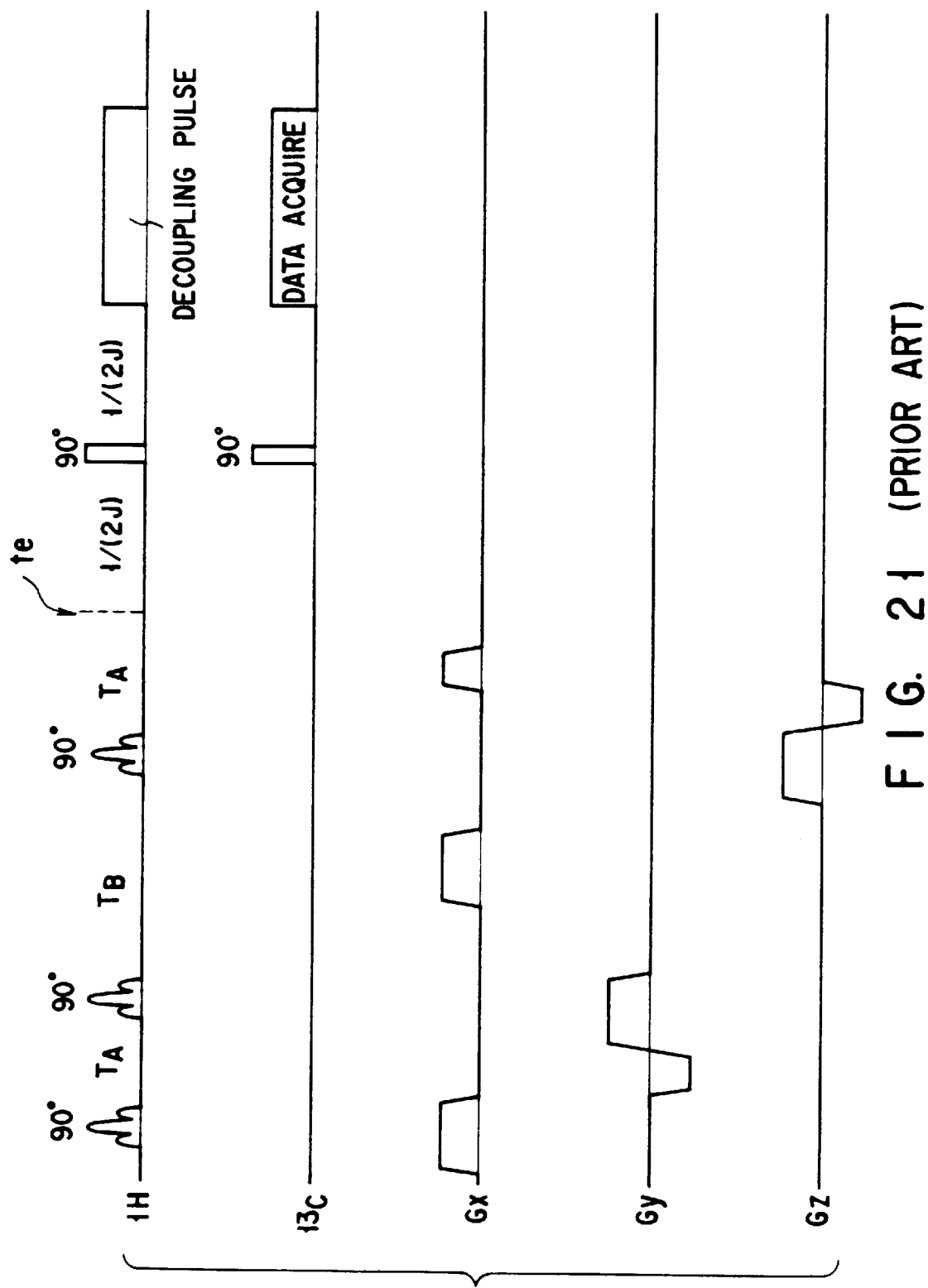
FIG. 21 shows a further conventional DEPT pulse sequence for localization.
Figure 23:
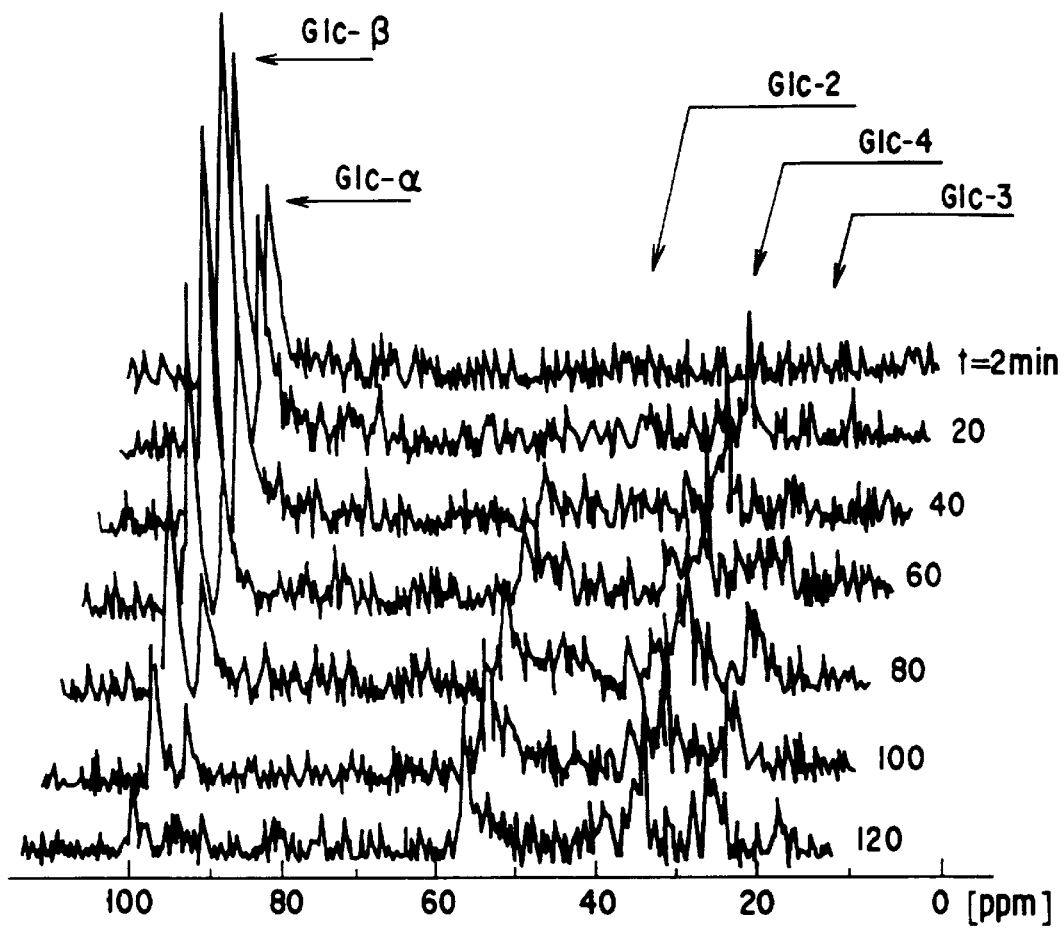
FIG. 23 shows a stack plot of metabolic change after injecting [1-$^{13}$C] glucose.
Figure 24:
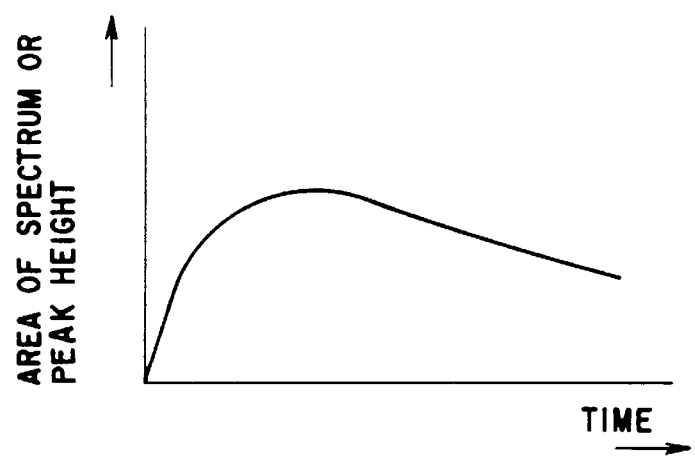
FIG. 24 shows changes of the area or the peak height of a spectrum.

FIG. 73 illustrate a preferable method of suppressing water signals. A third 90° ($^1$H) pulse for $^1$H is applied in the phase of the X axis. The state of $^1$H spins immediately before that third pulse is as shown in FIG. 2. That is, the magnetization of $^1$H{$^{13}$C} is polarized along the X axis (i.e., transverse magnetization). On the other hand, $^1$H{$^{12}$C} becomes transversely magnetized along the Y axis. In such a spin state, when the third 90° ($^1$H) pulse is applied in the phase of the X axis, the magnetization of $^1$H{$^{13}$C} is polarized along the X axis as it was, that is, the transverse magnetization is maintained. On the other hand, $^1$H{l$^2$C} is brought to longitudinal magnetization. Consequently, water signals can be suppressed.

FIG. 74 illustrates another method of suppressing water signals. Between the second 180° y($^1$H) pulse and the last 90° ($^1$H) pulse for $^1$H a 90° y($^1$H) pulse for $^1$H is added. The state of $^1$H spins immediately before that added pulse is as shown in FIG. 2. That is, the magnetization of $^1$H{$^{13}$C} is polarized along the X axis into transverse magnetization. On the other hand, $^1$H{$^{12}$C} becomes transversely magnetized along the Y axis. In such a spin state, when the additional pulse is applied, $^1$H{$^{13}$C} becomes longitudinally magnetized and the magnetization of $^1$H{$^{12}$C} remains unchanged from transverse magnetization. In this state, when a dephase gradient magnetic field pulse Gx is applied, the magnetization of $^1$H{$^{12}$C} is sufficiently dephased. On the other hand, the magnetization of $^1$H{$^{13}$C} is not affected by the gradient field pulse Gx. Consequently, water signals can be suppressed.

Figure 75:
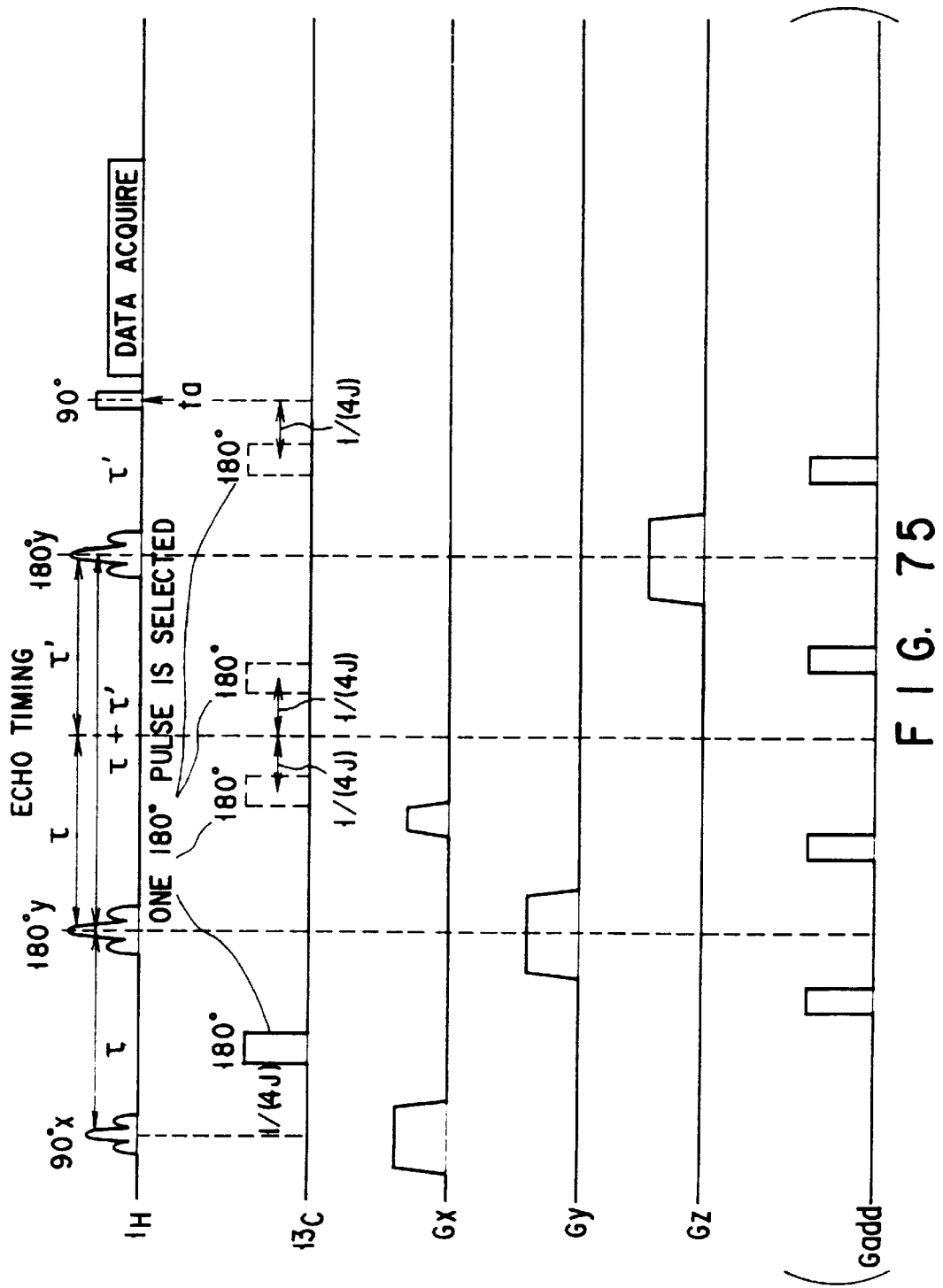

As shown in the pulse sequence of FIG. 75, a 180° y($^1$H) pulse may be added for use as a slice selective pulse.

Fifth Embodiment

The fifth embodiment relates to improvements in an HMQC (Heteronuclear Multiple Quantum Coherence) method which is one of the $^1$H observation methods. For the $^1$H observation methods, important subjects are the localization of axes and the removal of water signals. The fifth embodiment is intended for the localization of axes and the suppression of water signals.

Figure 76:
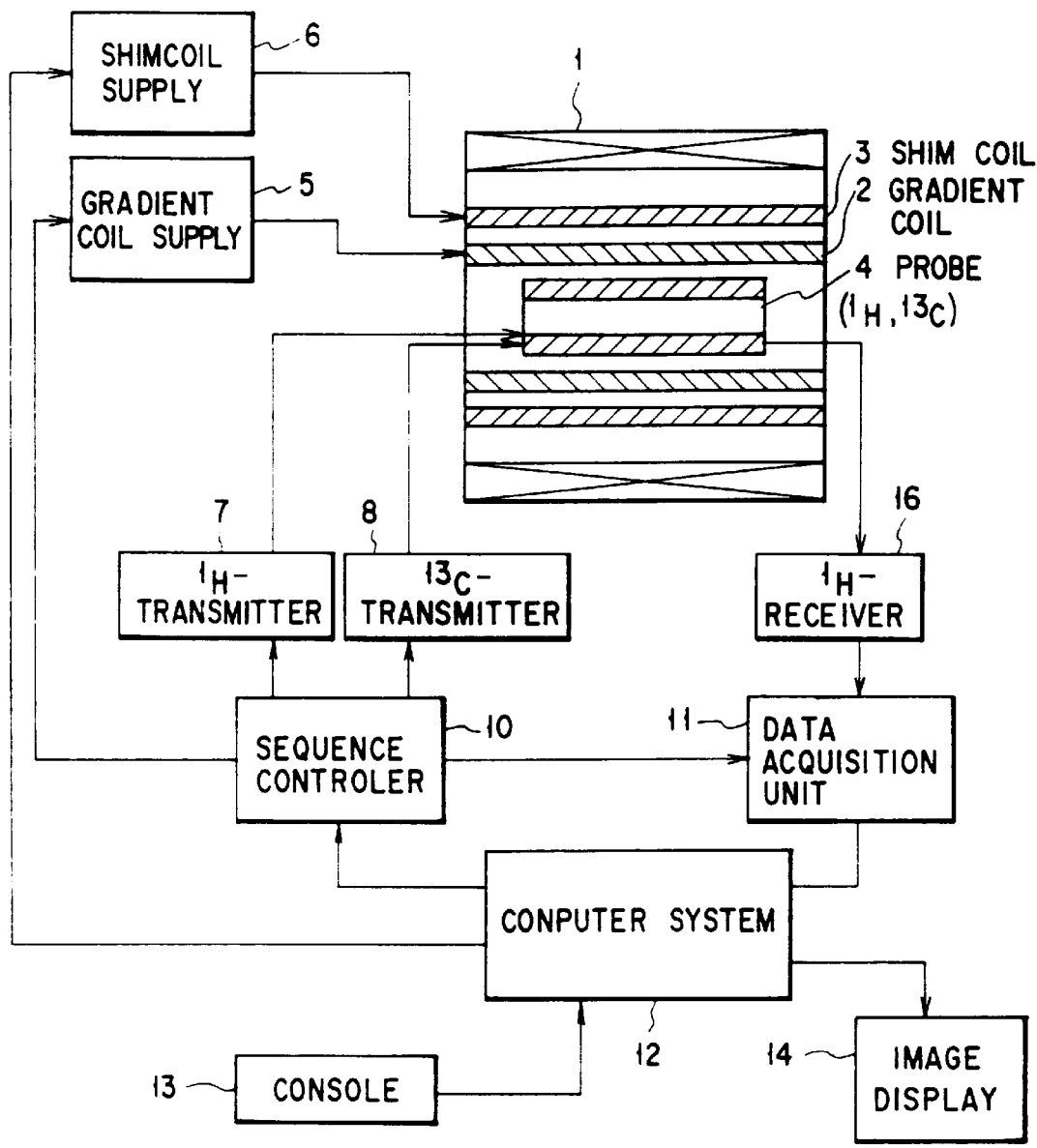
FIG. 76 shows an arrangement of a magnetic resonance diagnostic apparatus according to a fifth embodiment of the invention.

FIG. 76 shows an arrangement of a magnetic resonance diagnostic apparatus according to the fifth embodiment. In this figure, like reference numerals are used to denote corresponding parts to those in the arrangement of FIG. 50 and description thereof is omitted.

Figure 77A:
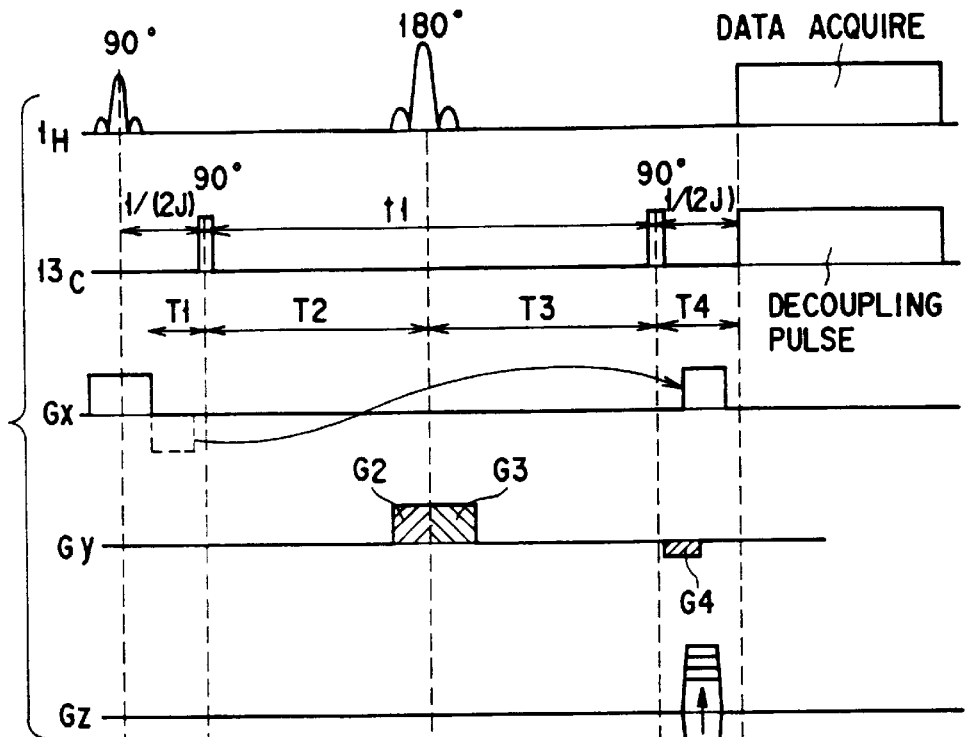
FIG. 77A shows a first improved HMQC pulse sequence.

FIG. 77A shows a first improved HMQC pulse sequence. In this pulse sequence, a 90° ($^1$H) pulse and a 180° ($^1$H) pulse are sequentially applied for $^1$H. Two 90° ($^{13}$C) pulses are sequentially applied for $^{13}$C.

The interval between the center of the first 90° ($^1$H) pulse for $^1$H and the center of the first 90° ($^{13}$C) pulse for $^{13}$C is set to 1/(2J). This interval may be set to an odd multiple of 1/(2J). General nuclear species to be observed include $CH_2$ and $CH_3$. With 3/(2J) or 5/(2J), the difference between the optimum interval for $CH_2$ and the optimum interval for $CH_3$ becomes large, resulting in reduced polarization transfer efficiency. For this reason, it is preferable that the interval be set to 1/(2J).

The interval between the center of the first 90° ($^{13}$C) pulse and the center of the second 90° ($^{13}$C) pulse for $^{13}$C is set to the multiple-quantum coherence period t1. The second 180° ($^1$H) pulse is applied at the center of the multiple-quantum coherence period t1.

The first 90° ($^1$H) pulse and the second 180° ($^1$H) pulse are used as slice selective pulses associated with different axes, effecting the localization of two axes. The localization of the remaining axis is effected herein by phase encoding of Gz. This phase encoding provides a two-dimensional spectrum of C—H correlation.

A slice-selective gradient magnetic field pulse Gx is applied with the first 90° ($^1$H) pulse used as a slice selective pulse. A rephase gradient field pulse for the gradient field pulse Gx is usually applied immediately after that pulse Gx as shown dotted. Here, the rephase gradient field pulse is applied during the interval between the second 90° ($^{13}$C) pulse and the start of data acquisition after the multiple-quantum coherence period t1. However, since the interval between the center of the first 90° ($^1$H) pulse for $^1$H and the center of first 90° ($^{13}$C) pulse for $^{13}$C is as short as 1/(2J), it is difficult for the widely-used apparatus to apply a slice refocus gradient field during this interval. However, the present embodiment allows even the widely-used apparatus to apply the rephase gradient field pulse. This means that even the widely-used apparatus can use the first 90° ($^1$H) pulse for $^1$H as a slice selective pulse.

When the second 180° ($^1$H) pulse within the multiple-quantum coherence period t1 is used as a slice selective pulse, a slice-selection gradient field pulse Gy for that pulse takes part in the multiple-quantum coherence. Therefore, some consideration will be needed to apply that gradient field pulse. Four intervals are defined as follows:

T1: The interval between the center of the first 90° ($^1$H) pulse for $^1$H and the center of the first 90° ($^{13}$C) pulse for $^{13}$C (immediately before the multiple-quantum coherence period).

T2: The interval between the center of the first 90° ($^{13}$C) pulse (the beginning of the multiple-quantum coherence period) and the center of the second 180 ($^1$H) pulse for $^1$H.

T3: The interval between the center of the second 180° ($^1$H) pulse for $^1$H and the center of the second 90° ($^{13}$C) pulse for $^{13}$C (the end of the multiple-quantum coherence period).

T4: The interval between the center of the second 90° ($^{13}$C) pulse for $^{13}$C (the end of the multiple-quantum coherence period) and the start of data acquisition.

The integration values with respect to time of the gradient field pulses Gy generated during the intervals T1, T2, T3 and T4 are defined as G1, G2, G3, and G4, respectively. The gradient magnetic field pulse Gy is a gradient magnetic field pulse associated with the same axis as a slice-selection gradient magnetic field pulse corresponding to the 180° ($^1$H) pulse used as a slice selective pulse. The integration value with respect to time is given by $\int Gy(t)dt$ where Gy(t) represents changes of magnetic field strength with time.

To realize the multiple-quantum coherence, the ratio in area among G1, G2, G3 and G4 is set in accordance with the method described by Jesus Ruiz-Cabello et al in the Journal of Magnetic Resonance, vol. 100, p. 282, 1992.

Figure 78:
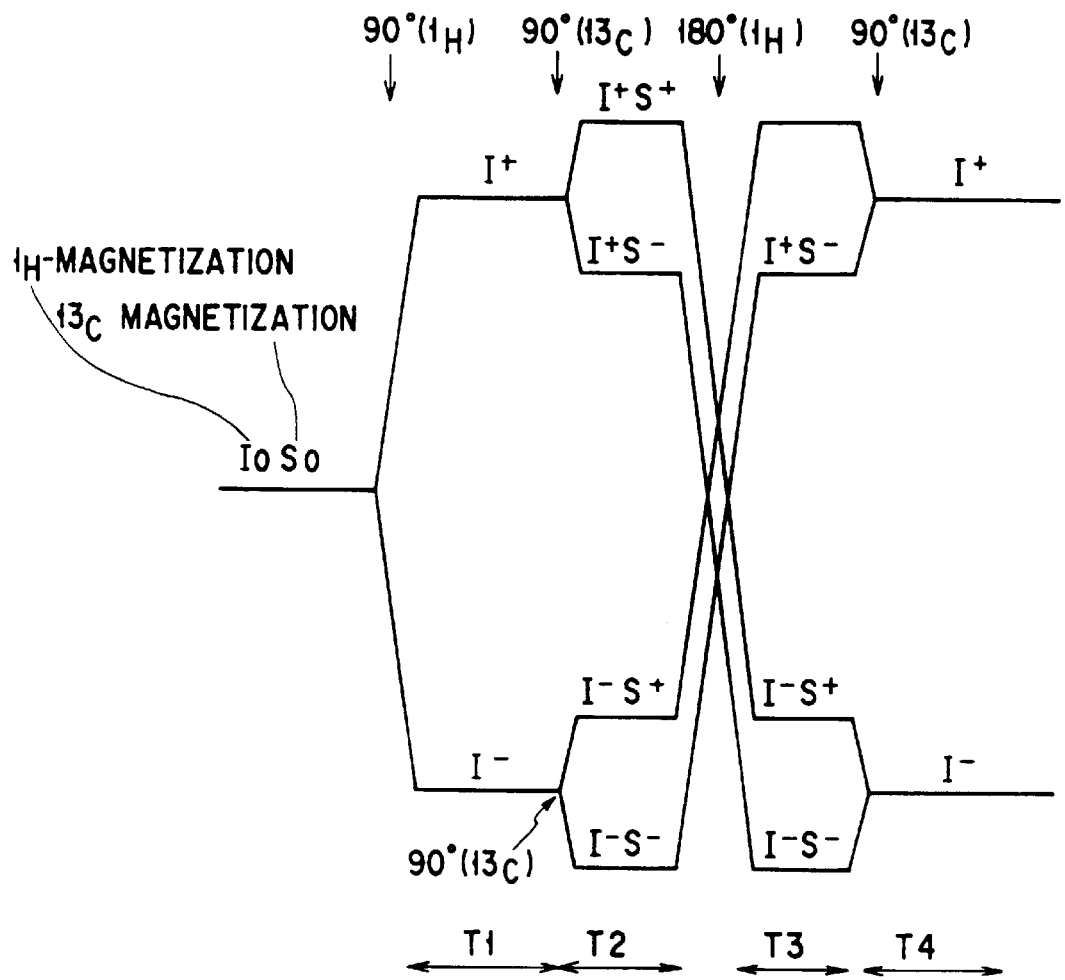
FIG. 78 shows paths of coherence corresponding to the sequences of FIGS. 77A, 77B and 77C.

FIG. 78 shows coherence paths corresponding to the pulse sequence of FIG. 78. I corresponds to $^1$H and S corresponds to $^{13}$C. Let position be r and the gyromagnetic ratios of $^1$H and $^{13}$C be $\gamma^H$ and $\gamma^C$, respectively. The phases $\phi$I and $\phi$S corresponding to the integration values G of I and S gradient magnetic field pulses with respect to time are given by $$\phi I = \gamma \| \cdot G \cdot r \quad (9)$$

$$\phi S = \gamma C \cdot G \cdot r \quad (10)$$

The multiple-quantum coherence that follows paths of (I+S+→I−S+) and (I−S−→I+S−) is realized by setting the ratio among G1, G2, G3 and G4 so as to satisfy the equation $$\gamma 1 \cdot G1 + (\gamma 1 + \gamma 2) \cdot G2 + (-\gamma 1 + \gamma 2) \cdot G3 - \gamma 1 \cdot G4 = 0 \quad (11)$$

Also, the multiple-quantum coherence that follows paths of (I+S−→I−S−) and (I−S+→I+S+) is realized by setting the ratio among G1, G2, G3 and G4 so as to satisfy the equation $$\gamma 1 \cdot G1 + (\gamma 1 - \gamma 2) \cdot G2 + (-\gamma 1 + \gamma 2) \cdot G3 - \gamma 1 \cdot G4 = 0 \quad (12)$$

By adjusting a pulse train for gradient field Gy including a slice selection gradient field pulse so that either of equations (11) and (12) is satisfied, the multiple-quantum coherence corresponding to either of equations (11) and (12) will be realized.

Figure 77B:
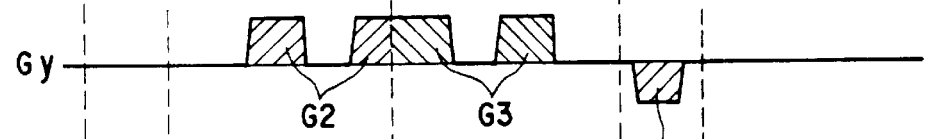
FIGS. 77B and 77C show first improved HMQC pulse sequences in which GY is improved to suppress water signals.

In the examples of FIGS. 77A and 77B, the pulse train for gradient field Gy is set in accordance with equation (11) in the following ratio:

G1:G2:G3:G4=0:2:2:1

Figure 77C:
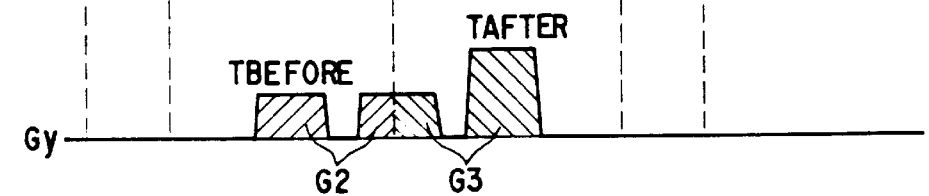

In the examples of FIG. 77C, on the other hand, the pulse train for gradient field Gy is set in accordance with equation (12) in the following ratio:

G1:G2:G3:G4=0:3:5:0

If the pulse train for gradient field Gy including a slice-selection gradient field pulse is adjusted in this manner so as to satisfy equation (11) or (12), then the 180° pulse for $^1$H produced within the multiple-quantum coherence period can be used as a slice selective pulse to effect the localization and removal of water signals.

Figure 79:
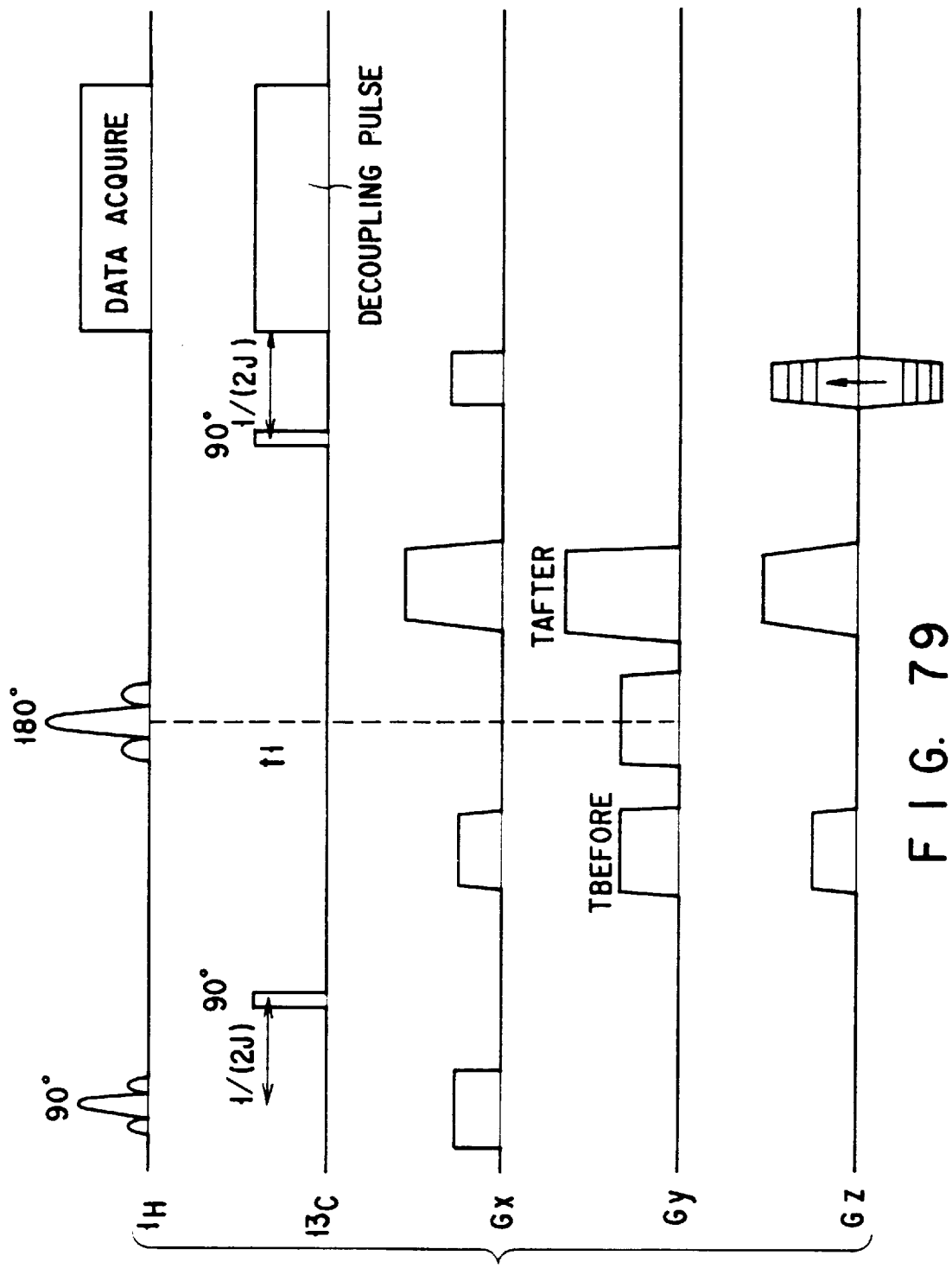
FIG. 79 shows the first improved HMQC pulse sequence which has additional Gx and Gy pulses to suppress water signals.

As shown in FIG. 79, in addition to setting the pulse train for gradient field Gy so as to satisfy equation (11) or (12), it is possible to use the gradient fields Gx and Gy along the axes different from that for the slice-selection gradient field Gy for selection of multiple-quantum coherence.

Figure 80:
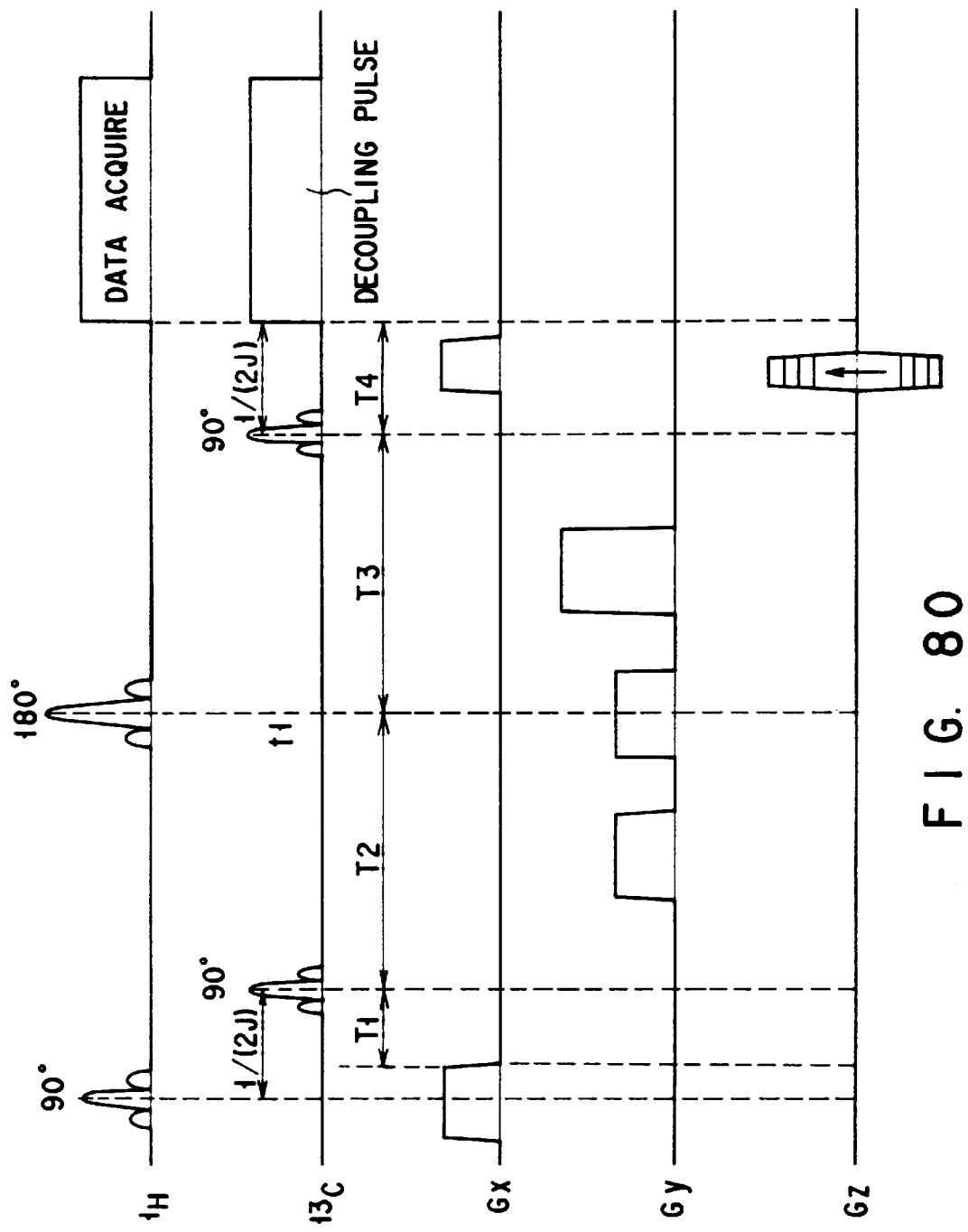
FIG. 80 shows the first improved HMQC pulse sequence in which two 90° pulses for $^{13}$C are shaped into a sine function.

As shown in FIG. 80, by shaping two 90° pulses for $^{13}$C into a sine function to thereby narrow their frequency bandwidth, the number of steps in a two-dimensional spectrum can be reduced.

Figure 81:
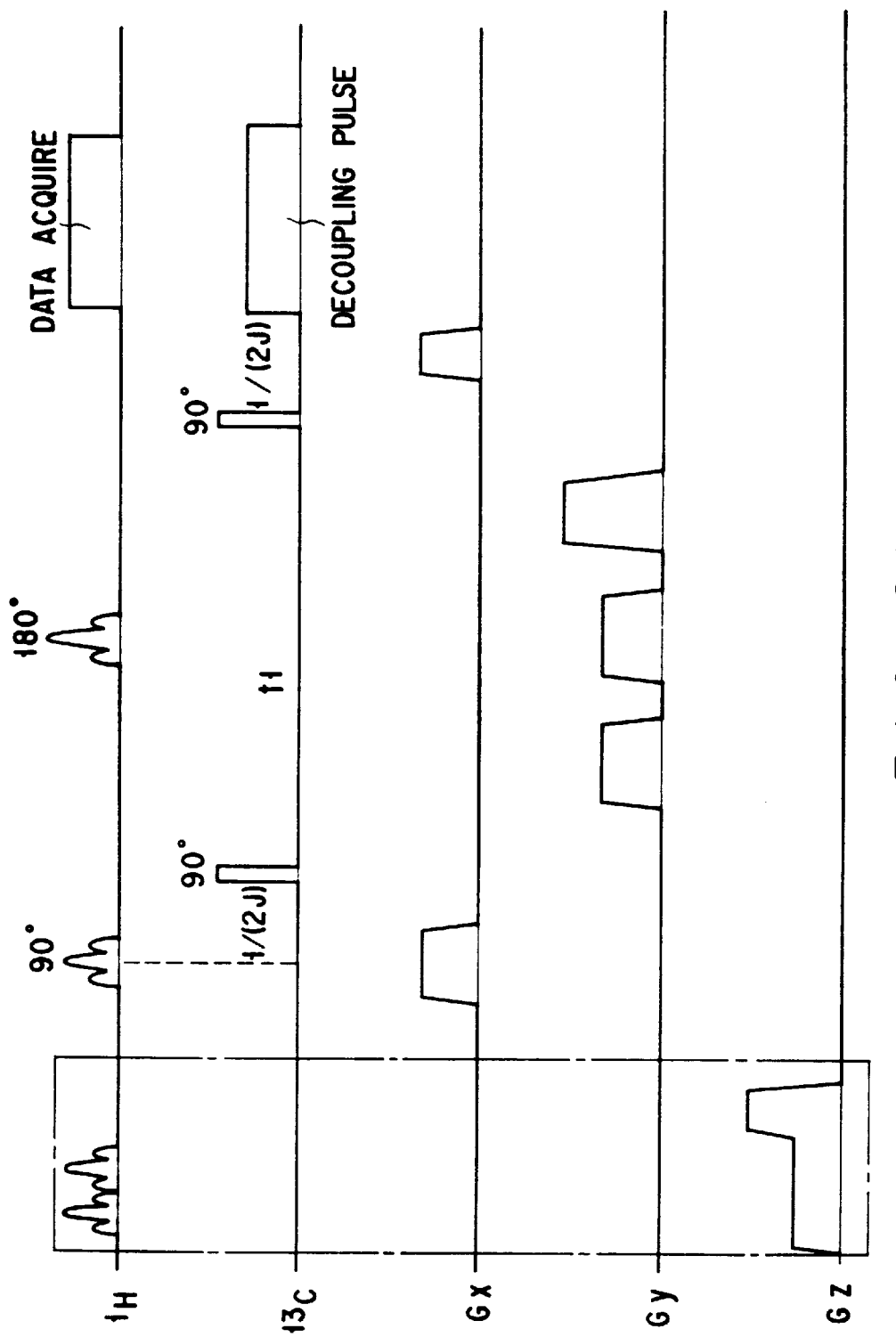
FIG. 81 shows an HMQC pulse sequence in which selective saturation pulses are used for the localization of the third axis.

As shown in FIG. 81, selective saturation pulses may be used to localize the third axis instead of using phase encoding. Likewise, an ISIS pulse may be used for that purpose.

Figure 82:
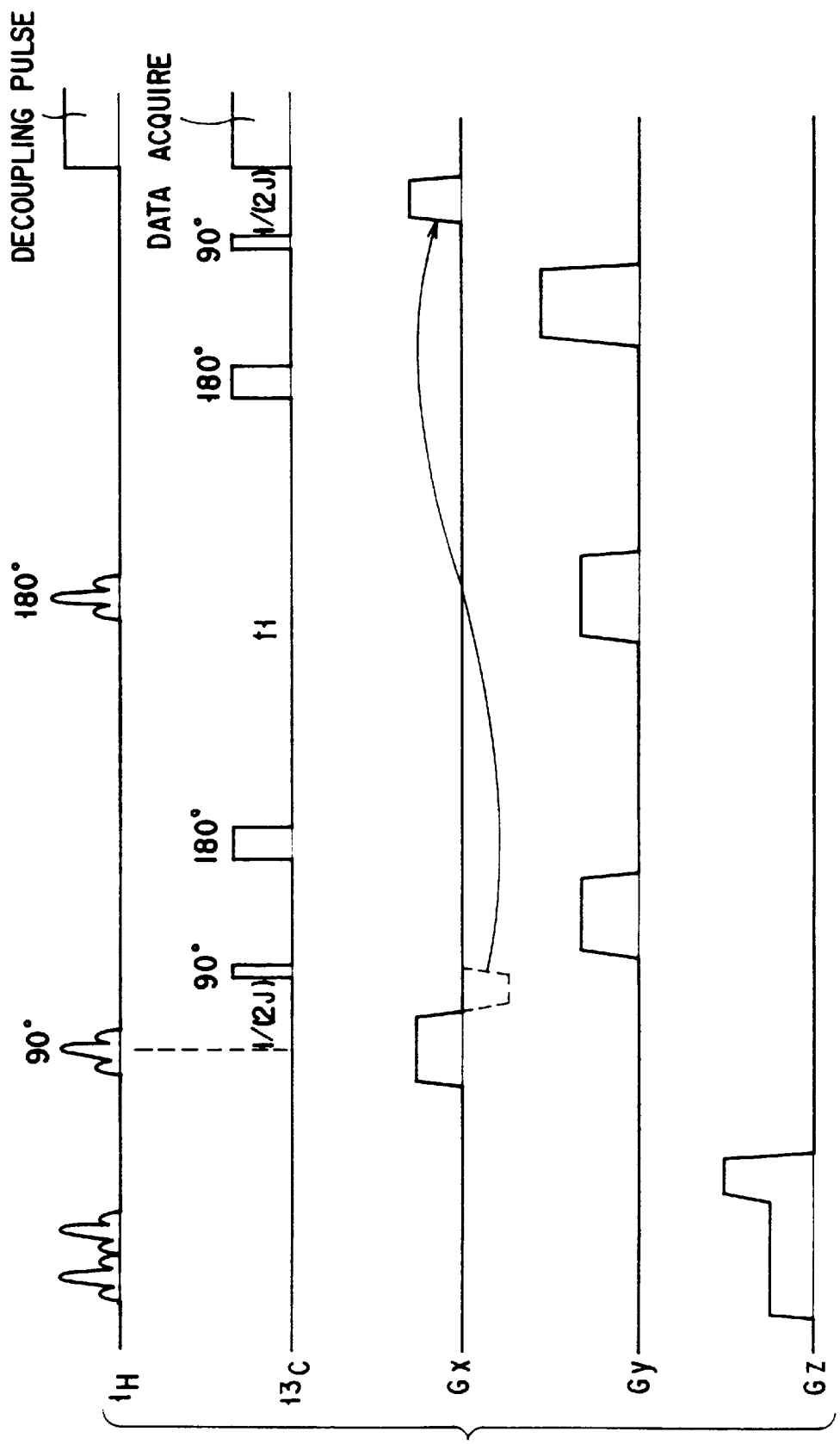
FIG. 82 shows an improved HMQC pulse sequence in which the rephasing gradient field corresponding to the slice selection gradient field is shifted to the interval between the last 90° pulse for $^{13}$C and the start of data acquisition.

As shown in FIG. 82, a rephase gradient field for a slice-selection gradient field may be produced during the interval between the last 90° pulse for $^{13}$C and the start of data acquisition.

Sixth Embodiment

The sixth embodiment relates to an improvement in curve fitting processing of MR spectra.

FIG. 83 shows an arrangement of a magnetic resonance diagnostic apparatus according to the sixth embodiment. In this figure, like reference numerals are used to denote corresponding parts to those in the arrangement of FIG. 50 and description thereof is omitted. A sequence controller 19 controls the gradient coil power supply system 5, transmitters 7 and 8, receivers 9 and 16, and data acquisition unit 12 to carry out a pulse sequence for an MR spectrum. A magnetic resonance signal thus generated is sampled according to a predetermined sampling frequency. A collection of data obtained by a sequence of sampling operations is defined a data set. One spectrum is obtained from one data set. The pulse sequence is repeated at a predetermined repetition time TR. The collection of data set is also repeated at the same repetition time. The computer system 18 subjects each of data sets to Fourier transform individually to obtain a plurality of spectra that have different corresponding times. The corresponding time to a spectrum is defined as the time of acquiring a data set used to obtain that spectrum. The computer system 18 performs curve fitting on the spectra. The curve fitting will be described below.

FIGS. 84A through 84E show exemplary spectra that differ in corresponding time. As shown in FIG. 85, the spectra are connected in a sequential order of corresponding time. The curve fitting is performed on the connected spectra.

A model equation $\sigma(\omega, ti)$ of a spectrum is given by equation (13) below. Re represents the real part and Im represents the imaginary part. A process that makes the model equation approximate to the connected spectra is referred to curve fitting.

$$\rho(\omega, ti) = ([Re + iIm] exp(i\phi)$$

$$Re = A/T2_*/[(\omega - \omega o)2 + (1/T2^*)2]$$

$$Im = A(\omega - \omega o)/[(\omega - \omega o)2 + (1/T2^*)2] \quad (13)$$

Equation (13) contains four unknown parameters, i.e., the spectrum area A, the reciprocal T2. of half-value width, the chemical shift $\omega o$, and the phase $\phi$. The important thing is that the three parameters, T2., $\omega o$, $\phi$, are the same for a plurality of spectra, and the parameter that differs among spectra, i.e., the parameter that is considered to be a function of time, is only the spectrum area A indicating the amount of metabolite.

That is, the total number of parameters used in the curve fitting process for the connected spectra is not 4×n but 3+n with n being the number of spectra to be connected.

For this reason, the present embodiment in which curve fitting is performed on connected spectra is greater in fitting precision than the prior art in which curve fitting is performed on each spectrum. This is because, in the present embodiment, although the number of processing points is increased by a factor of n, the number of parameters to be sought is 3+n in contrast to 4×n in the prior art.

Figure 84A:
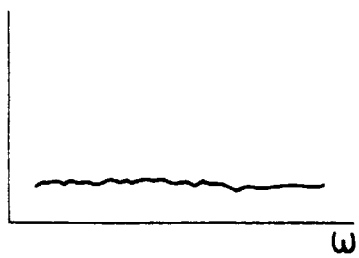
FIGS. 84A through 84E show examples of multiple spectra.
Figure 84D:
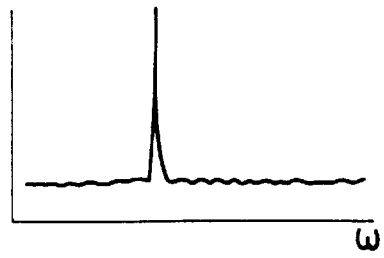
Figure 84B:
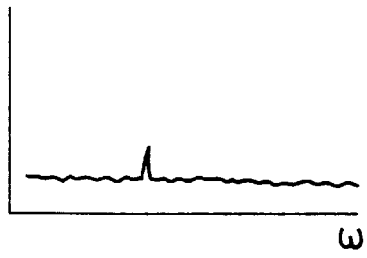
Figure 84E:
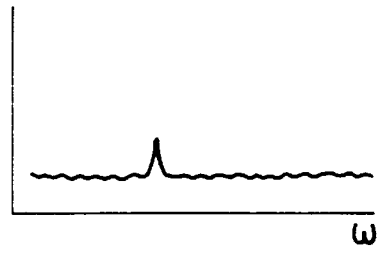
Figure 84C:
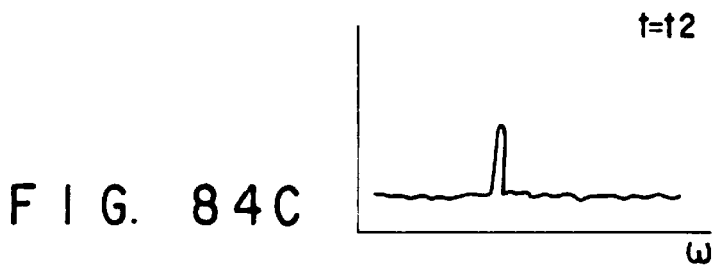
Figure 85:
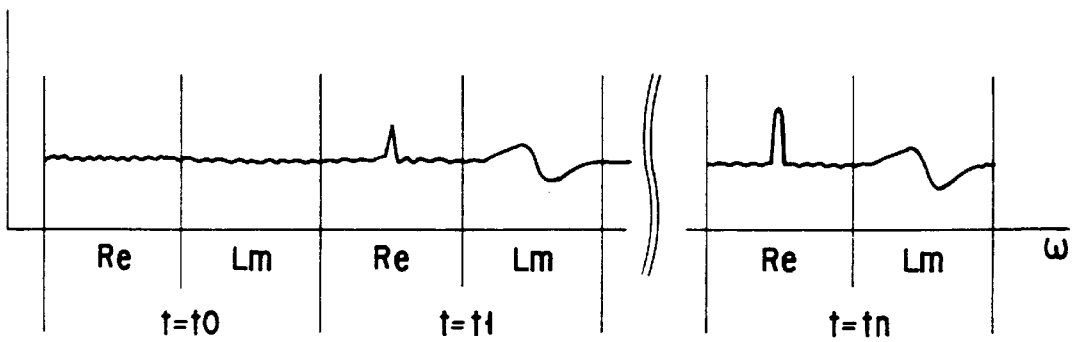
FIG. 85 shows an example of a connected spectrum.

It is preferable from a viewpoint of processing precision that spectra be connected for subsequent curve fitting except such a spectrum as shown in FIG. 84A in which a peak level is lower than a threshold corresponding to noise level. Instead of connecting spectra, A(t) may be sought by seeking T2*, ωo and φ from each spectrum, averaging each of them, fixing each of them to the corresponding resultant average value, and performing curve fitting under the conditions that the number of parameters at each time is one.

Further, there is also provided a method of imposing limitations on A(t). By replacing A in the above model equation with a time function of f(t), limitations can be imposed on A(t) to improve processing precision.

The above description is directed to a one-component system. In the case of a multi-component system as well, a model equation can be created in a similar manner to perform curve fitting. In this case as well, the parameters are Ai(t), ωoi, T2*i, and φi (i indicate spectrum numbers) and hence it is only Ai that becomes a function of time. The phase φi, which is represented by φi=a(ω−ωo)+b (a, b are constants), may be added to the model equation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance diagnostic apparatus which is adapted to apply to a plurality of nuclear species radio-frequency (RF) magnetic fields corresponding to their respective resonant frequencies, comprising:

means for applying a sequence of a first RF pulse, a second RF pulse, and a third RF pulse to a first nuclear species and applying a fourth RF pulse to a second nuclear species; and means for acquiring a magnetic resonance signal from spins of said first nuclear species that are spin—spin coupled with spins of said second nuclear species, and wherein said fourth RF pulse is an inversion pulse that is applied at a time that is within an interval between said first RF pulse and said third RF pulse and differs from the timing of said second RF pulse, and said third RF pulse is applied in a phase to return spins of said first nuclear species that are not spin—spin coupled with spins of said second nuclear species to the longitudinal magnetization.

2. The apparatus according to claim 1, wherein at least one of said first, second and third RF pulses is a slice selective pulse that is applied with a slice selection gradient magnetic field pulse.

3. The apparatus according to claim 1, wherein said second RF pulse is a refocus pulse.

4. The apparatus according to claim 1, wherein said fourth RF pulse is applied after a lapse of a time corresponding to an odd multiple of 1/(4J) from the application of said first RF pulse where J is the spin—spin coupling constant of said first and second nuclear spins.

5. The apparatus according to claim 1, wherein said fourth RF pulse is applied a time corresponding to an odd multiple of 1/(4J) before the application of said third RF pulse where J is the spin—spin coupling constant of said first and second nuclear spins.

6. The apparatus according to claim 1, wherein said fifth RF pulse is applied a time corresponding to an odd multiple of 1/(4J) before the application of said third RF pulse where J is the spin—spin coupling constant of said first and second nuclear spins.

7. A magnetic resonance diagnostic apparatus which is adapted to apply to a plurality of nuclear species radio-frequency (RF) magnetic fields corresponding to their respective resonant frequencies, comprising:

means for applying a sequence of a first RF pulse, a second RF pulse, a third RF pulse and a fourth RF pulse to a first nuclear species and applying a fifth RF pulse to a second nuclear species;

means for applying a dephase gradient magnetic field pulse during an interval between said third and fourth RF pulses; and means for acquiring a magnetic resonance signal from said first nuclear species that are spin—spin coupled with said second nuclear species, and wherein said fifth RF pulse is an inversion pulse that is applied at a time that is within an interval between said first RF pulse and said third RF pulse and differs from the timing of said second RF pulse, and said third RF pulse is applied in a phase to return spins of said first nuclear species that are spin—spin coupled with spins of said second nuclear species to the longitudinal magnetization.

8. The apparatus according to claim 7, wherein at least one of said first, second, third and fourth RF pulses is a slice selective pulse that is applied with a slice gradient magnetic field pulse.

9. The apparatus according to claim 7, wherein said second RF pulse is a refocus pulse.

10. The apparatus according to claim 7, wherein said fifth RF pulse is applied after a lapse of a time corresponding to an odd multiple of 1/(4J) from the application of said first RF pulse where J is the spin—spin coupling constant of said first and second nuclear spins.

* * * * *